United States Patent [19]

Richards et al.

[11] Patent Number: 5,656,547
[45] Date of Patent: Aug. 12, 1997

[54] METHOD FOR MAKING A LEADLESS SURFACE MOUNTED DEVICE WITH WRAP-AROUND FLANGE INTERFACE CONTACTS

[75] Inventors: John G. Richards, San Jose; Wendell B. Sander, Los Gatos; Donald P. Richmond, II, Palo Alto; Hector Flores, San Jose, all of Calif.

[73] Assignee: ChipScale, Inc., San Jose, Calif.

[21] Appl. No.: 241,602

[22] Filed: May 11, 1994

[51] Int. Cl.$^6$ .......................... H01L 21/58; H01L 23/52; H01L 21/70
[52] U.S. Cl. .......................... 438/460; 438/461; 438/462; 438/464
[58] Field of Search .................. 437/209, 211, 437/213, 227, 906, 974, 226, 204, 205, 206, 220, 221; 257/724, 725, 728, 773; 148/DIG. 135

[56] References Cited

U.S. PATENT DOCUMENTS

| | | | |
|---|---|---|---|
| 3,139,678 | 7/1964 | Anthony et al. | 437/221 |
| 3,200,311 | 8/1965 | Thomas et al. | |
| 3,280,019 | 10/1966 | Harding et al. | 437/213 |
| 3,462,655 | 8/1969 | Coblenz | |
| 3,483,308 | 12/1969 | Wakely | 437/220 |
| 3,559,282 | 2/1971 | Lesk | |
| 3,566,214 | 2/1971 | Usuda | |
| 3,594,619 | 7/1971 | Kamoshida et al. | |

(List continued on next page.)

FOREIGN PATENT DOCUMENTS

| | | | |
|---|---|---|---|
| 0029334 | 5/1981 | European Pat. Off. | |
| 0057135 | 8/1982 | European Pat. Off. | |
| 2220877 | 10/1974 | France | 437/227 |
| 54-19384 | 2/1979 | Japan | 437/226 |
| 54-136176 | 10/1979 | Japan | |
| 56-51829 | 5/1981 | Japan | 437/227 |
| 56-148848 | 11/1981 | Japan | |
| 58-54656 | 3/1983 | Japan | 437/221 |

(List continued on next page.)

OTHER PUBLICATIONS

Translation of JP 54-19384 cited in a previous office action.
Richmond, D., *Micro SMT Discrete Device White Paper*, Micro SMT, Inc., pp. 1–14 (May 1, 1993).
Richmond, D., *Micro SMT Integrated Circuit Technical White Paper*, Micro SMT, Inc., pp. 1–15 (Jan. 25, 1993).
"Micro SMT, Inc. Announces A Revoluntionary IC Packaging Process," *U.S. Electronics Management Report*, vol. 2, Issue 3, pp. 1–3 (Mar. 1993).
Micro SMT Incorporated, Brochure, two sheets (1993).

(List continued on next page.)

*Primary Examiner*—Tom Thomas
*Assistant Examiner*—Leon Radomsky
*Attorney, Agent, or Firm*—Blakely, Sokoloff, Taylor & Zafman

[57] ABSTRACT

A flange interface for wrap-around contact regions formed in fabricating semiconductor devices provides for a durable and reliable electrical bond. A first layer having a first material is formed over the first side of a wafer. A trench is formed from the second side of the wafer such that a portion of the first layer becomes exposed in the trench. A second layer having a second material is formed over the second side of the wafer such that a portion of the second layer contacts the portion of the first layer exposed in the trench. The wafer is separated through the trench. The trench may be formed by sawing the second side of the wafer in an area where the trench is to be formed. The wafer may then be etched such that the trench is formed.

16 Claims, 60 Drawing Sheets

U.S. PATENT DOCUMENTS

| | | |
|---|---|---|
| 3,602,982 | 9/1971 | Kooi . |
| 3,666,588 | 5/1972 | Wanesky . |
| 3,680,205 | 8/1972 | Kravitz . |
| 3,686,748 | 8/1972 | Engeler et al. . |
| 3,746,945 | 7/1973 | Normington . |
| 3,748,546 | 7/1973 | Allison . |
| 3,754,169 | 8/1973 | Lyon et al. . |
| 3,761,782 | 9/1973 | Youmans . |
| 3,808,470 | 4/1974 | Kniepkamp . |
| 3,820,235 | 6/1974 | Goldman . |
| 3,859,127 | 1/1975 | Lehner ............................. 437/227 |
| 3,886,578 | 5/1975 | Eastwood et al. . |
| 3,905,094 | 9/1975 | Ruggiero . |
| 3,944,447 | 3/1976 | Magdo et al. . |
| 4,033,027 | 7/1977 | Fair et al. ........................... 437/226 |
| 4,063,176 | 12/1977 | Milligan et al. . |
| 4,250,520 | 2/1981 | Denlinger . |
| 4,278,985 | 7/1981 | Stobbs . |
| 4,577,213 | 3/1986 | Bauhahn . |
| 4,612,408 | 9/1986 | Moddel et al. ..................... 437/227 |
| 4,708,060 | 11/1987 | Bickes, Jr. et al. . |
| 4,733,290 | 3/1988 | Reardon et al. . |
| 4,738,933 | 4/1988 | Richards . |
| 4,780,424 | 10/1988 | Holler et al. . |
| 4,811,080 | 3/1989 | Richards . |
| 4,855,796 | 8/1989 | Wong et al. . |
| 4,859,629 | 8/1989 | Reardon et al. . |
| 4,866,499 | 9/1989 | Aktik . |
| 4,905,071 | 2/1990 | Chalifour et al. . |
| 4,976,200 | 12/1990 | Benson et al. . |
| 4,991,286 | 2/1991 | Russo et al. ....................... 437/206 |
| 5,024,966 | 6/1991 | Dietrich et al. . |
| 5,034,801 | 7/1991 | Fischer . |
| 5,045,503 | 9/1991 | Kobiki et al. . |
| 5,063,177 | 11/1991 | Geller et al. ...................... 437/209 |
| 5,117,280 | 5/1992 | Adachi . |
| 5,139,972 | 8/1992 | Neugebauer et al. ............. 437/221 |
| 5,156,998 | 10/1992 | Chi et al. ........................... 437/209 |
| 5,158,911 | 10/1992 | Quentin ............................. 437/211 |
| 5,162,258 | 11/1992 | Lemnios et al. . |
| 5,268,310 | 12/1993 | Goodrich et al. . |
| 5,280,194 | 1/1994 | Richards et al. . |
| 5,300,461 | 4/1994 | Ting . |
| 5,403,729 | 4/1995 | Richards et al. .................. 437/51 |

FOREIGN PATENT DOCUMENTS

| | | |
|---|---|---|
| 61-48928 | 3/1986 | Japan . |
| 63-047972 | 2/1988 | Japan . |
| 63-288062 | 11/1988 | Japan . |
| 1-81348 | 3/1989 | Japan ................................. 437/206 |
| 2067354 | 7/1981 | United Kingdom . |
| 90/05997 | 5/1990 | WIPO . |
| 90/15438 | 12/1990 | WIPO. |

OTHER PUBLICATIONS

Marcoux, P.P., et al., "Miniature SMD Packaging Simplified," *Electronic Packaging & Production*, pp. 74–75 (Jan. 1993).

Japanese article that refers to Micro SMT, pp. 163–169 (1993).

M–Pulse Microwave Brochure, "Micro Surface Mount Packages," one sheet (1993).

Gardner, F., "SM: Nobody said it would be this hard," *Electronic Purchasing*, pp. 63S and 65S (Oct. 1992).

*Micro Electronics Digest*, p. 14 (Spring 1993).

*Manufacturing Market Insider*. p. 4 (Oct. 1992).

Costlow, T., "IC package cuts cost, size," *EE Times*, one sheet (Aug. 3, 1992).

"Leadless Monolithic Devices are Drop–In Replacements for Beam Lead Devices," *Microwave Journal*, vol. 32, No. 8, pp. 173–174 (Aug. 1989).

M–Pulse Microwave Brochure, "Package Dimensions," four sheets (1991).

M–Pulse Microwave Brochure, "Microwave Schottky Ring Quads," four sheets (1989).

M–Pulse Microwave Brochure, "Series Pin Switching Elements," two sheets (1989).

M–Pulse Microwave Brochure, "Microwave Schottky Diodes," one sheet (1988).

M–Pulse Microwave Brochure, "Zero Bias Schottky Diodes," one sheet (1988).

M–Pulse Microwave Brochure, "Outline Dimensions," one sheet (1988).

M–Pulse Microwave Brochure, "PIN Diodes," one sheet (1988).

M–Pulse Microwave Brochure, "Hybrid Schottky Barrier Diodes (General Purpose)," one sheet (1988).

M–Pulse Microwave Brochure, "Step Recovery Diodes," one sheet (1988).

M–Pulse Microwave Brochure, "Microwave Tunnel Diodes," one sheet (1988).

M–Pulse Microwave Brochure, "MNOS Chip Capacitors," one sheet (1988).

M–Pulse Microwave Brochure, "Techniques for Hybrid Assembly (Application Note 220)," one sheet (1988).

Garceau, W.J., et al., "Modified Beam Lead Magnetics for Handling Semiconductors," Western Electric Technical Digest, No. 51, pp. 11–12 (Jul. 1978).

Boylestad, R., et al., *Electronic Devices and Circuit Theory*, Prentice–Hall, Inc., pp. v–xi, 1–24, 63–65, 82–87, 145–147, 462–488 (3rd Ed. 1982).

Gambling, W.A., *Microwave Semiconductor Devices*, Electronic Engineering Series, pp. 105–108 (1972).

Laverghetta, T.S., *Solid–State Microwave Devices*, Artech House, Inc., pp. 1–117, 178–188 (1987).

White, J.F., *Microwave Semiconductor Engineering*, Van Nostrand Reinhold Company Inc., pp. vii–xvii, 39–115, 364–369 (1982).

M–Pulse Microwave Advertisement, *Microwaves & RF*, vol. 27, No. 5, pp. 8–9 (May 1988).

Metelics Advertisement, *Microwave & RF*, vol. 27, No. 5, p. 262 (May 1988).

M/A–COM Advertisement, one sheet (1992).

Alpha Industries,Inc., 6 sheets of drawings that refer to "DATE Feb. 12, 1990".

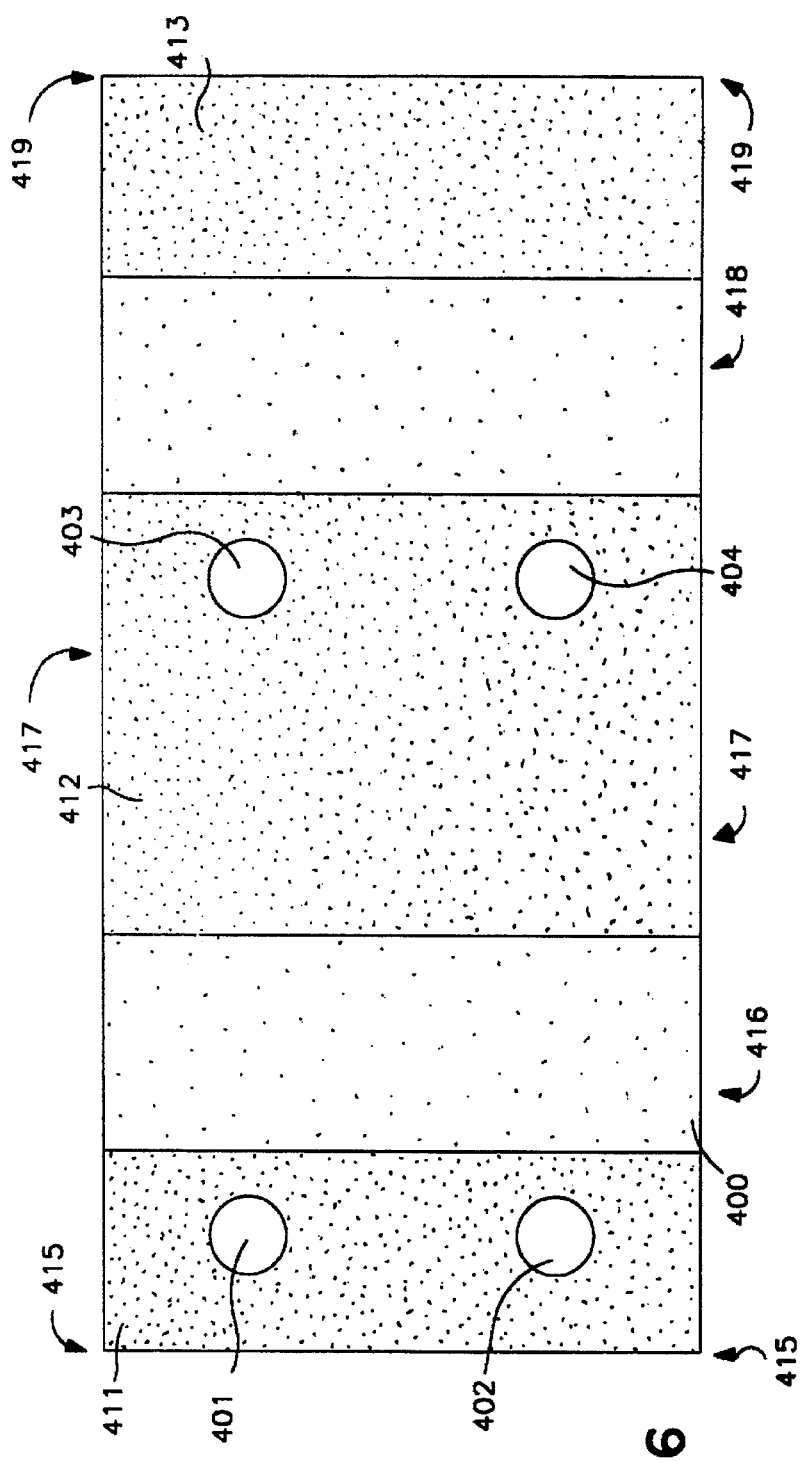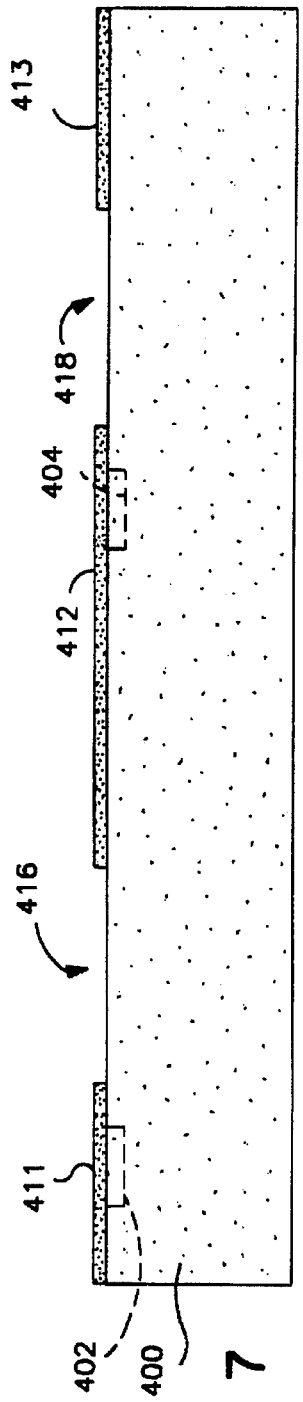

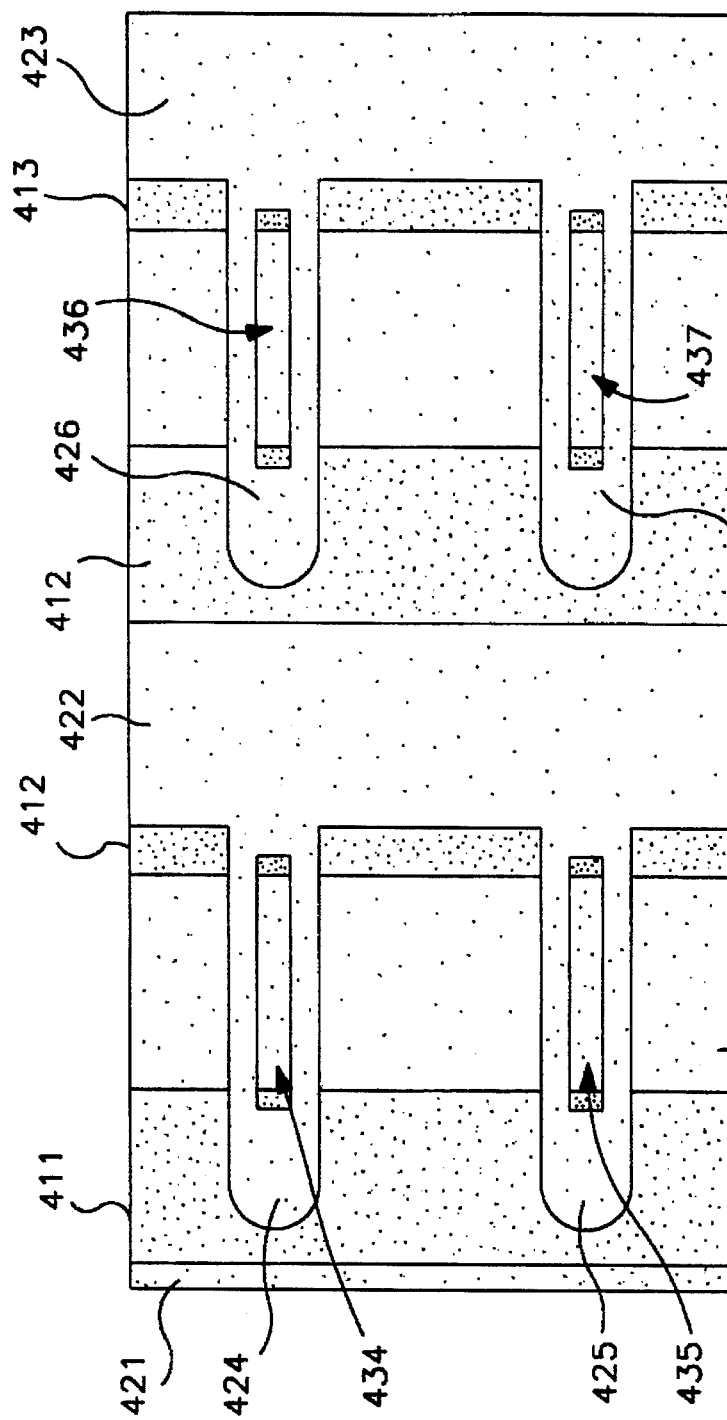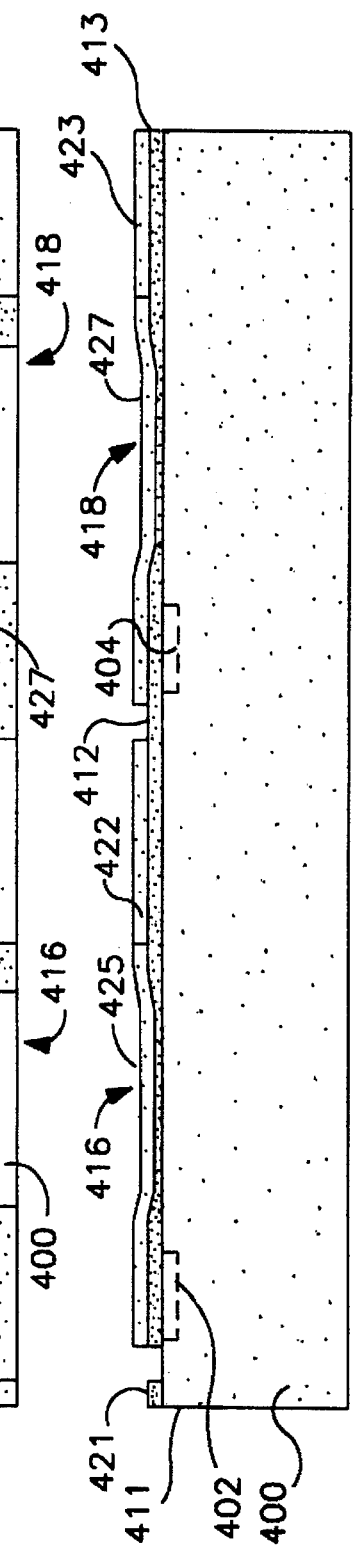
FIG. 8
FIG. 9

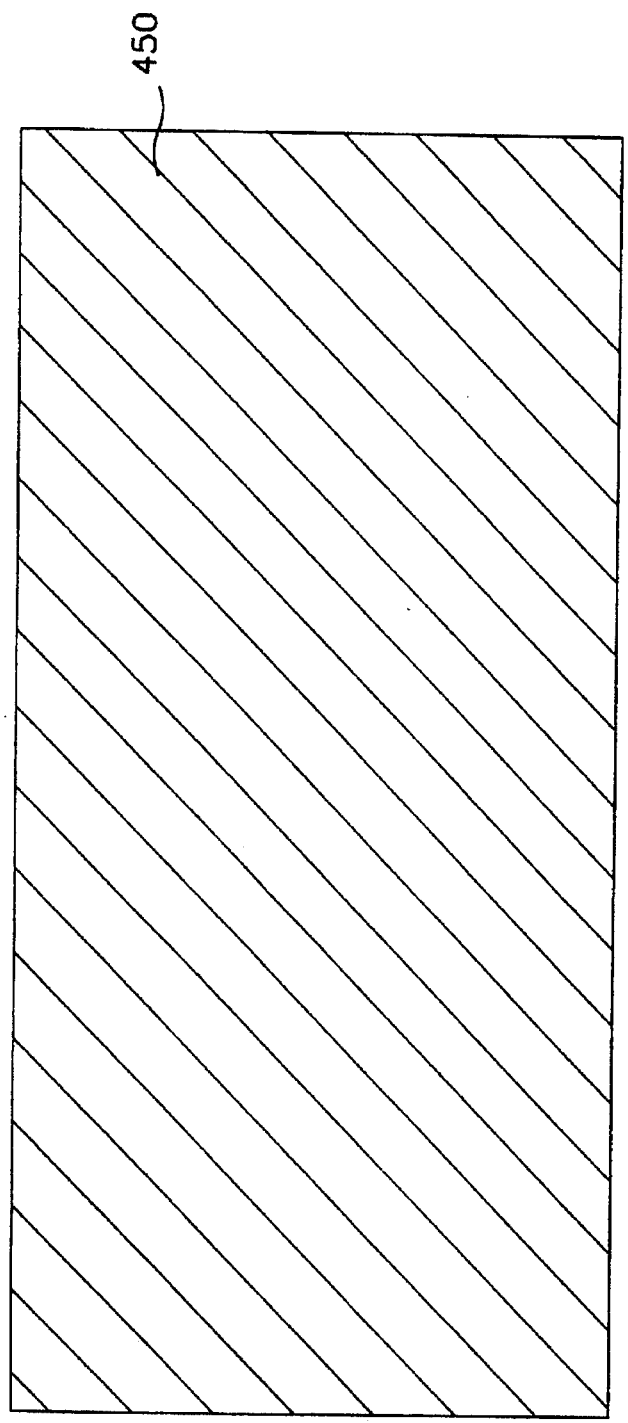
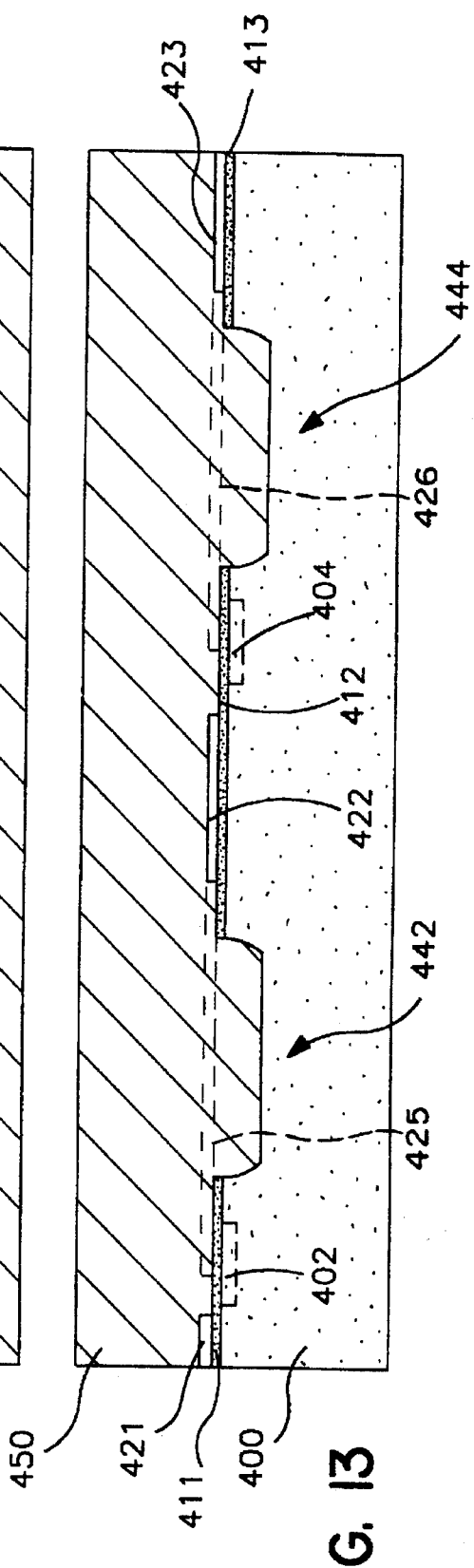
FIG. 12
FIG. 13

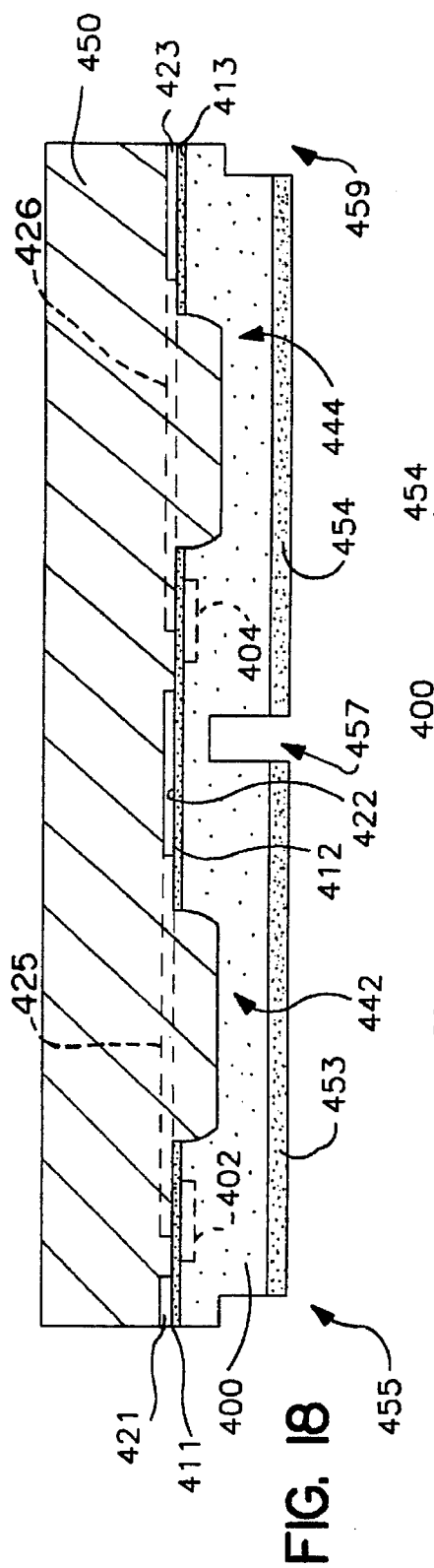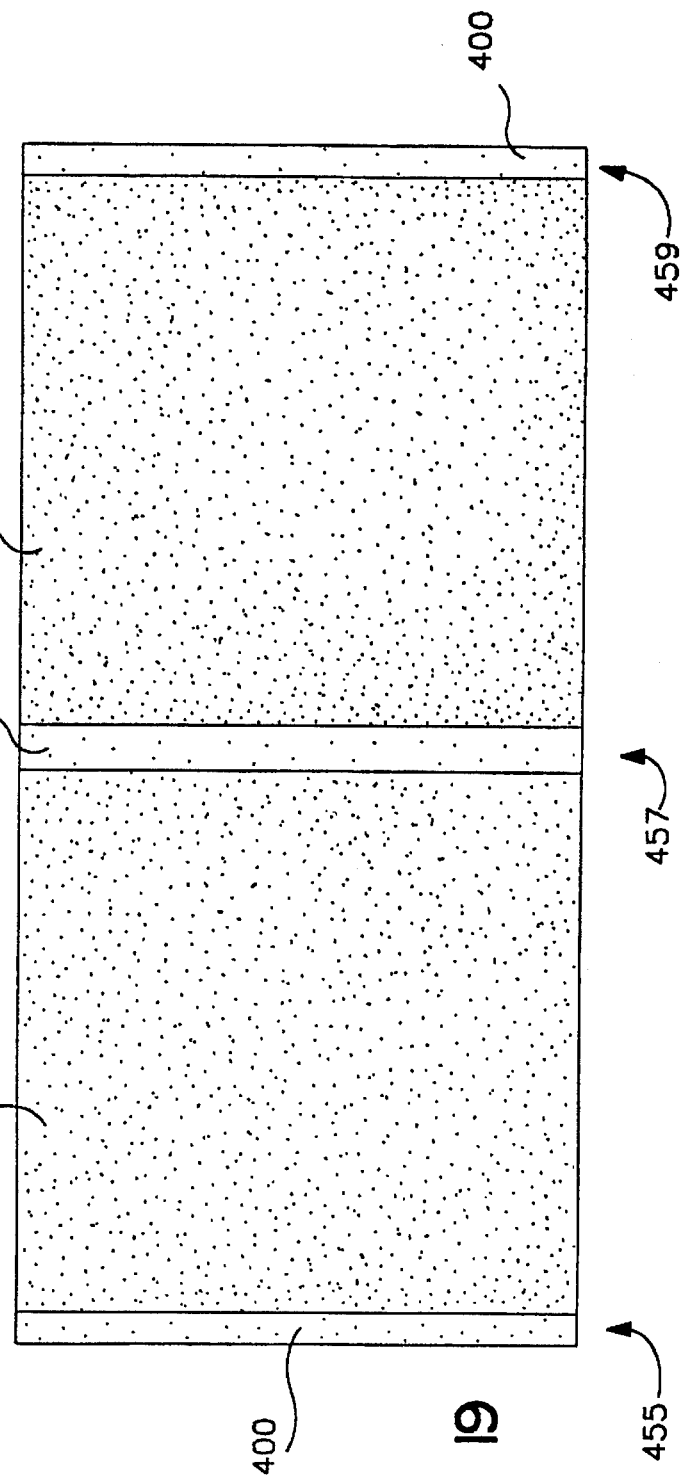

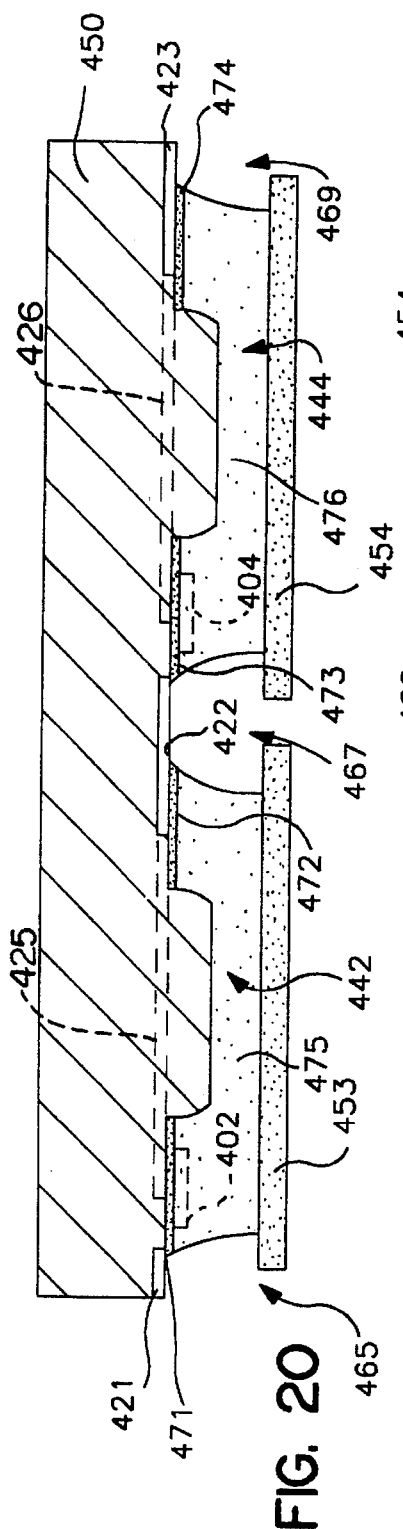
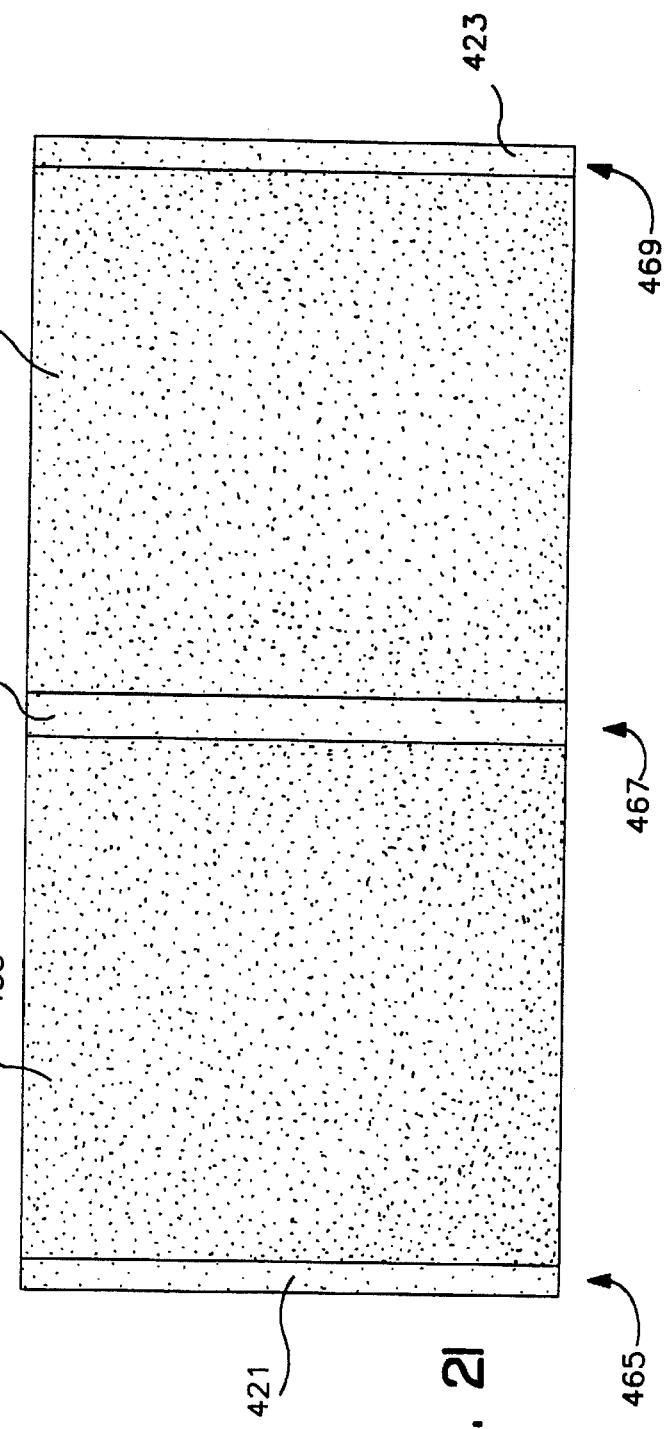

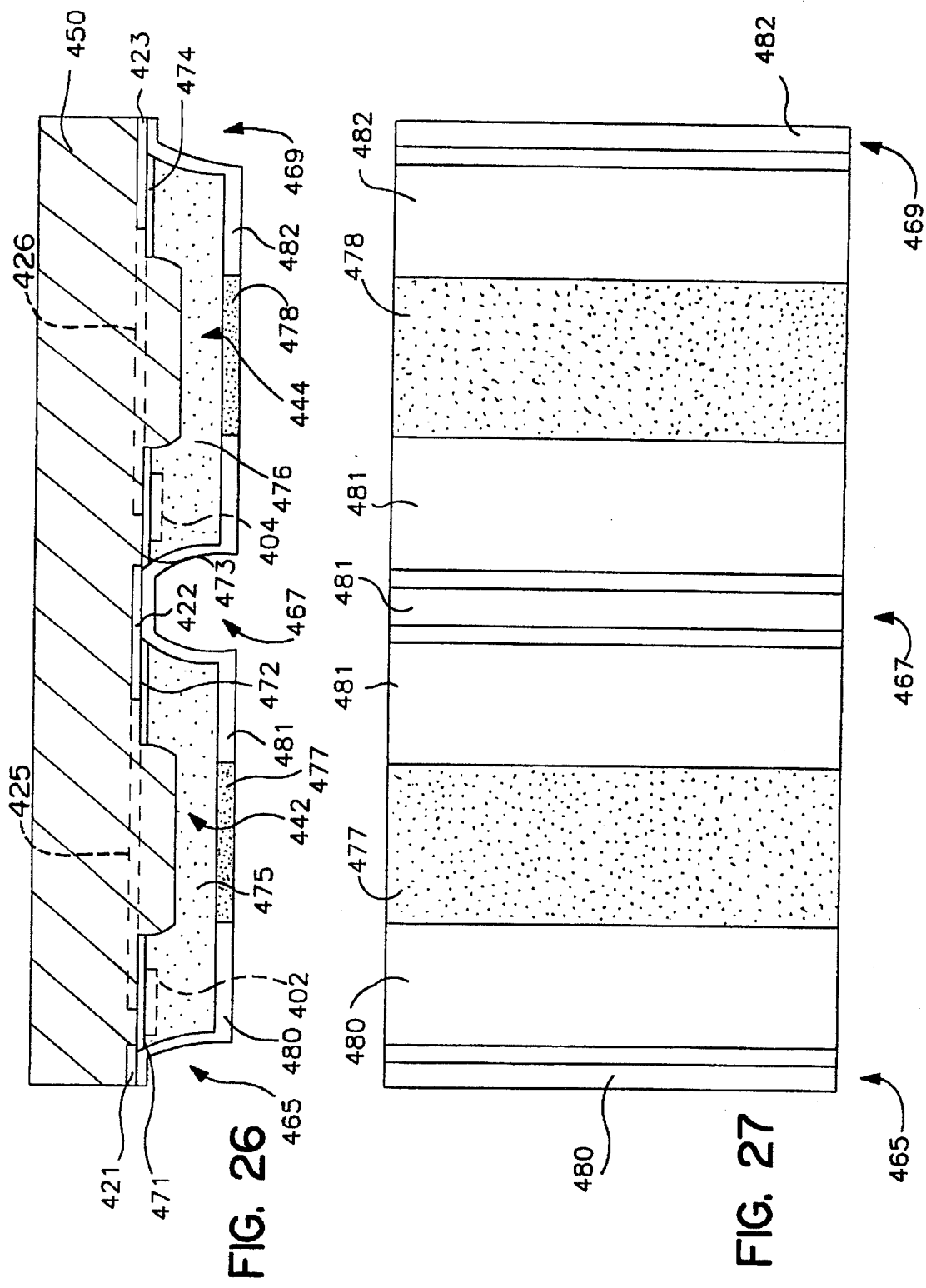

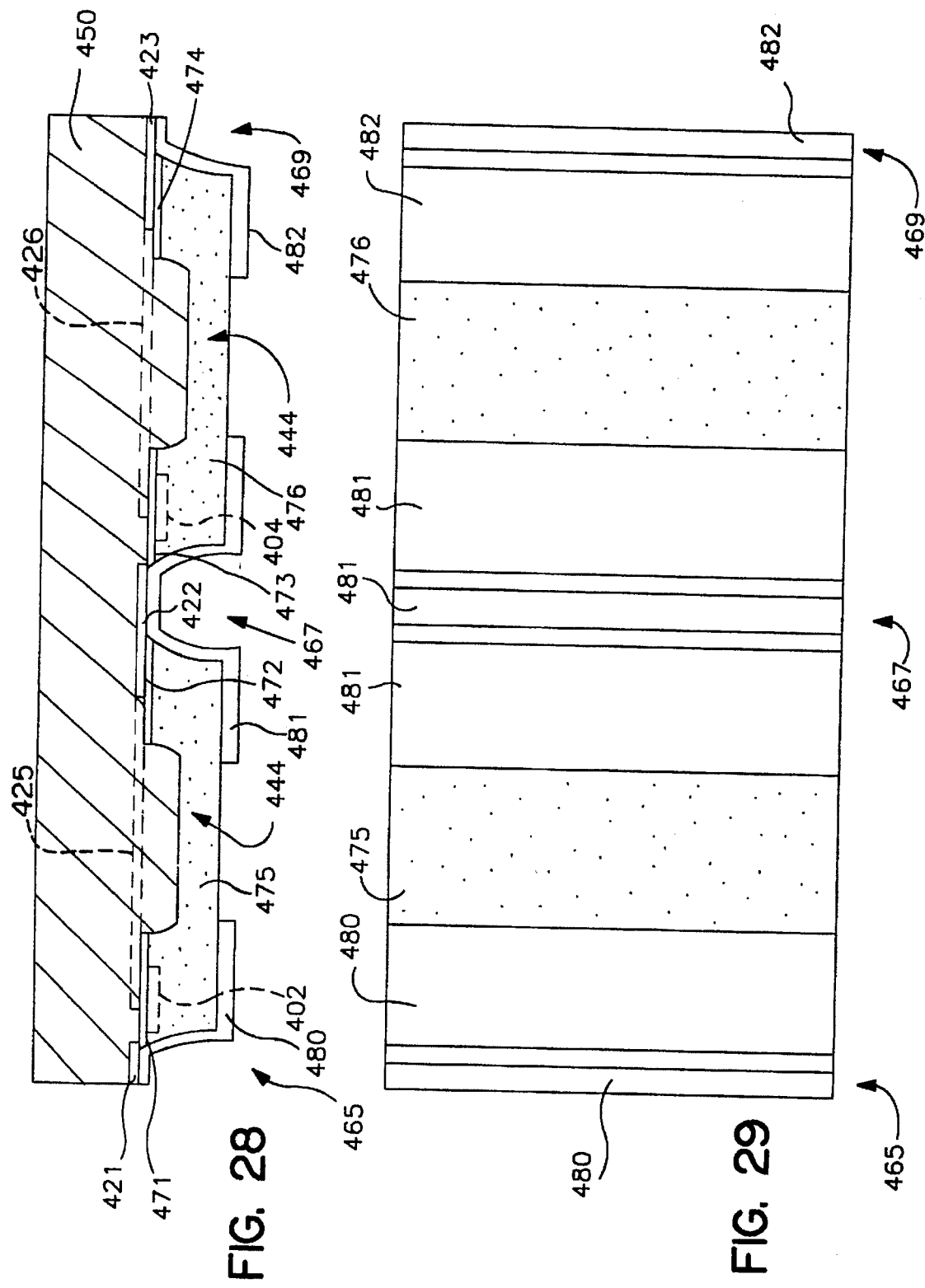

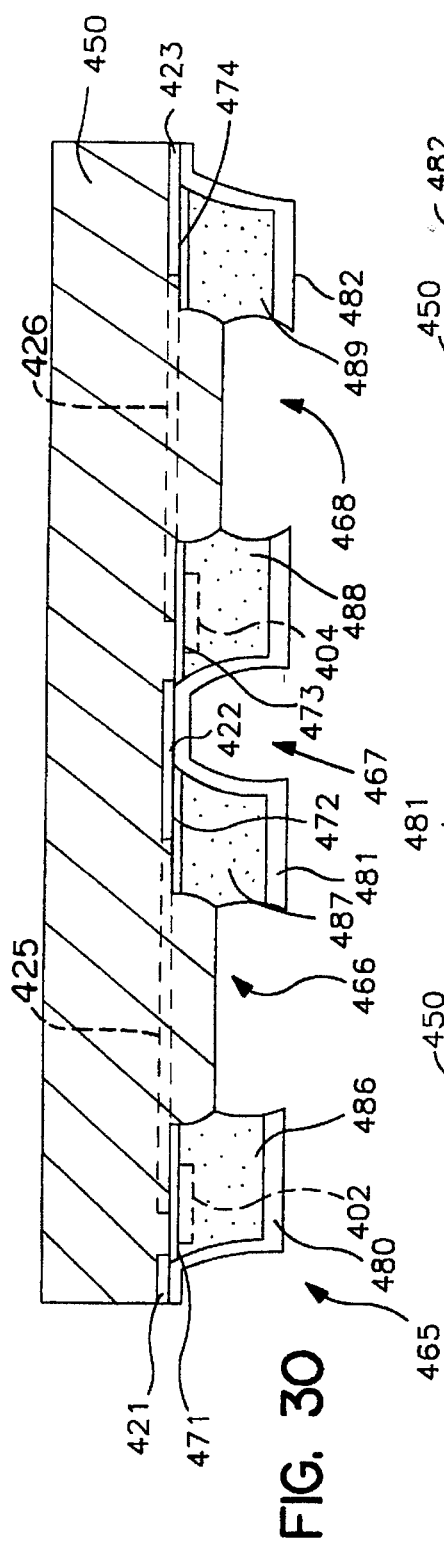
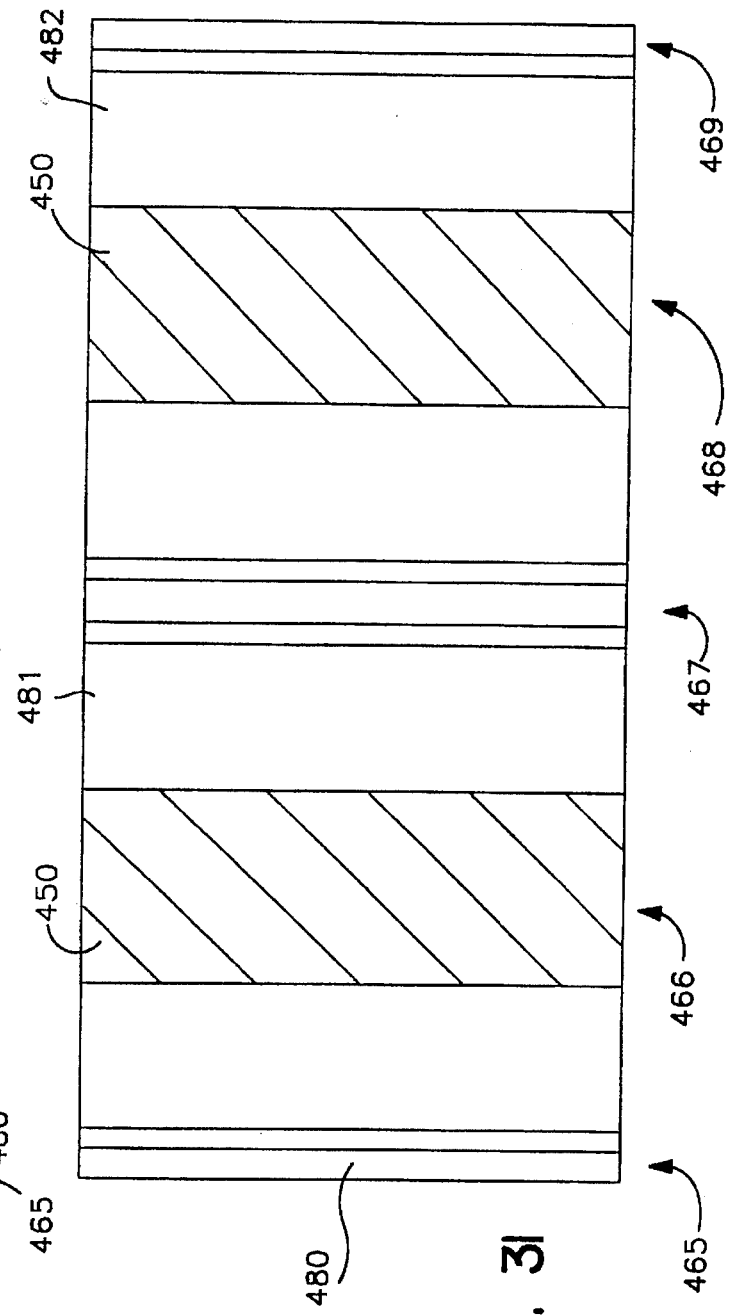

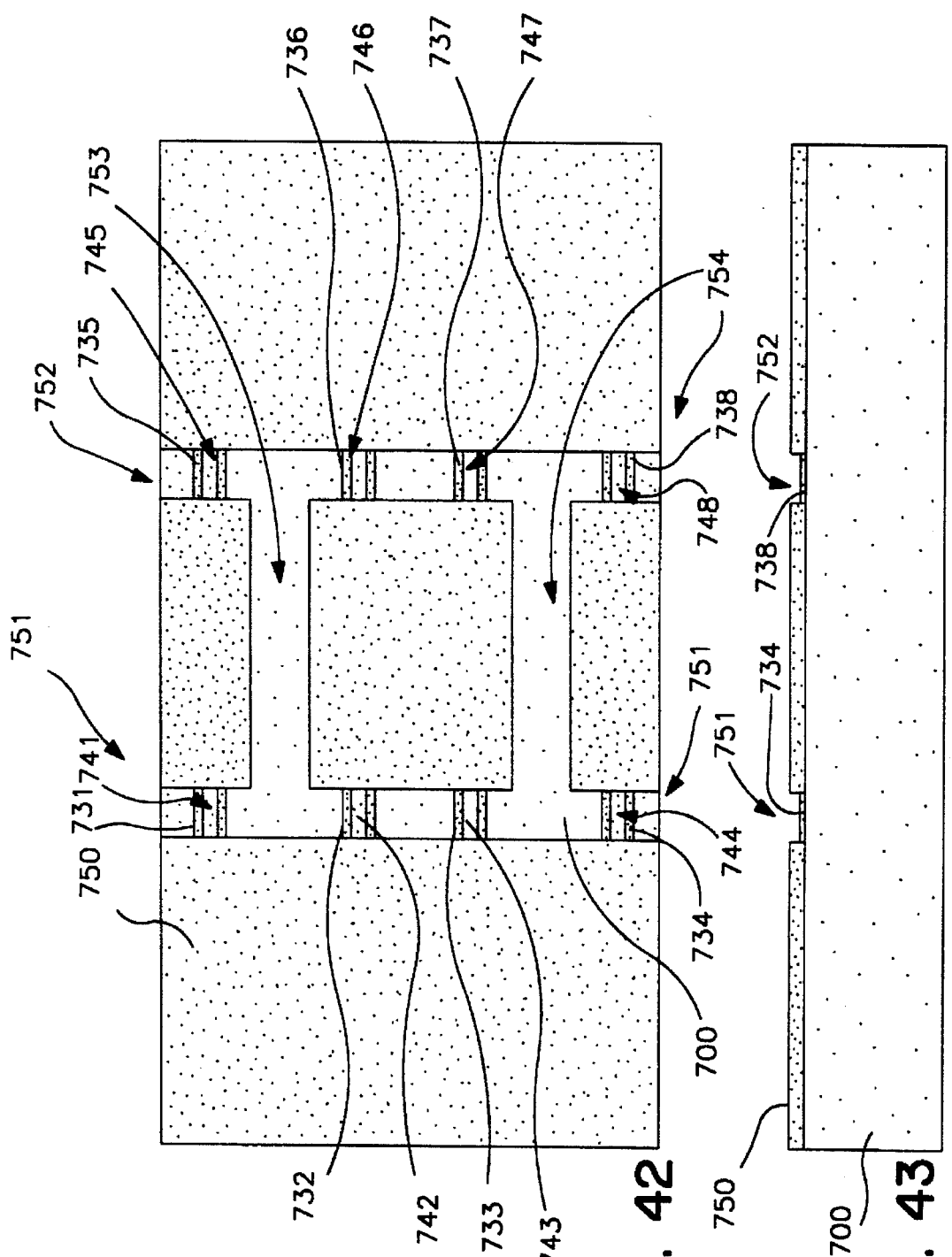

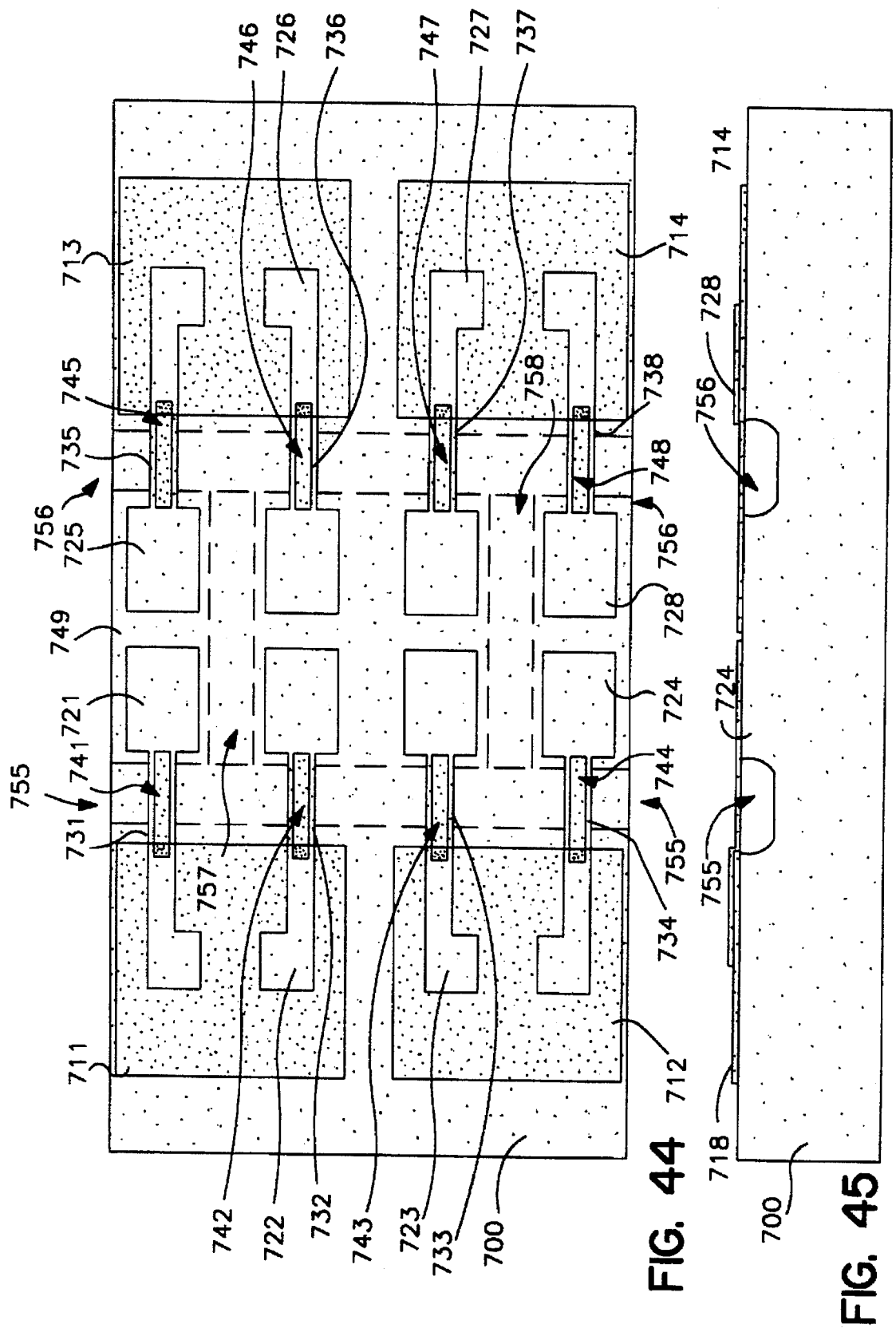

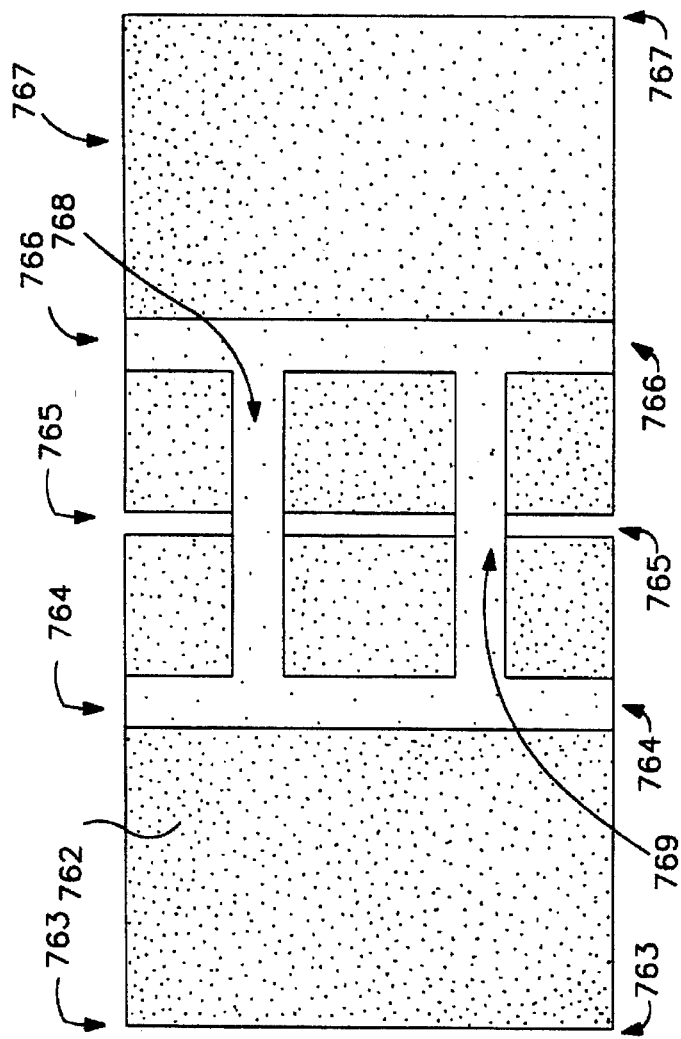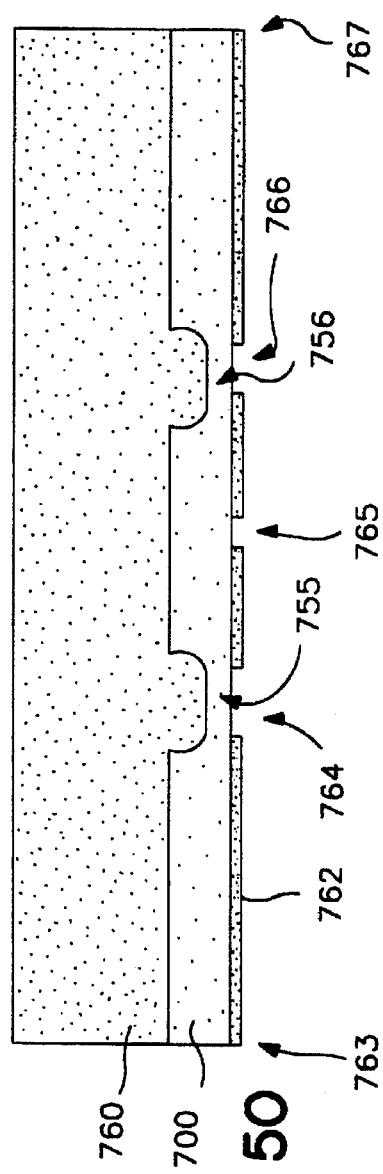

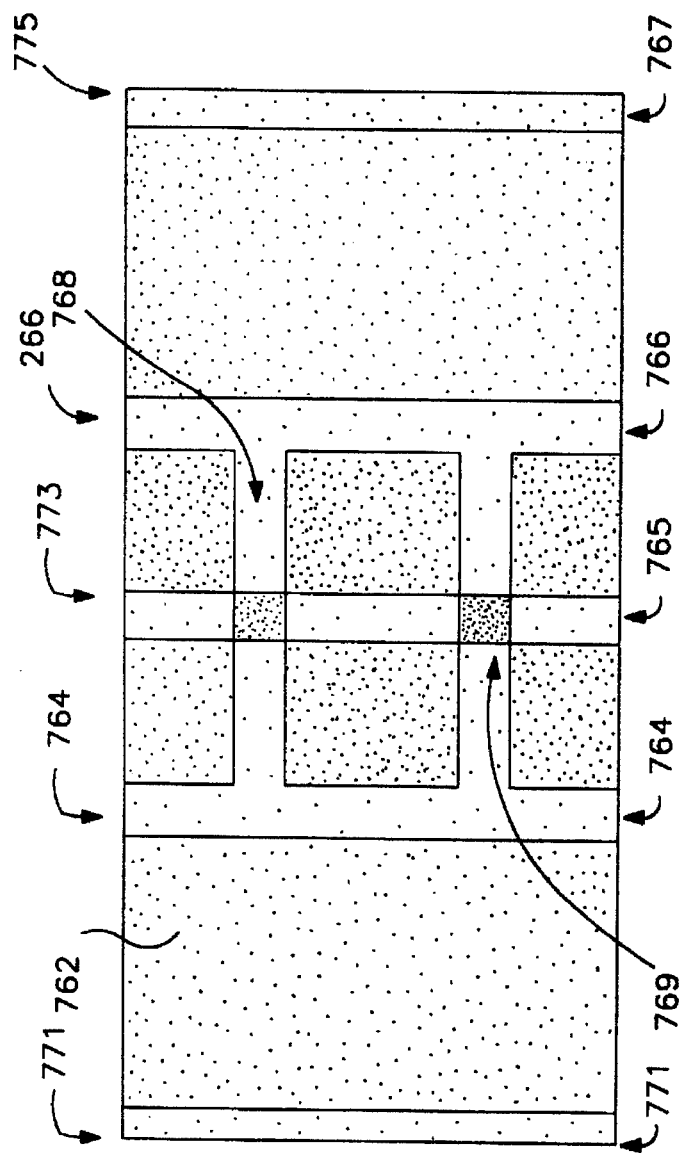
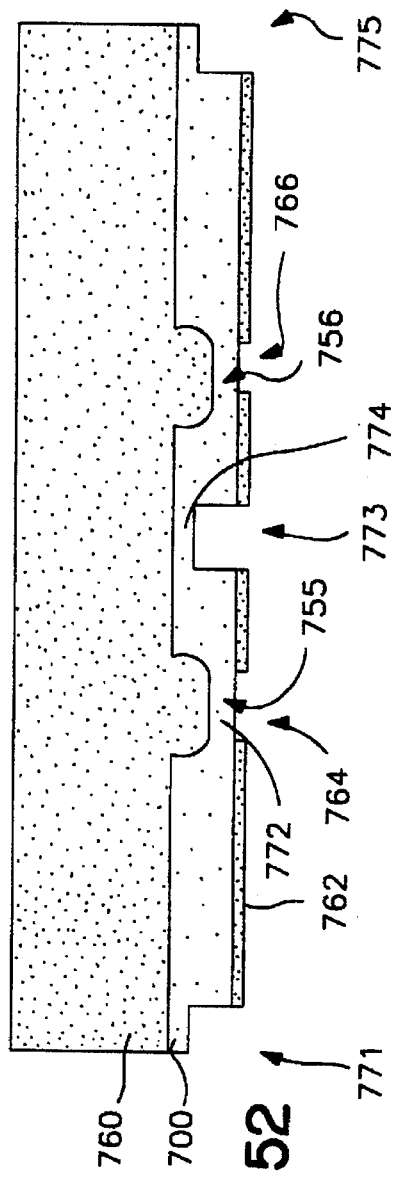
FIG. 53
FIG. 52

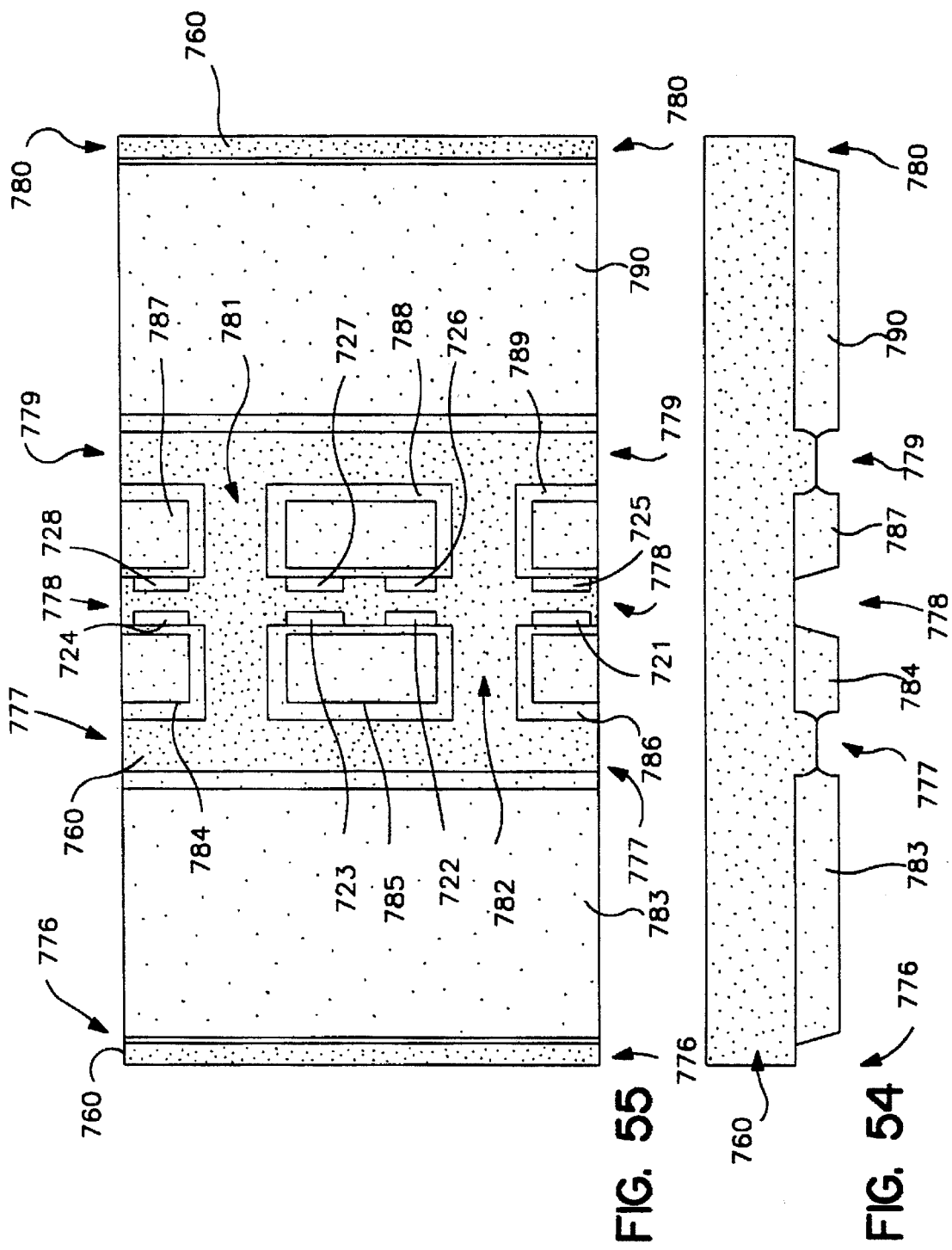

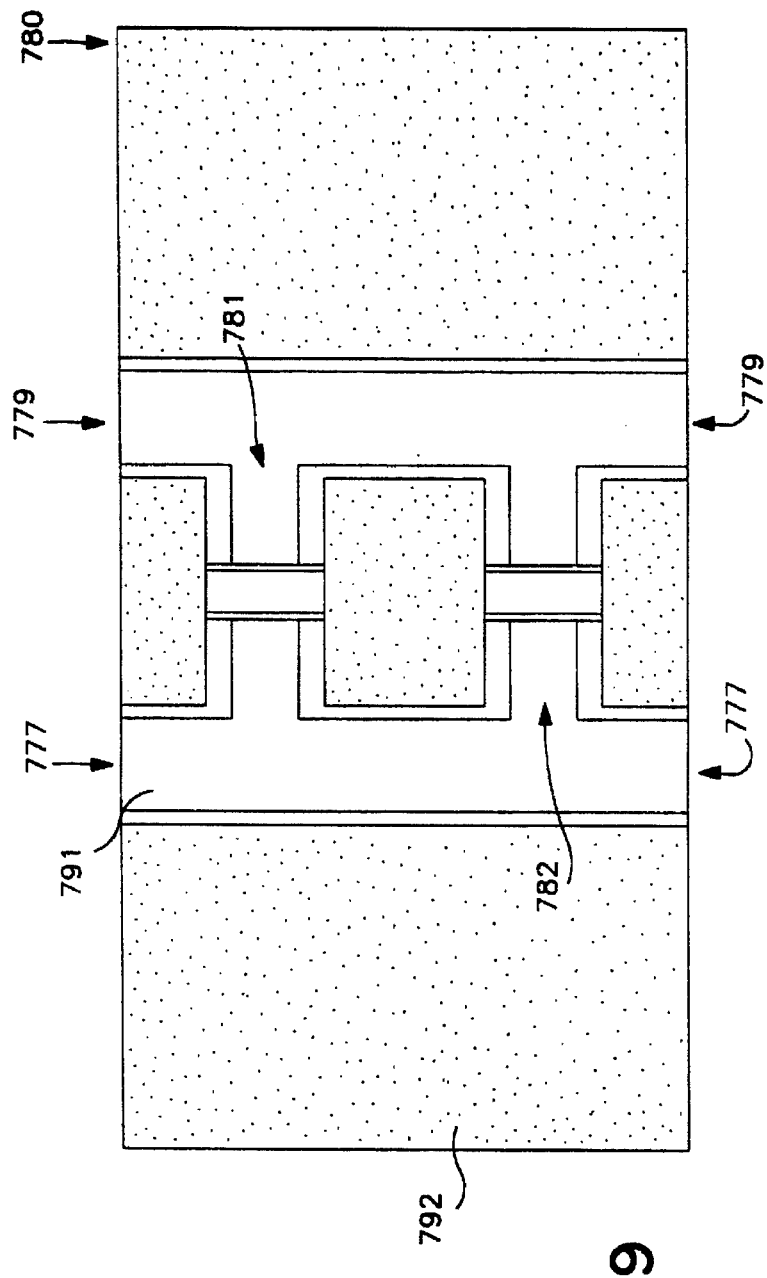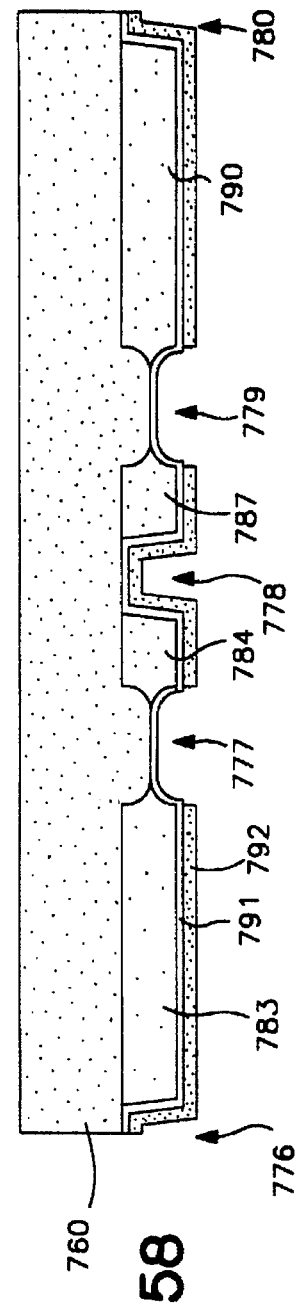
FIG. 59
FIG. 58

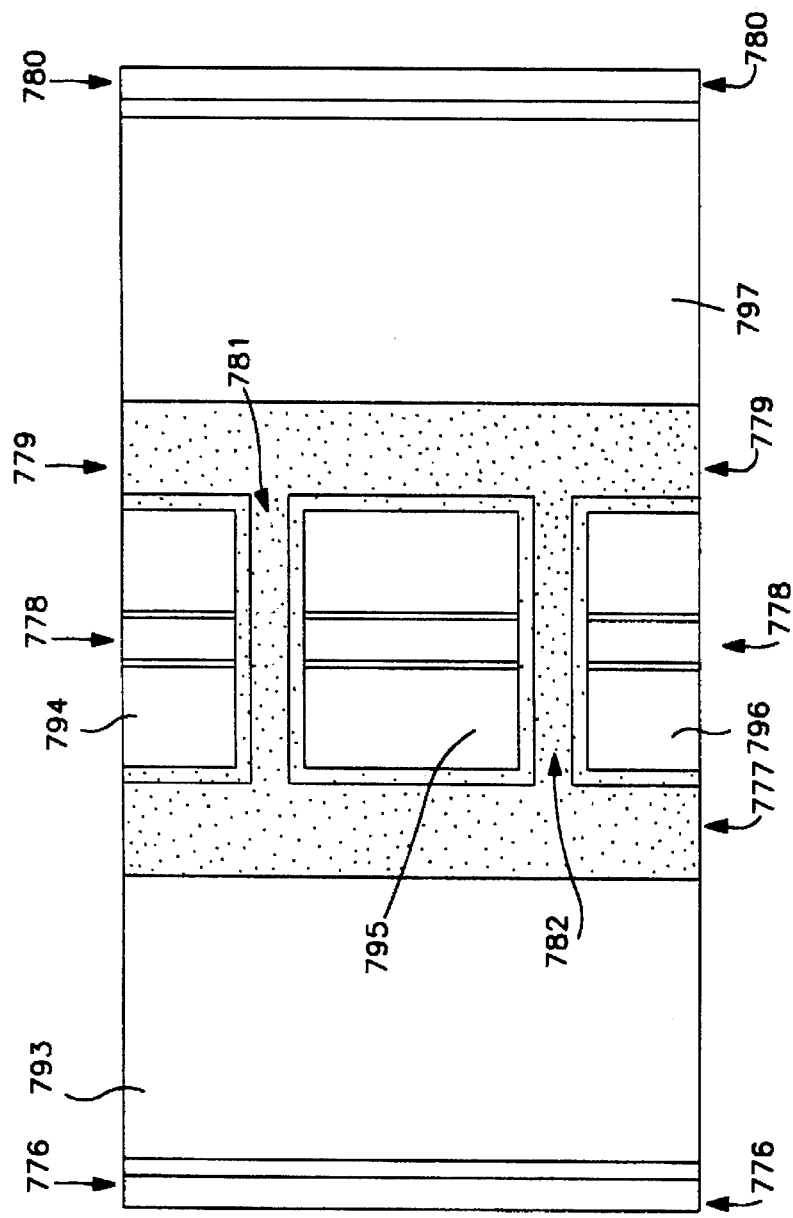
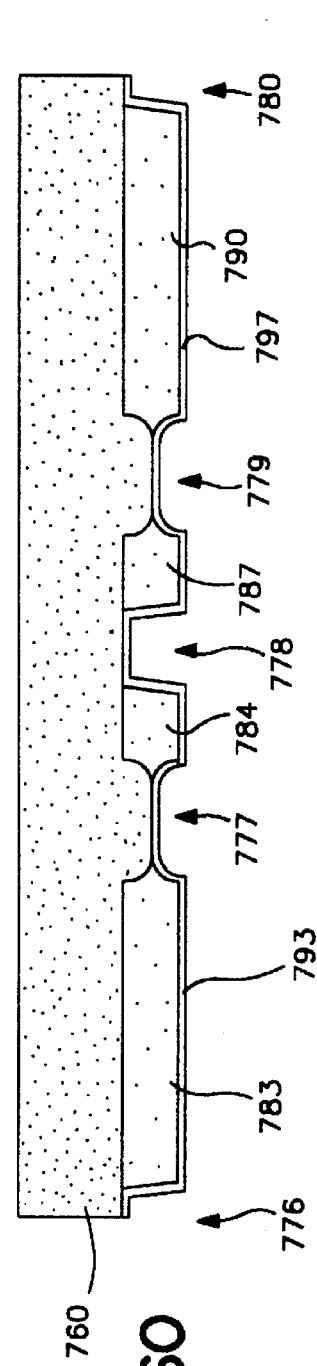
FIG. 61
FIG. 60

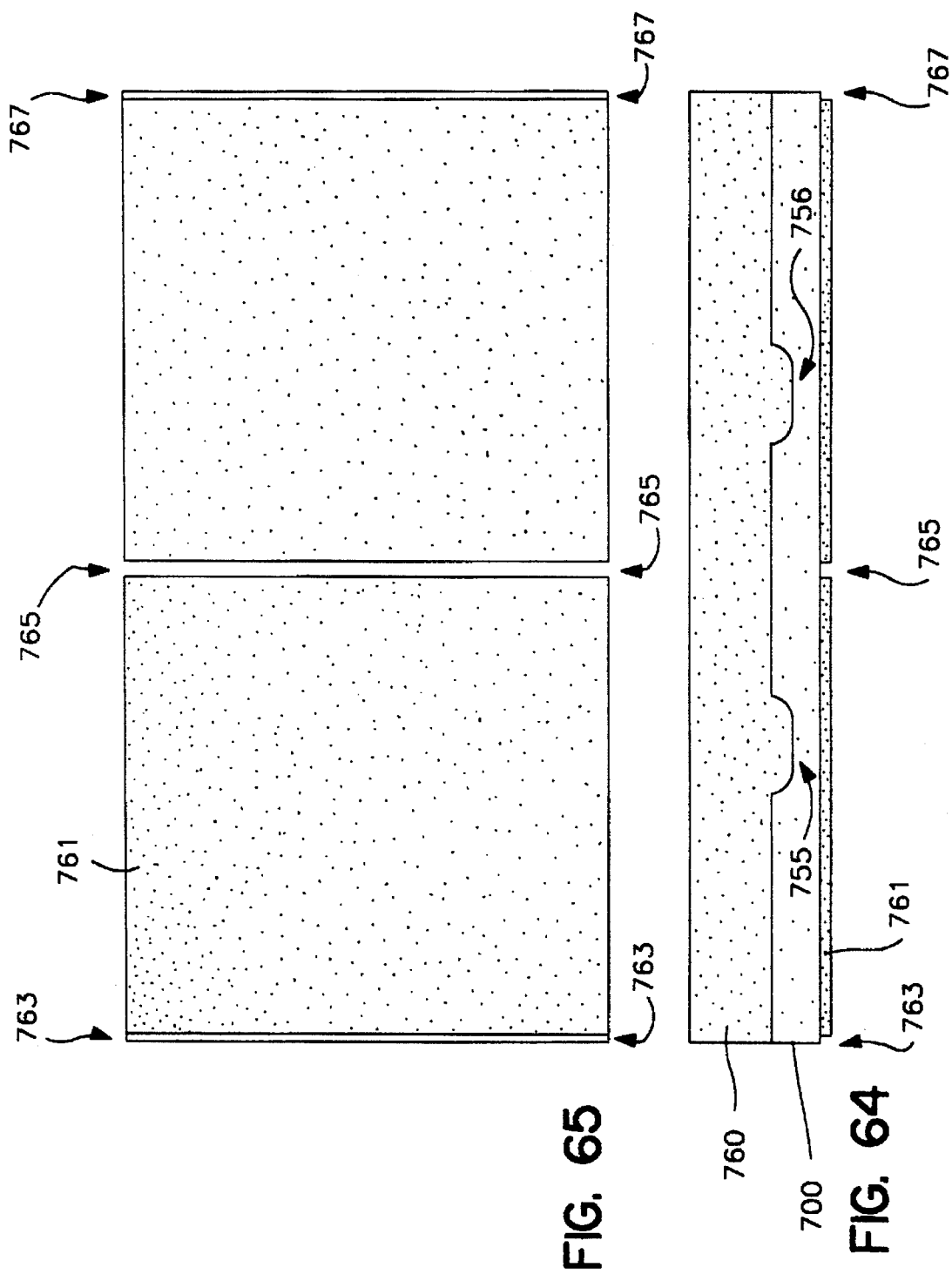

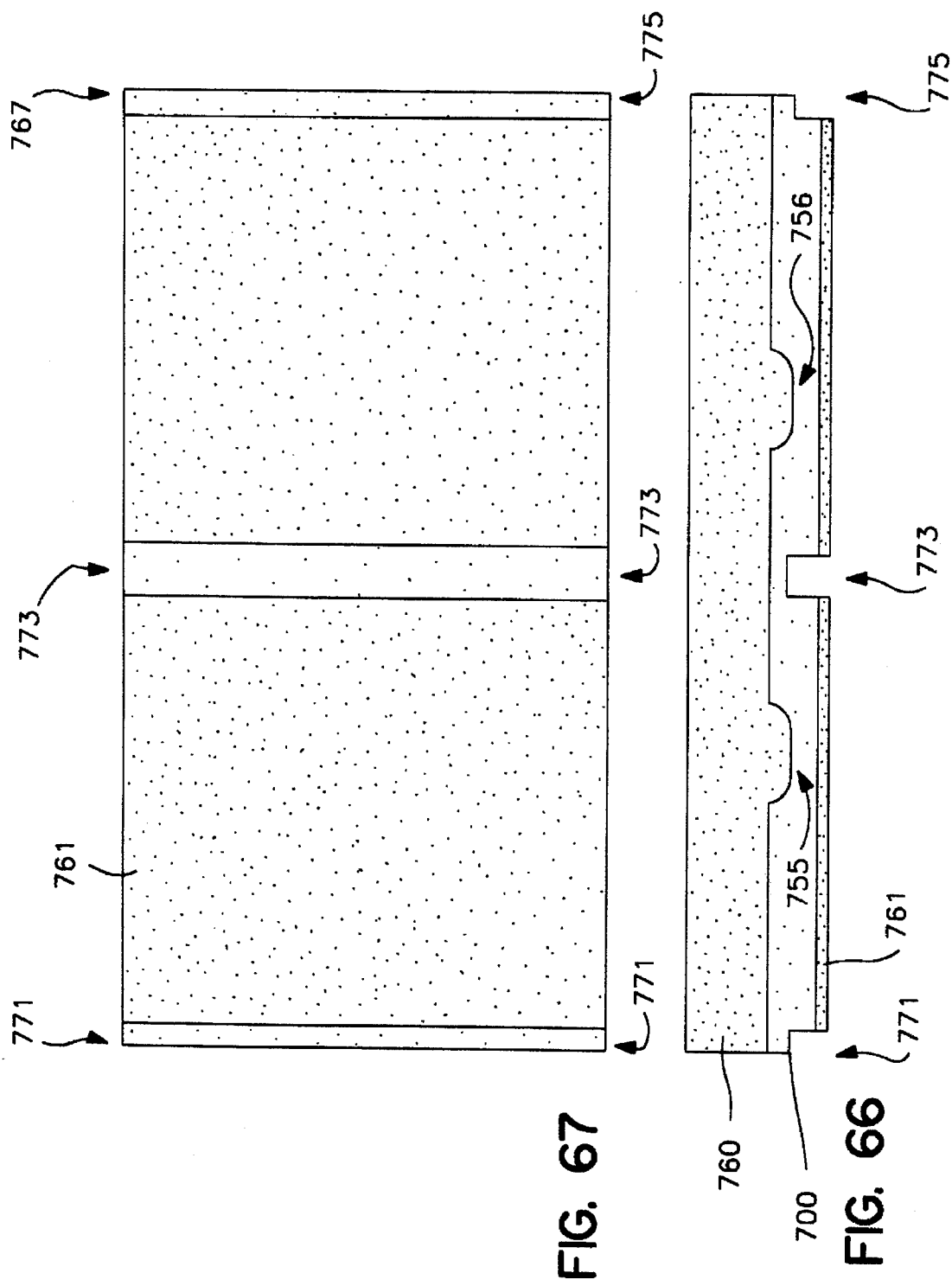

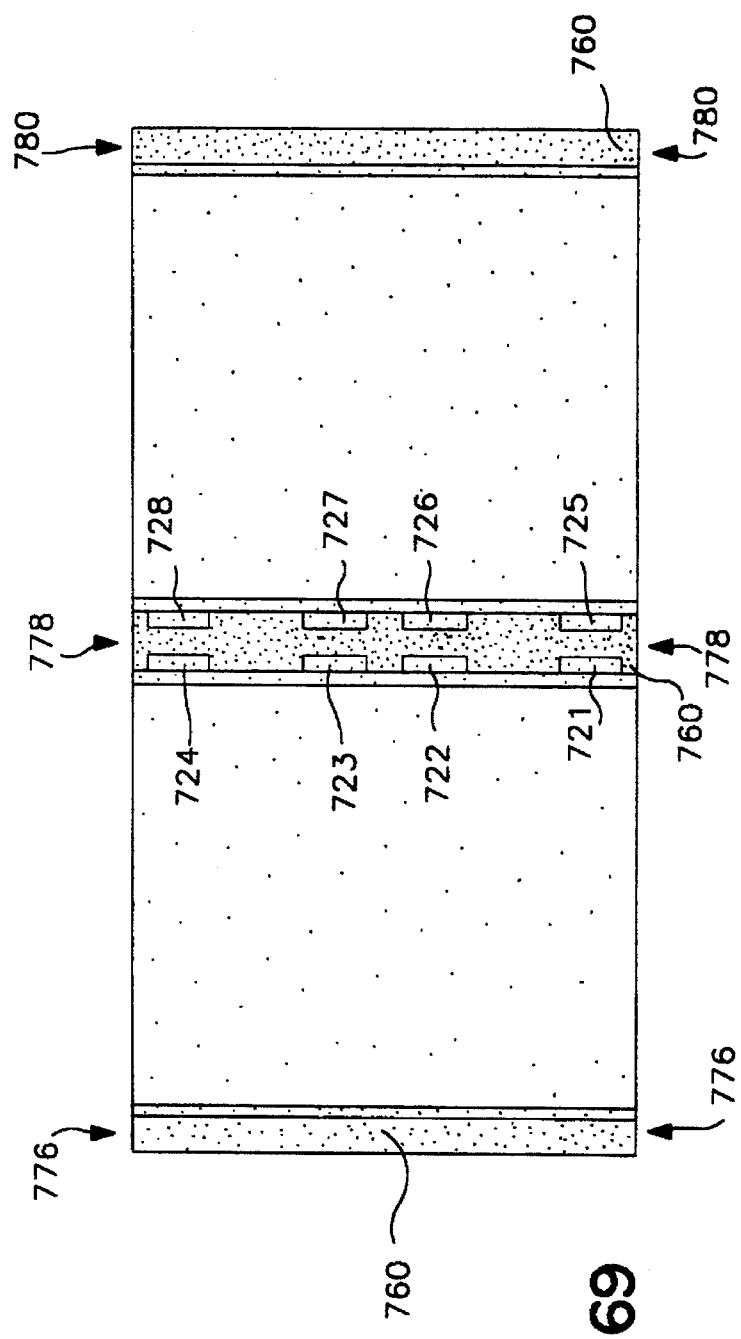
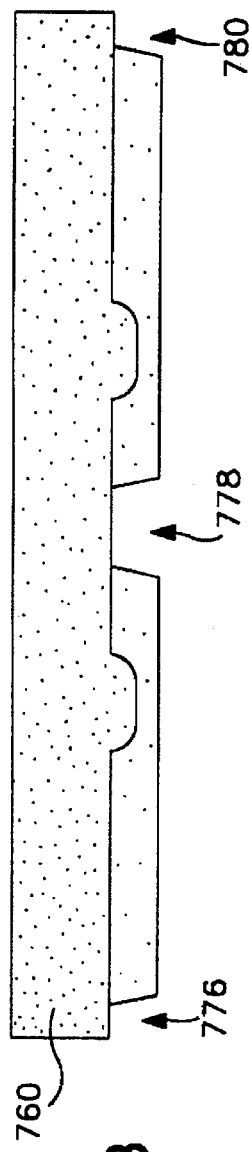
FIG. 69
FIG. 68

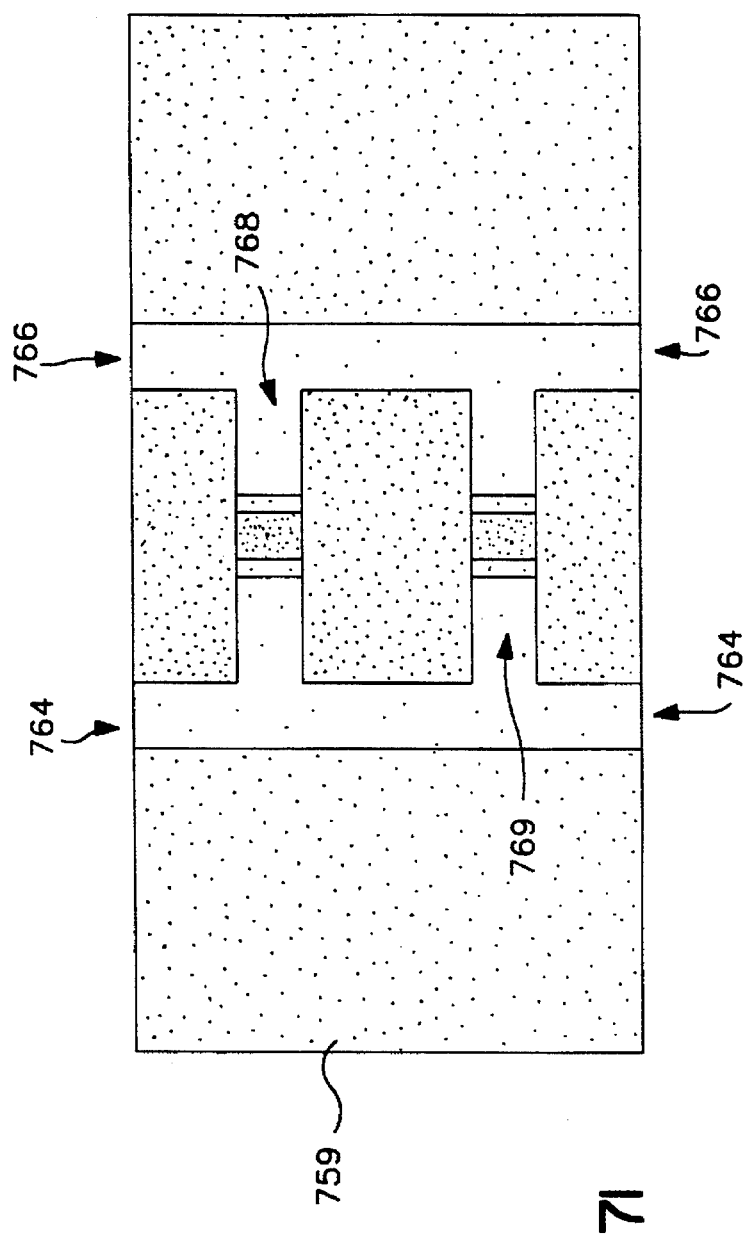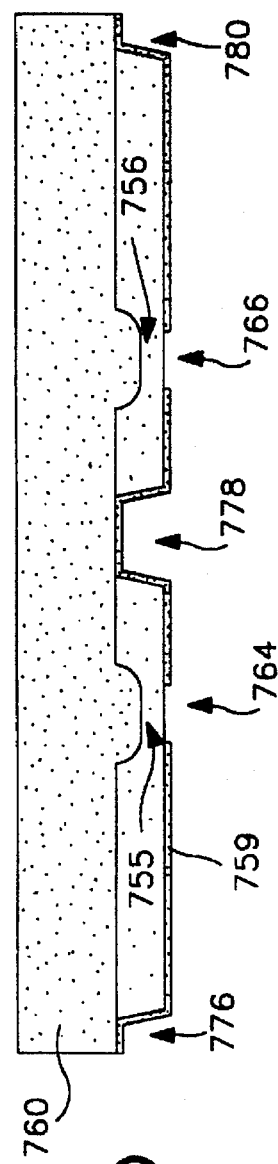
FIG. 71
FIG. 70

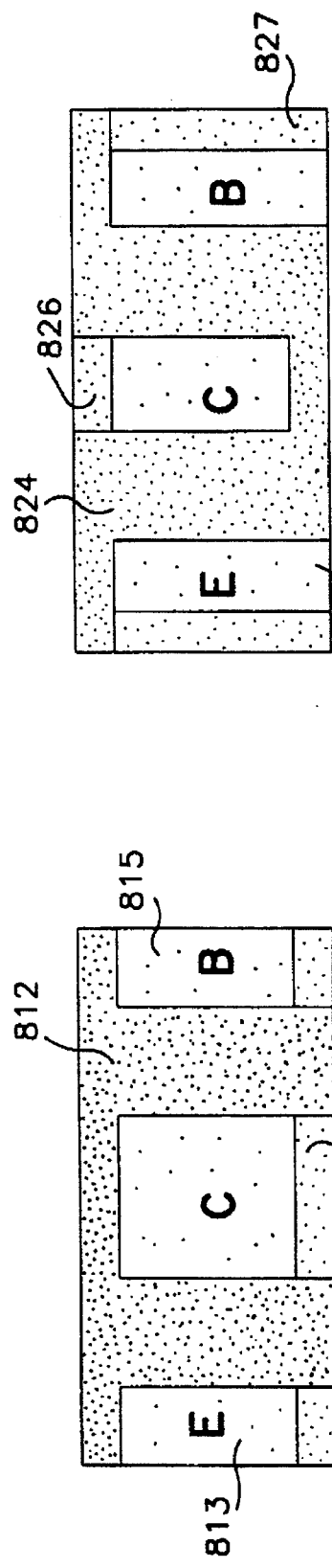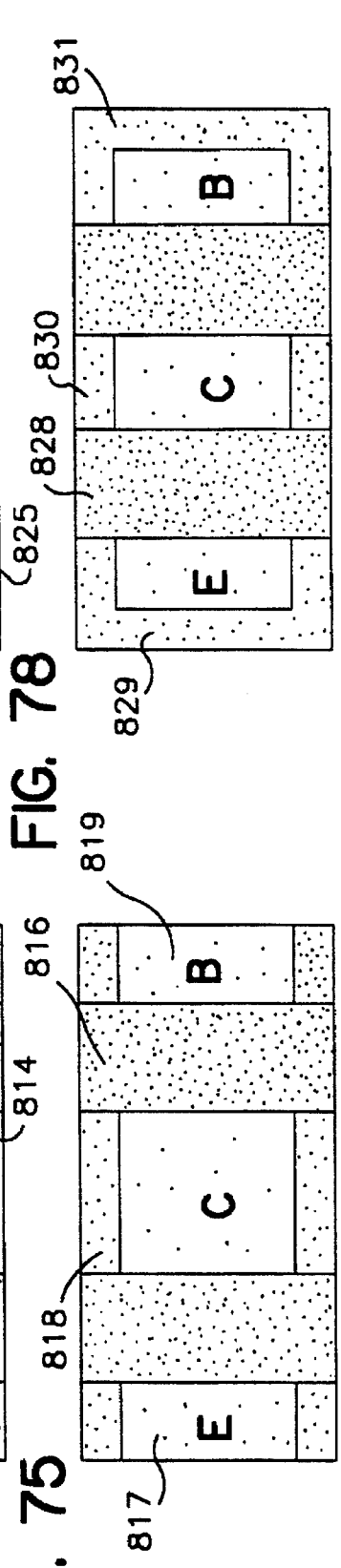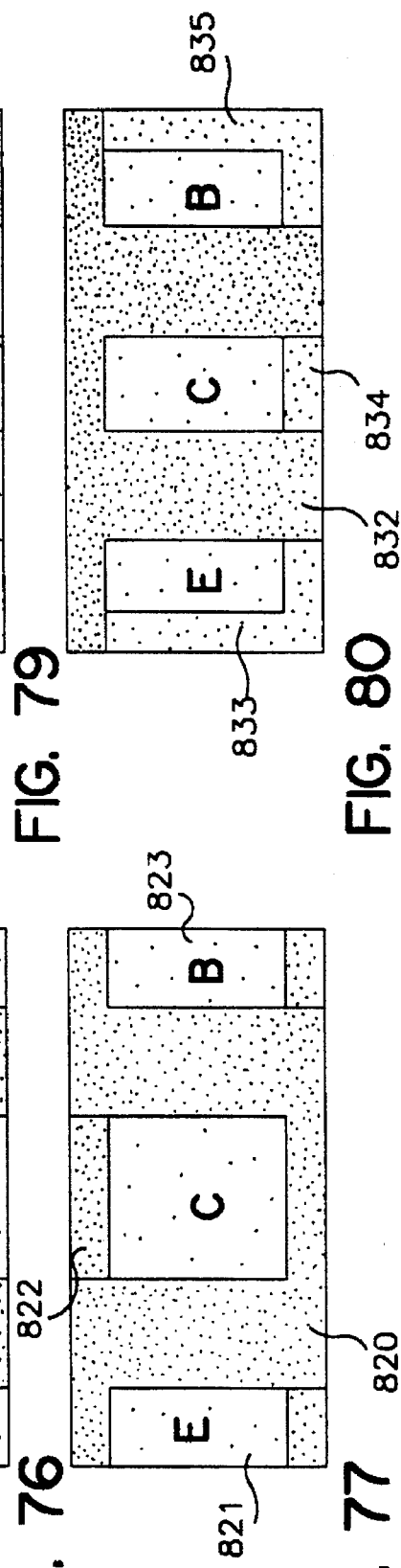

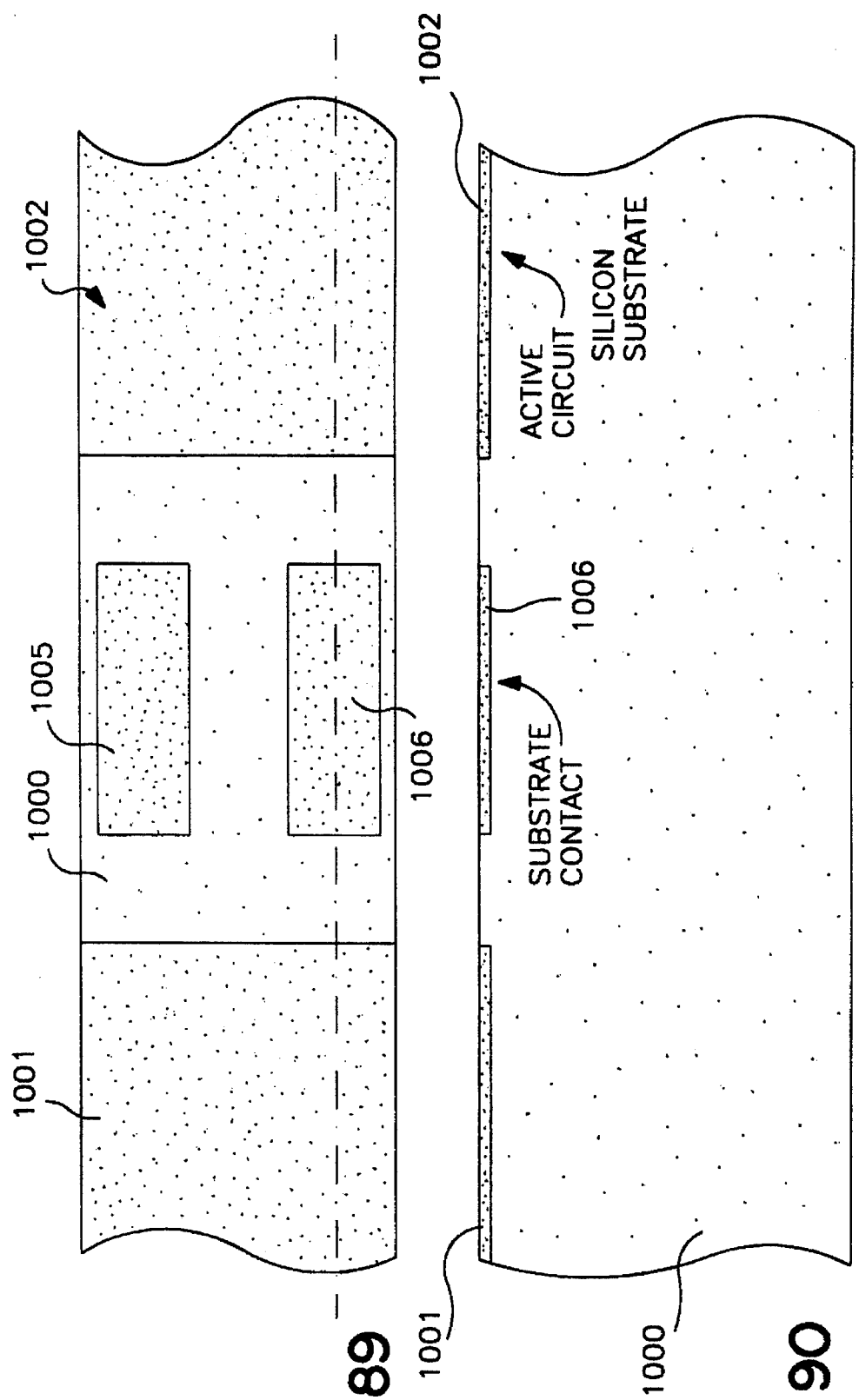

5,656,547

METHOD FOR MAKING A LEADLESS SURFACE MOUNTED DEVICE WITH WRAP-AROUND FLANGE INTERFACE CONTACTS

DISCLOSURE DOCUMENT

This application is related to Disclosure Document No. 353620 filed in the United States Patent and Trademark Office on May 4, 1994.

RELATED APPLICATIONS

This application is related to the following U.S. Patent Applications:

(1) U.S. application Ser. No. 07/889,832, filed May 27, 1992, entitled *Fabricating a Semiconductor with an Insulative Coating*; and (2) U.S. application Ser. No. 08/045,584, filed Apr. 9, 1993, entitled *Fabricating a Semiconductor with an Insulative Coating*, which is a divisional application of U.S. application Ser. No. 07/889,832, filed May 27, 1992.

FIELD OF THE INVENTION

The present invention relates generally to the field of semiconductor fabrication. More particularly, the present invention relates to the field of semiconductor structures and to the field of contact processing for semiconductor fabrication.

BACKGROUND OF THE INVENTION

FIG. 1 illustrates an integrated circuit that is surface mounted over a circuit board. This integrated circuit includes a silicon (Si) circuit 101. An insulating film 102 coats the underside of silicon circuit 101. An epoxy layer 103 and a silicon cap 104 cover silicon circuit 101. A metal bridge 105 electrically connects silicon circuit 101 to silicon post 106. Metal bridge 105 and silicon post 106 provide for a contact lead for the integrated circuit. Epoxy layer 103 and silicon cap 104 also cover metal bridge 105. Epoxy layer 103 separates silicon circuit 101 and silicon post 106.

A nickel (Ni) plate contact layer 107 covers silicon post 106 and forms a butt-joint with metal bridge 105. Contact layer 107 is electrically coupled to silicon post 106 and metal bridge 105. Contact layer 107 provides the integrated circuit with a connection point to external circuitry.

As illustrated in FIG. 1, the contact lead of the integrated circuit has been soldered to circuit board conductor 109 with solder fillet 108. Circuit board conductor 109 has been formed over circuit board substrate 110.

The contact lead for the integrated circuit illustrated in FIG. 1 provides for various advantages. For example, contact layer 107 covers the sidewalls of silicon post 106, which helps to strengthen the bonding between the integrated circuit and the circuit board. This is due to the fact that solder can be placed on contact layer 107 on the sidewalls of silicon post 106 as illustrated in FIG. 1. It also facilitates inspection during surface mount of the integrated circuit to the circuit board. Whether a good mount is made can be easily confirmed by seeing the solder on the sidewalls of silicon post 106.

Furthermore, contact layer 107 extends over the sidewalls of silicon post 106 and contacts the side of metal bridge 105, forming a butt-joint interface between contact layer 107 and metal bridge 105. This provides for an electrical contact between circuit board conductor 109 and silicon circuit 101.

The butt-joint interface of the integrated circuit contact lead of FIG. 1, however, cannot be formed with much certainty or control over its resulting reliability or bonding adhesion between contact layer 107 and metal bridge 105. There are a number of reasons for this. The physical surface of the side of metal bridge 105 might not be flat enough to ensure a reliable bond at this butt-joint interface. Furthermore, the side of metal bridge 105 is difficult to clean because of its location on the side of the wafer. The bond at this butt-joint interface therefore may be weakened if the side of metal bridge 105 has not been thoroughly cleaned. The formation of a butt-joint interface also limits the materials that may be used for contact layer 107 and metal bridge 105. This is so because metal bridge 105 will typically comprise more than one metal layer. The bonding layer of contact layer 107 then has to be formed so as to bond with each metal layer at the side of metal bridge 105 in order to form an effective contact. Accordingly, the selection of materials that may be used for metal bridge 105 and for the bonding layer of contact layer 107 is limited.

BRIEF SUMMARY AND OBJECTS OF THE INVENTION

One of the objects of the present invention is to provide an electrical apparatus that is relatively durable and reliable.

Another object of the present invention is to provide an electrical apparatus with a durable and reliable contact interface to improve electrical bonding.

A further object of the present invention is to provide an electrical apparatus with a contact region having conductive sidewalls and a flange interface to improve electrical bonding.

A further object of the present invention is to provide an electrical apparatus with a conductive bridge structure and with a contact region having conductive sidewalls and forming a flange interface with the conductive bridge structure to improve electrical bonding.

In accordance with the present invention, a first layer having a first material is formed over the first side of a wafer. A trench is formed from the second side of the wafer such that a portion of the first layer becomes exposed in the trench. A second layer having a second material is formed over the second side of the wafer such that a portion of the second layer contacts the portion of the first layer exposed in the trench. The wafer is separated through the trench. The trench may be formed by sawing the second side of the wafer in an area where the trench is to be formed. The wafer is etched such that the trench is formed.

Also in accordance with the present invention, an electrical apparatus includes a semiconductor wafer having a first side and a second side. A first layer having a first material is formed over the first side of the wafer. A second layer having a second material is formed over the second side of the wafer. The first layer and the second layer form a flange interface at an edge of the semiconductor wafer.

Still further in accordance with the present invention, an improved transistor structure is provided. A method for use in fabricating an improved transistor structure is also provided.

In addition to the above, other attendant advantages, objects, and uses of the present invention will become evident to one of ordinary skill in the art based on the following detailed description of the present invention with reference to the accompanying drawings.

BRIEF DESCRIPTION OF THE DRAWINGS

The present invention is illustrated by way of example and not limitation in the figures of the accompanying drawings in which like references indicate similar elements and in which:

FIG. 6 illustrates a top view of a semiconductor wafer used to fabricate the diode module of FIG. 2;

FIG. 7 illustrates a cross-sectional side view of the wafer of FIG. 6;

FIG. 8 illustrates a top view of the wafer of FIG. 6 after interconnects have been formed over the wafer;

FIG. 9 illustrates a cross-sectional side view of the wafer of FIG. 8;

FIG. 12 illustrates a top view of the wafer of FIG. 10 after an overlying layer has been formed over the wafer;

FIG. 13 illustrates a cross-sectional side view of the wafer of FIG. 12;

FIG. 18 illustrates a cross-sectional side view of the wafer of FIG. 16 after the underside of the wafer has been sawed;

FIG. 19 illustrates an underside view of the wafer of FIG. 18;

FIG. 20 illustrates a cross-sectional side view of the wafer of FIG. 18 after the underside of the substrate of the wafer has been etched;

FIG. 21 illustrates an underside view of the wafer of FIG. 20;

FIG. 26 illustrates a cross-sectional side view of the wafer of FIG. 24 after a contact layer has been formed over the underside of the wafer;

FIG. 27 illustrates an underside view of the wafer of FIG. 26;

FIG. 28 illustrates a cross-sectional side view of the wafer of FIG. 26 after the underside mask layer has been removed;

FIG. 29 illustrates an underside view of the wafer of FIG. 28;

FIG. 30 illustrates a cross-sectional side view of the wafer of FIG. 28 after the underside of the substrate of the wafer has been etched;

FIG. 31 illustrates an underside view of the wafer of FIG. 30;

FIG. 42 illustrates a top view of the wafer of FIG. 40 after a mask layer has been formed over the wafer;

FIG. 43 illustrates a cross-sectional side view of the wafer of FIG. 42;

FIG. 44 illustrates a top view of the wafer of FIG. 42 after trenches have been formed from the substrate of the wafer and after the mask layer has been removed;

FIG. 45 illustrates a cross-sectional side view of the wafer of FIG. 44;

FIG. 50 illustrates a cross-sectional side view of the wafer of FIG. 48 after a mask layer has been formed over the underside of the wafer;

FIG. 51 illustrates an underside view of the wafer of FIG. 50;

FIG. 52 illustrates a cross-sectional side view of the wafer of FIG. 50 after the underside of the wafer has been sawed;

FIG. 53 illustrates an underside view of the wafer of FIG. 52;

FIG. 54 illustrates a cross-sectional side view of the wafer of FIG. 52 after the underside of the substrate of the wafer has been etched and after the underside mask layer has been removed;

FIG. 55 illustrates an underside view of the wafer of FIG. 54;

FIG. 58 illustrates a cross-sectional side view of the wafer of FIG. 56 after a mask layer has been formed over the underside of the wafer;

FIG. 59 illustrates an underside view of the wafer of FIG. 58;

FIG. 60 illustrates a cross-sectional side view of the wafer of FIG. 58 after the contact layer has been patterned and after the underside mask layer has been removed;

FIG. 61 illustrates an underside view of the wafer of FIG. 60;

FIG. 64 illustrates a cross-sectional side view of the wafer of FIG. 48 after a mask layer has been formed over the underside of the wafer;

FIG. 65 illustrates an underside view of the wafer of FIG. 64;

FIG. 66 illustrates a cross-sectional side view of the wafer of FIG. 64 after the underside of the wafer has been sawed;

FIG. 67 illustrates an underside view of the wafer of FIG. 66;

FIG. 68 illustrates a cross-sectional side view of the wafer of FIG. 66 after the underside of the substrate of the wafer has been etched and after the underside mask layer has been removed;

FIG. 69 illustrates an underside view of the wafer of FIG. 68;

FIG. 70 illustrates a cross-sectional view of the wafer of FIG. 68 after a mask layer has been formed over the underside of the wafer;

FIG. 71 illustrates an underside view of the wafer of FIG. 70;

FIG. 75 illustrates a bottom view of yet another transistor module;

FIG. 76 illustrates a bottom view of yet another transistor module;

FIG. 77 illustrates a bottom view of yet another transistor module;

FIG. 78 illustrates a bottom view of yet another transistor module;

FIG. 79 illustrates a bottom view of yet another transistor module;

FIG. 80 illustrates a bottom view of yet another transistor module;

FIG. 89 illustrates a top view of a semiconductor wafer used to fabricate the integrated circuit of FIG. 88;

FIG. 90 illustrates a cross-sectional side view of the wafer of FIG. 89;

DETAILED DESCRIPTION

The following detailed description sets forth a specific embodiment or embodiments in accordance with the present invention for semiconductor fabrication with contact processing for a wrap-around flange interface. In the following description, numerous specific details are set forth such as specific dimensions, materials, processing sequences, semiconductor devices, etc., in order to provide a thorough understanding of the present invention. It will be evident, however, to one of ordinary skill in the art that the present invention may be practiced without these specific details. In other instances, well-known processing steps, equipment, etc., have not been described in particular detail so that the present invention is not unnecessarily obscured.

DIODE

Figure 1:
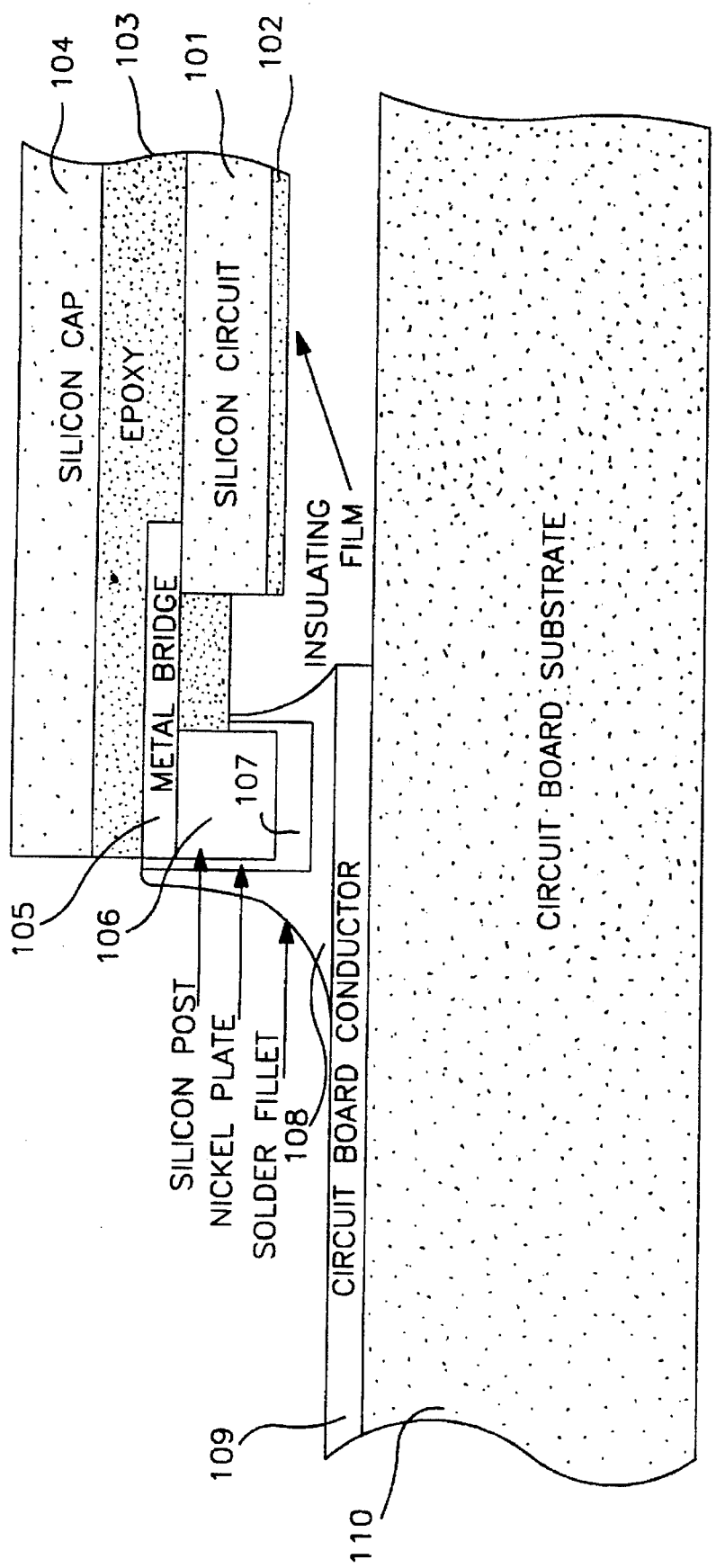
FIG. 1 illustrates a cross-sectional side view of an integrated circuit contact lead.
Figure 2:
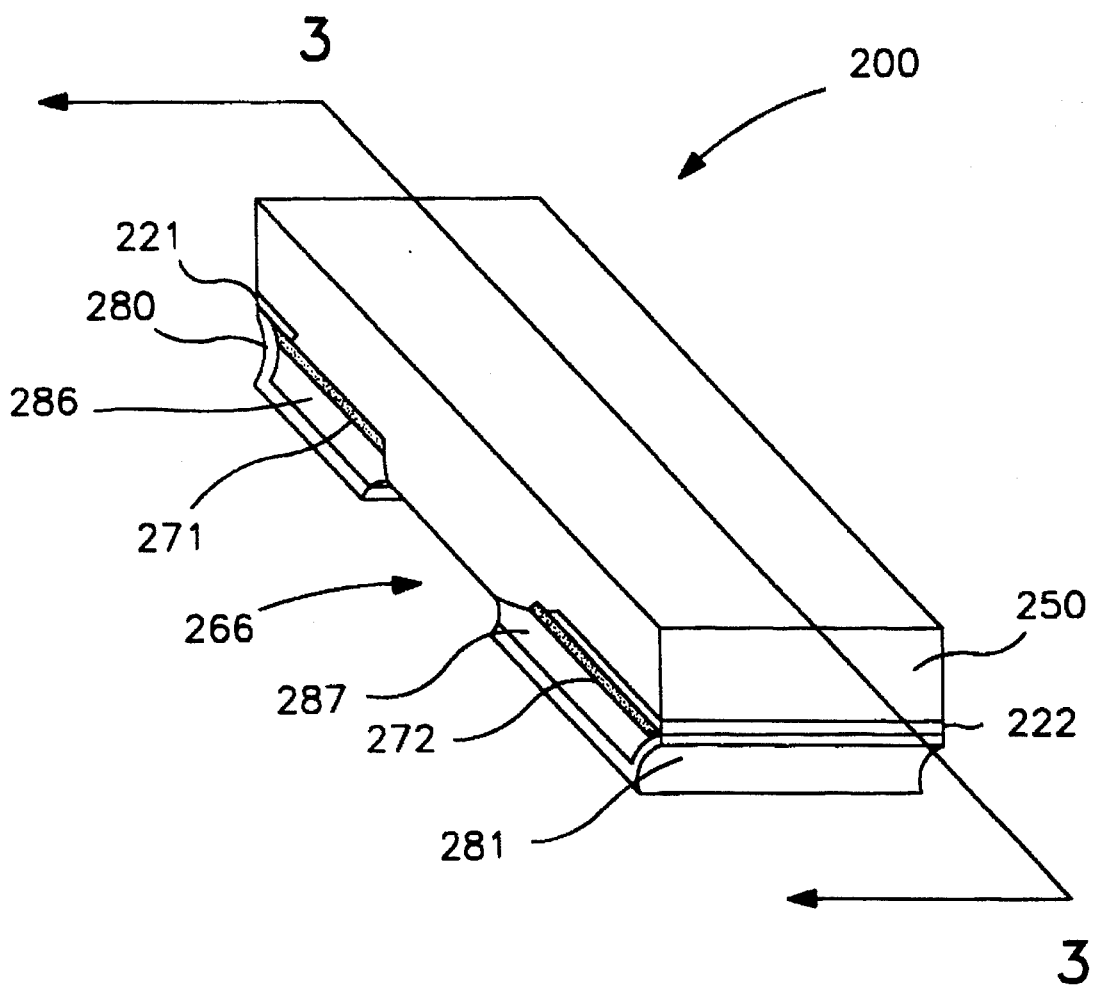
FIG. 2 illustrates a perspective view of a diode module.

FIG. 2 illustrates a perspective view of a diode module 200, which is one embodiment of the present invention. Diode module 200 may include one of a variety of elements or devices. Diode module 200 may include a PIN or NIP diode, for example. Diode module 200 may include a series element for use as a switch. Diode module 200 may include a Schottky-barrier diode. Diode module 200 may include a series shunt element. Diode module 200 is also referred to as an apparatus or as an electrical apparatus that includes one of a variety of elements or devices, such as those elements or devices described above. Diode module 200 is also referred to as a device.

For one embodiment, diode module 200 is a leadless monolithic device that is configured for surface mounting, for example, over a printed circuit board. As illustrated in FIG. 2, diode module 200 includes an overlying layer 250, a device semiconductor region 286, a first insulative layer 271, a first wrap-around flange interface contact region comprised of first interconnect layer 221 and first contact layer 280, a semiconductor post region 287, a second insulative layer 272, and a second wrap-around flange interface contact region comprised of second interconnect layer 222 and second contact layer 281.

Figure 3:
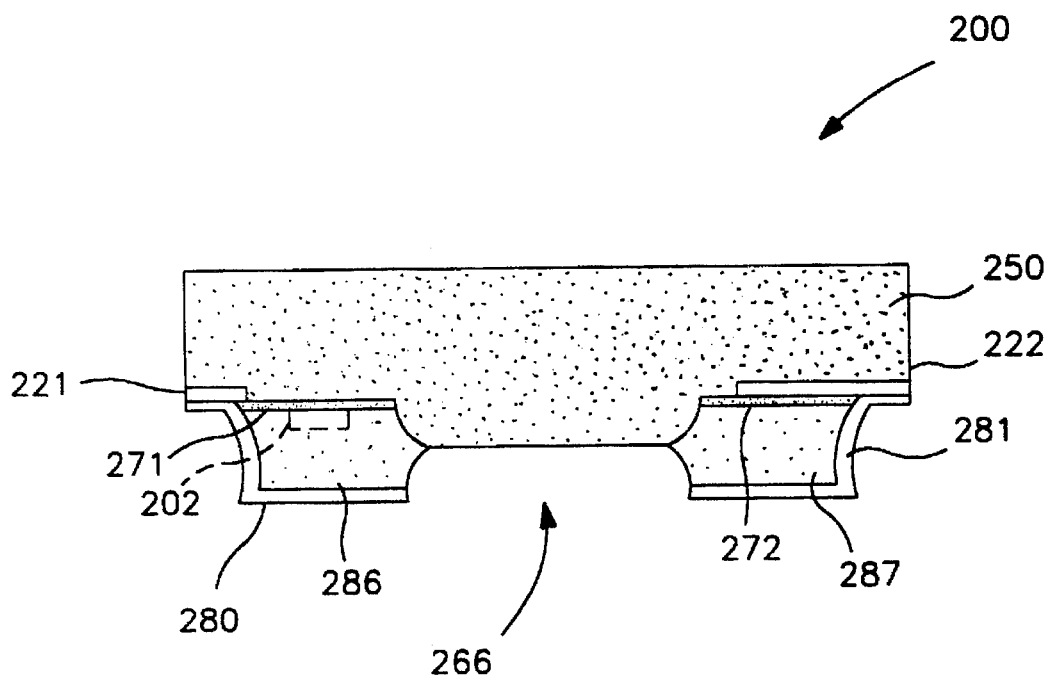
FIG. 3 illustrates a cross-sectional side view along line 3—3 of the diode module of FIG. 2.

FIG. 3 illustrates a cross-sectional side view of diode module 200 along line 3—3 of diode module 200 of FIG. 2. FIG. 3 illustrates overlying layer 250, device semiconductor region 286, first insulative layer 271, first interconnect layer 221, first contact layer 280, semiconductor post region 287, second insulative layer 272, second interconnect layer 222, and second contact layer 281.

Figure 4:
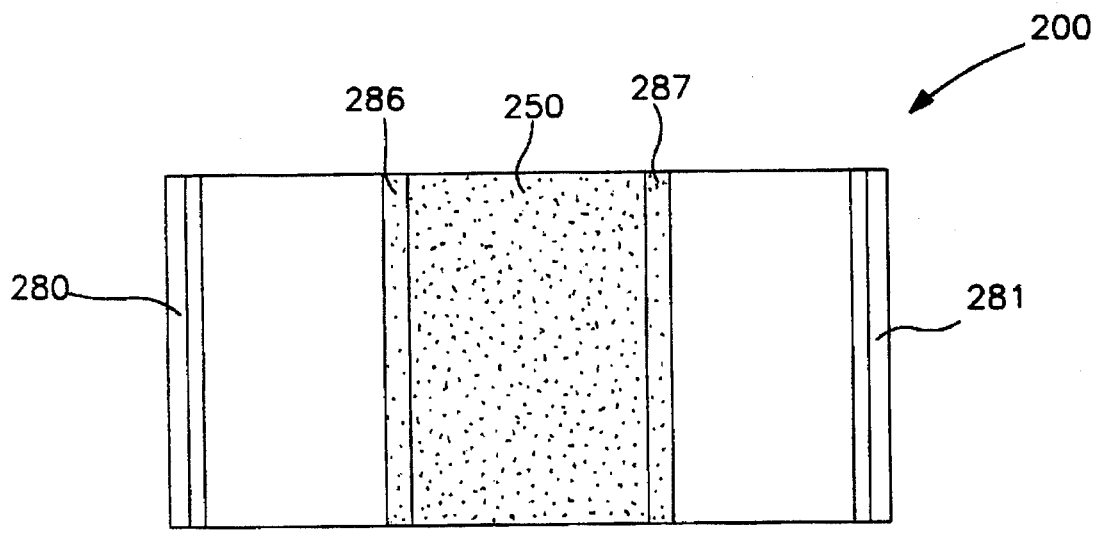
FIG. 4 illustrates a bottom view of the diode module of FIG. 2.

FIG. 4 illustrates a bottom view of diode module 200 of FIG. 2. FIG. 4 illustrates overlying layer 250, device semiconductor region 286, first contact layer 280, semiconductor post region 287, and second contact layer 281.

As seen in FIGS. 2–4, overlying layer 250 encapsulates the top sides of device semiconductor region 286, first insulative layer 271, first interconnect layer 221, semiconductor post region 287, second insulative layer 272, and second interconnect layer 222. Overlying layer 250 also separates device semiconductor region 286 and semiconductor post region 287. Overlying layer 250 may include any suitable insulative material. For example, overlying layer 250 may include epoxy, silicon dioxide ($SiO_2$), silicon nitride ($Si_3N_4$), plastic, Teflon, a polyimide, or a glass. Overlying layer 250 may include other dielectric or insulative materials, or combinations of materials as well. Overlying layer 250 may serve to protect diode module 200. Overlying layer 250 may serve as a passivation layer. Overlying layer 250 may also serve to mechanically hold diode module 200 together.

Overlying layer 250 may also include an optional cap layer containing, for example, silicon, polysilicon, amorphous silicon, plastic, glass, epoxy, alumina, or diamond. Other materials or combinations of materials may also be used for this cap layer. This optional cap layer may serve to make diode module 200 more rigid and rugged. This optional cap layer may also serve as a heat conduit for diode module 200.

Trench or gap 266 separates device semiconductor region 286 and semiconductor post region 287.

An active junction region 202 resides in device semiconductor region 286 of diode module 200 as illustrated in FIG. 3. Active junction region 202 is electrically coupled to second interconnect layer 222. Second interconnect layer 222 is electrically coupled to contact layer 281.

Interconnect layers 221–222 may be comprised of titanium-tungsten (Ti-W) and gold (Au) in one embodiment. Ti-W may provide for a diffusion barrier layer. Other diffusion barrier materials may also be used. Interconnect layers 221–222 may include other conductive materials as well. For example, aluminum (Al) or copper (Cu) may be used. Indium titanium oxide (ITO) or gold tin oxide (ATO) may also be used. Other metals or combinations of materials including metals may also be used.

The first wrap-around flange interface contact region includes first interconnect layer 221 and first contact layer 280. First contact layer 280 covers the underside of and extends over the sidewall of device semiconductor region 286. First interconnect layer 221 and first contact layer 280 are joined to form a flange interface.

The second wrap-around flange interface contact region includes second interconnect layer 222 and second contact layer 281. Second contact layer 281 covers the underside of and extends over the sidewall of semiconductor post region 287. Second interconnect layer 222 and second contact layer 281 are joined to form a flange interface.

First contact layer 280 and second contact layer 281 are the connection points for diode module 200 to external circuitry. First contact layer 280 and second contact layer 281 are both relatively flat on the underside of device semiconductor region 286 and semiconductor post region 287, respectively. First contact layer 280 and second contact layer 281 are also both relatively large. These features help to ensure good contact to external circuitry.

Contact layers 280–281 may be comprised of titanium-tungsten (Ti-W) and nickel (Ni) in one embodiment. Ni is preferable as Ni is well-suited for soldering. These Ni contact layers may be subsequently coated, for example, with a thin layer of gold (Au). Such a coating may serve to prevent the corrosion or oxidation of the Ni contact layers without destroying the soldering ability of Ni. For another embodiment, gold (Au) may be used in place of Ni. Contact layers 280–281 may include other conductive materials as well. For example, aluminum (Al) or copper (Cu) may be used. Indium titanium oxide (ITO) or gold tin oxide (ATO) may also be used. Other metals or combinations of materials including metals may also be used.

First interconnect layer 221 forms a flange interface with contact layer 280. Likewise, second interconnect layer 222 forms a flange interface with contact layer 281. In each case, the flange interface provides for a durable and reliable bond between the interconnect layer and the contact layer.

For one embodiment, titanium-tungsten (Ti-W) is used as the bonding interconnect layer and as the bonding contact layer for both contact regions. That is, Ti-W is formed at the bottom of interconnect layers 221–222 and at the top of contact layers 280–281. As a result, a reliable intermetallic surface-to-surface bond is formed between each interconnect layer 221–222 and each contact layer 280–281, respectively, for this embodiment. For other embodiments, another material in place of Ti-W may be used in creating a bond between interconnect layers 221–222 and contact layers 280–281, respectively. Using the same material here may facilitate the formation of a durable and reliable bond between interconnect layers 221–222 and contact layers 280–281, respectively. For still other embodiments, the materials used to bond interconnect layers 221–222 with contact layers 280–281, respectively, may be different.

Diode module 200 may be die-attached across standard beam circuit gaps using either solder or conductive epoxy. Diode module 200 can be configured to be a drop-in replacement for present beam lead devices. Alternatively, diode module 200 can be made smaller or larger to address a custom requirement. The design of diode module 200 allows the device to be made relatively small.

Figure 5:
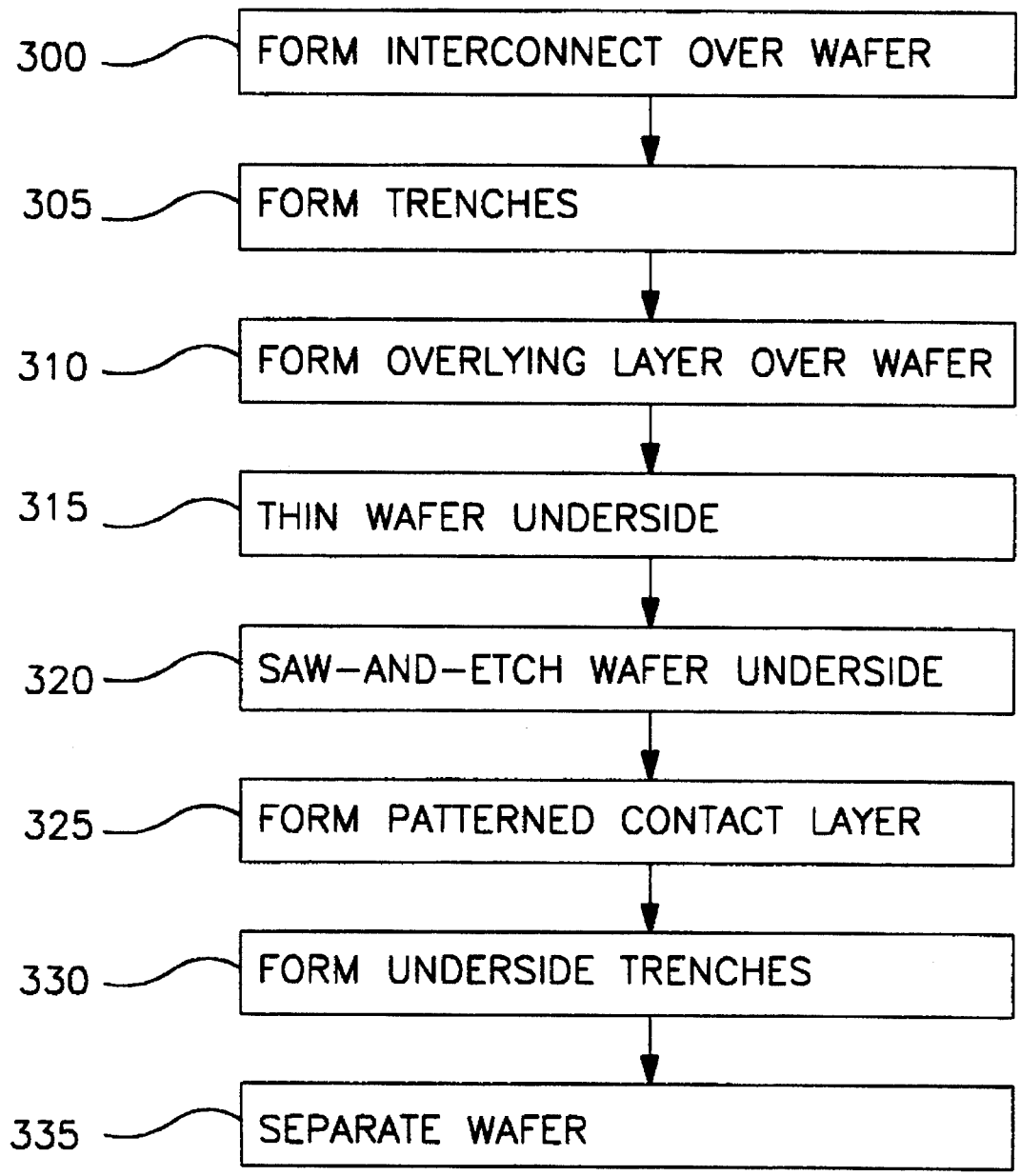
FIG. 5 illustrates, in flow diagram form, an exemplary semiconductor fabrication method used in fabricating the diode module of FIG. 2.

FIG. 5 illustrates, in flow diagram form, an exemplary method used in semiconductor fabrication. The method of FIG. 5 may be used to fabricate diode module 200 for example. To better explain the method of FIG. 5, FIGS. 6–33 will be used to illustrate the various steps of the method of FIG. 5.

FIG. 6 illustrates a top view of a semiconductor wafer used to fabricate diode module 200 of FIG. 2. FIG. 7 illustrates a cross-sectional side view of the wafer of FIG. 6.

A semiconductor substrate is provided to perform the method of FIG. 5. This substrate is illustrated, for example, in FIGS. 6–7 as substrate 400. Substrate 400 may be a silicon (Si) substrate, yet a variety of other types of semiconductor substrates may be used in practicing the present invention.

The wafer of FIGS. 6–7 includes substrate 400 in which active junction regions 401, 402, 403, and 404 have been formed to provide for four diode devices. This number of devices is exemplary and has been chosen to provide for a clearer understanding of the present invention. Any number of devices may be formed using the same wafer and may depend, for example, on the size of the wafer. Active junction regions 401–404 may be provided with appropriate ohmic contacts.

A patterned insulative layer including regions 411, 412, and 413 has been formed over the wafer. For one embodiment this insulative layer is formed by depositing silicon nitride ($Si_3N_4$). The insulative layer may also be formed from silicon dioxide ($SiO_2$) that has been either deposited or grown over the surface of substrate 400. The insulative layer may include other materials or combinations of materials as well. The insulative layer is then patterned using photolithography and etch techniques, for example, into regions 411–413.

As illustrated in FIGS. 6–7, the insulative layer is patterned to expose active junction regions 401–404 and to define trench regions 416 and 418 over the surface of substrate 400. Trench region 416 traverses over two diodes that will be created using active junction regions 401–402. Trench region 418 traverses over two diodes that will be created using active junction regions 403–404. Trench regions 416 and 418 run parallel to one another. Insulative region 411 has been patterned to expose active junction regions 401–402. Insulative regions 411–412 define trench region 416. Insulative region 412 has been patterned to expose active junction regions 403–404. Insulative regions 412–413 define trench region 418.

For an alternative embodiment, four contact regions or bonding pads may be formed over substrate 400 to provide for electrical connection to active junction regions 401–404. Insulative regions 411–412 may then be patterned to expose such contact regions or bonding pads as opposed to exposing active junction regions 401–404.

For yet another alternative embodiment, insulative regions 411–413 may be patterned to define scribe line regions 415, 417, and 419, exposing underlying substrate 400 in each region. Scribe line regions 415, 417, and 419 traverse the length of the wafer along the left side of the wafer, the center of the wafer, and the right side of the wafer, respectively, as illustrated in FIG. 6. The use of scribe line regions 415, 417, and 419 will be described in more detail below.

For step 300 of FIG. 5, interconnects 421, 422, and 423 are formed over the wafer. This is illustrated in FIGS. 8–9. FIG. 8 illustrates a top view of the wafer of FIG. 6 after interconnects 421–423 have been formed over the wafer. FIG. 9 illustrates a cross-sectional side view of the wafer of FIG. 8.

Interconnects 421–423 are also referred to as interconnect layers. Interconnect 421, as illustrated in FIGS. 8–9, may be a portion of an interconnect that is shaped like interconnects 422–423 and that extends over other diode devices to be formed from the wafer to the left of the diode devices illustrated in FIGS. 8–9. Interconnect 422 includes bridge portions 424–425. Interconnect 423 includes bridge portions 426–427.

Bridge portion 424 crosses over trench region 416 and provides for an electrical connection to active junction region 401. Bridge portion 424 includes gap 434 which overlies trench region 416. Bridge portion 425 crosses over trench region 416 and provides for an electrical connection to active junction region 402. Bridge portion 425 includes gap 435 which overlies trench region 416. Bridge portion 426 crosses over trench region 418 and provides for an electrical connection to active junction region 403. Bridge portion 426 includes gap 436 which overlies trench region 418. Bridge portion 427 crosses over trench region 418 and provides for an electrical connection to active junction region 404. Bridge portion 427 includes gap 437 which overlies trench region 418. For an alternative embodiment, bridge portions 424–427 do not contain gaps 434–437, respectively, but rather are solid bridges.

For one embodiment, interconnects 421–423 are formed by first forming a conductor layer over the wafer. For example, titanium-tungsten (Ti-W) may be sputter deposited over the wafer. This Ti-W layer may serve to provide for a diffusion barrier layer for interconnects 421–423. Other diffusion barrier materials may also be used. Gold (Au) is then sputter deposited over the Ti-W layer. This Au layer may serve to facilitate the pattern plating of gold, for example, in forming interconnects 421–423. A patterned mask layer, for example comprising photoresist, may then be formed over the wafer. This patterned mask layer is used in pattern plating gold (Au), for example approximately 10 μm in thickness, over the Ti-W-Au layers to create interconnects 421–423. After this pattern plating process, the patterned mask layer is removed. Portions of the Ti-W-Au layers which are exposed on the surface of the wafer may then be etched, leaving interconnects 421–423 as illustrated in FIGS. 8–9. Interconnects 421–423 as a result contain Ti-W and Au.

Interconnects 421–423 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, interconnects 421–423 may be formed using any suitable technique. As another example, a layer of the material or materials used to create interconnects 421–423 may be deposited over the wafer and subsequently patterned to create interconnects 421–423. Photolithography and etch techniques, for example, may be used here to pattern interconnects 421–423.

For an alternative embodiment, separate interconnects may be formed over the wafer. That is, a separate interconnect may be formed over the wafer for each diode device to be fabricated. Instead of forming interconnect 422 with two separate bridge portions 424–425, for example, two separate interconnects may be formed over the wafer each with bridge portions 424-425, respectively.

Figures 10, 11:
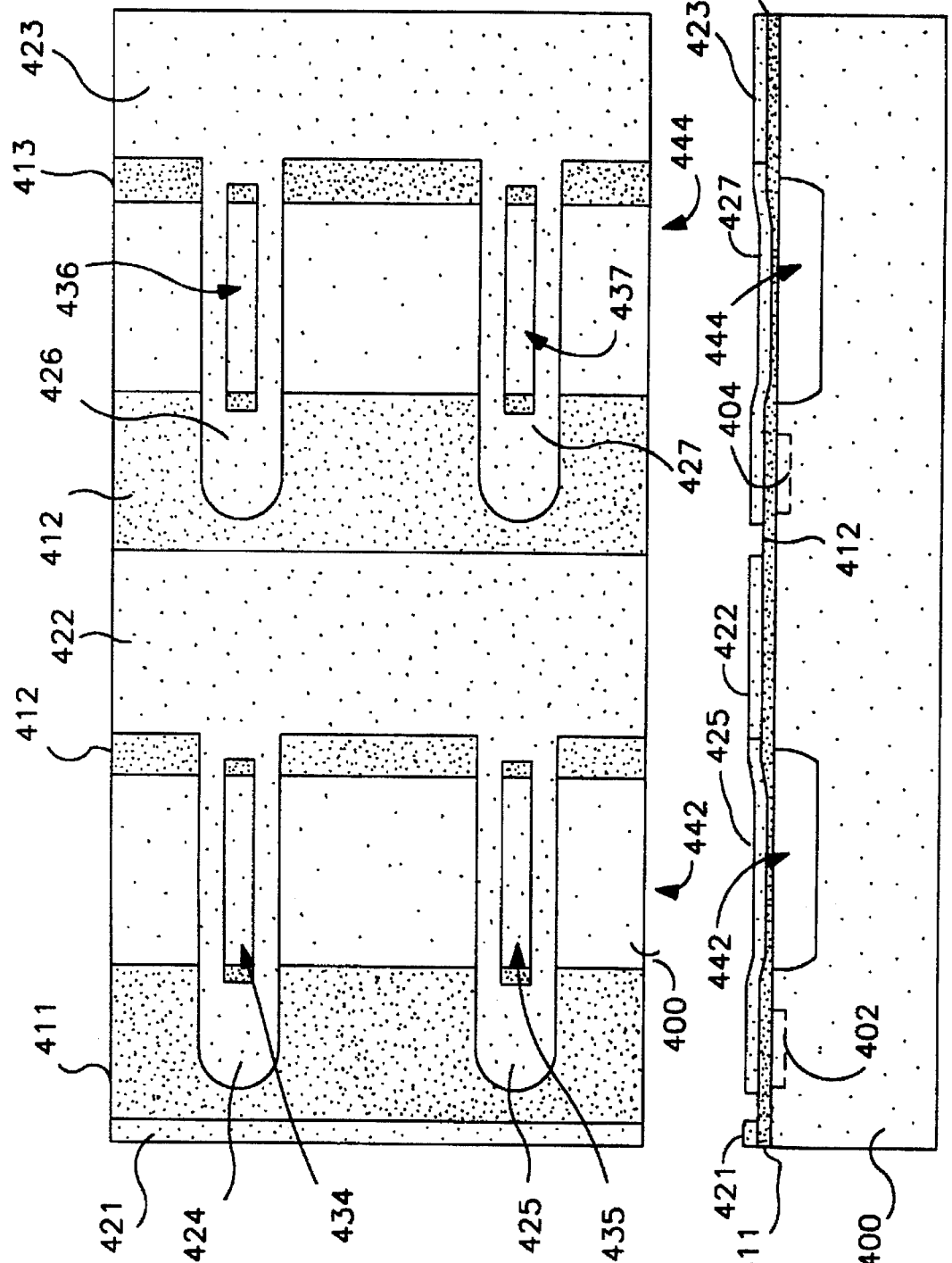
FIG. 10 illustrates a top view of the wafer of FIG. 8 after trenches have been formed from the substrate of the wafer.
FIG. 11 illustrates a cross-sectional side view of the wafer of FIG. 10.

For step 305 of FIG. 5, then, moats or trenches 442 and 444 are formed from respective trench regions 416 and 418 of substrate 400 as defined by insulative regions 411-413. This is illustrated in FIGS. 10-11. FIG. 10 illustrates a top view of the wafer of FIG. 8 after trenches 442 and 444 have been formed from substrate 400 of the wafer. FIG. 11 illustrates a cross-sectional side view of the wafer of FIG. 10.

In forming trenches 442 and 444, any suitable processing technique may be used. For example, any suitable etch technique and chemistry may be used. As insulative regions 411-413 may serve as a mask layer when etching trenches 442 and 444, the etch technique and chemistry is preferably selective to the material used for insulative regions 411-413. The etch technique and chemistry is also preferably selective to the material used for interconnects 421-423 as interconnects 421-423 are subjected to this etch process.

The material of substrate 400 in trench regions 416 and 418 which lies beneath bridge portions 424-427 is removed in forming trenches 442 and 444. Gaps 434-437 may serve to facilitate the removal of underlying substrate 400 in etching trenches 442 and 444 here by allowing the etchant to flow through bridge portions 424-427.

For an alternative embodiment, bridge portions 424-427 may be solid bridges without gaps 434-437 as discussed above. Bridge portions 424-427 may need to be thinner in width, though, for this alternative embodiment so as to ensure underlying substrate 400 is removed beneath bridge portions 424-427 in forming trenches 442 and 444.

The formation of trenches 442 and 444 will not cause a short between substrate 400 and interconnects 422 or 423. That is, insulative regions 411-413 protect interconnects 422-423 from contacting substrate 400 after forming trenches 442 and 444. This is illustrated in FIG. 11 where insulative regions 411-412 protect interconnect 422 from contacting substrate 400. Here, trench 442 has been partly formed by undercutting beneath an edge of insulative regions 411-412. Likewise, insulative regions 412-413 protect interconnect 423 from contacting substrate 400. Here, trench 444 has also been partly formed by undercutting beneath an edge of insulative regions 412-413.

For an alternative embodiment, a separate patterned mask layer may be formed over the wafer, that is over interconnects 422-423, to define trench regions 416 and 418. Trenches 442 and 444 may then be etched with a suitable etch technique and chemistry using this patterned mask layer.

Trenches 442 and 444 essentially provide for a top-side separation of semiconductor for each diode module to be created from the wafer, providing for a device semiconductor region and a semiconductor post region for each diode module. This separation of semiconductor for each diode module will be described in more detail below.

For step 310 of FIG. 5, overlying layer 450 is formed over the wafer as illustrated in FIGS. 12-13. FIG. 12 illustrates a top view of the wafer of FIG. 10 after overlying layer 450 has been formed over the wafer. FIG. 13 illustrates a cross-sectional side view of the wafer of FIG. 12.

Overlying layer 450 substantially encapsulates the entire surface of the wafer and substantially fills trenches 442 and 444. For one embodiment overlying layer 450 includes epoxy that has been centrifuged over the wafer. A controlled vacuum environment may also be used to spin-on epoxy here. For alternative embodiments, overlying layer 450 may include silicon dioxide ($SiO_2$), silicon nitride ($Si_3N_4$), plastic, Teflon, a polyimide, or a glass. Overlying layer 450 may be formed using other dielectric or insulative materials or combinations of materials, and may be formed using any suitable technique.

Overlying layer 450 may serve to protect each diode device created from the wafer. Overlying layer 450 may serve as a passivation layer. Overlying layer 450 may also serve to mechanically hold together each diode device created from the wafer.

Overlying layer 450 may also include an optional cap layer containing, for example, silicon, polysilicon, amorphous silicon, plastic, glass, epoxy, alumina, or diamond. Other materials or combinations of materials may also be used. This optional cap layer may serve to make each diode device created from the wafer more rigid and rugged. This optional cap layer may also serve as a heat conduit for each diode device fabricated from the wafer.

Figure 14:
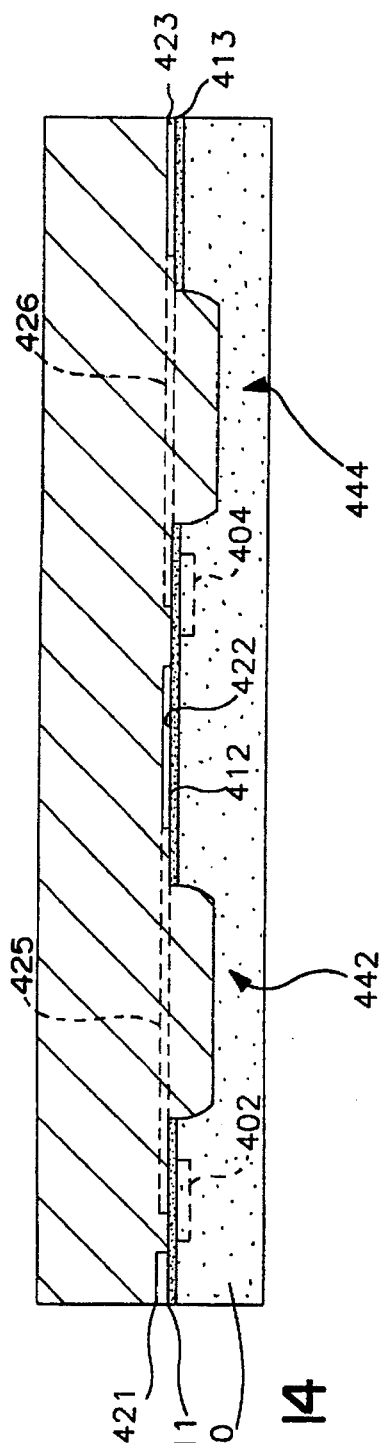
FIG. 14 illustrates a cross-sectional side view of the wafer of FIG. 13 after the underside of the wafer has been thinned.
Figure 15:
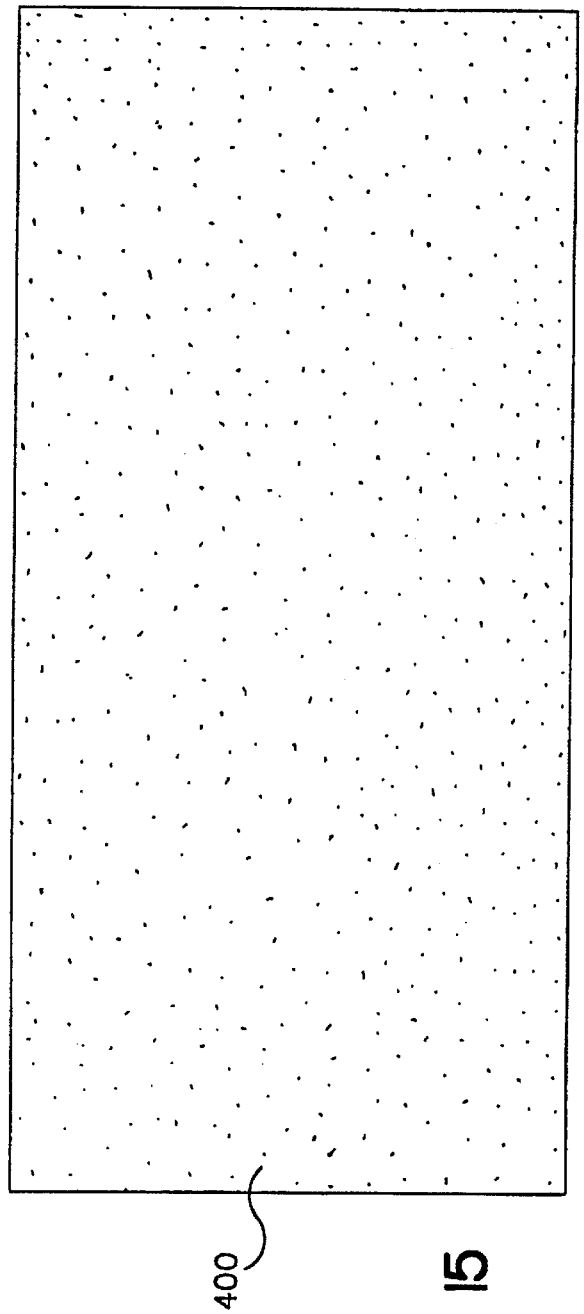
FIG. 15 illustrates an underside view of the wafer of FIG. 14.

For step 315 of FIG. 5, the backside or underside of the wafer is thinned as illustrated in FIG. 14 as compared to the wafer illustrated in FIG. 13. FIG. 14 illustrates a cross-sectional side view of the wafer of FIG. 12 after the underside of the wafer has been thinned. FIG. 15 illustrates an underside view of the wafer of FIG. 14.

The underside of substrate 400 may be thinned here using any suitable technique. For example, the underside of substrate 400 may be sandblasted. The underside of substrate 400 may also be etched using a suitable etch technique and chemistry or, alternatively, may be thinned by grinding it. The underside of substrate 400 may also be thinned by lapping. The bottom of substrate 400 beneath active junction regions 401-404 may be provided with appropriate ohmic contacts.

Figure 16:
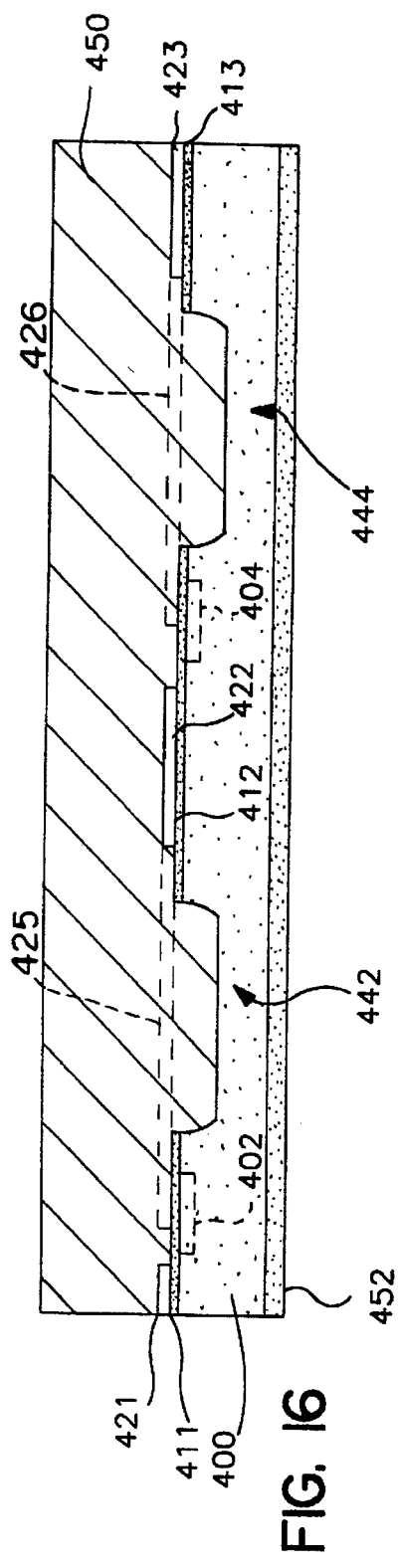
FIG. 16 illustrates a cross-sectional side view of the wafer of FIG. 14 after a mask layer has been formed over the underside of the wafer.
Figure 17:
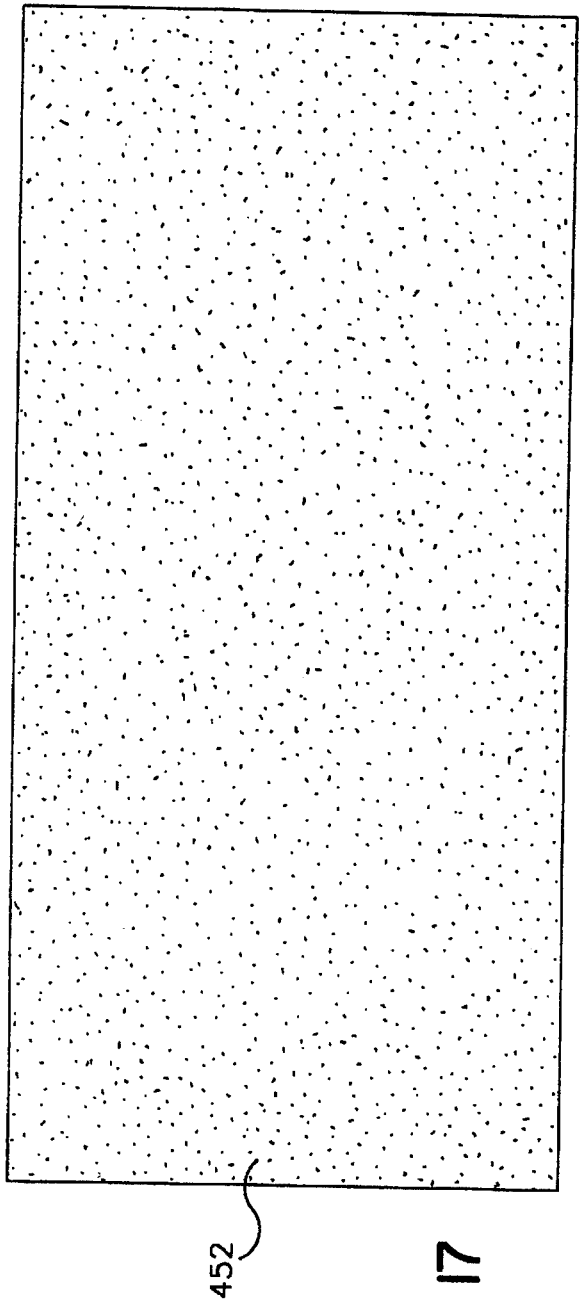
FIG. 17 illustrates an underside view of the wafer of FIG. 16.

For step 320 of FIG. 5, then, a saw-and-etch process is used to pattern the underside of the wafer. One embodiment of this step is illustrated in FIGS. 16-23. Here, a mask layer 452 is first formed over the underside of the wafer. This is illustrated in FIGS. 16-17. FIG. 16 illustrates a cross-sectional side view of the wafer of FIG. 14 after mask layer 452 has been formed over the underside of the wafer. FIG. 17 illustrates an underside view of the wafer of FIG. 16.

Mask layer 452 may comprise photoresist, for example, that has been spun-on. Other suitable mask materials, including other photosensitive materials, may also be used here and may be formed over the underside of the wafer using any suitable technique.

The underside of the wafer is then sawed along scribe line regions 415, 417, and 419 to create pits 455, 457, and 459 and to pattern mask layer 452 into mask regions 453-454. This is illustrated in FIGS. 18-19. FIG. 18 illustrates a cross-sectional side view of the wafer of FIG. 16 after the underside of the wafer has been sawed. FIG. 19 illustrates an underside view of the wafer of FIG. 18.

Scribe line regions 415, 417, and 419, as illustrated in FIG. 6, define where the wafer will be separated. For one embodiment, the underside of the wafer may be sawed in scribe line regions 415, 417, and 419 to create pits 455, 457, and 459, thus defining mask regions 453-454 from mask layer 452. For another embodiment, mask layer 452 may be first patterned using photolithography techniques, for example, to define scribe line regions 415, 417, and 419 with mask regions 453 and 454. These defined scribe line regions may then be used as a guide in sawing pits 455, 457, and 459.

The wafer is not entirely separated here in sawing the underside of the wafer to create pits 455, 457, and 459, as illustrated in FIGS. 18–19. Each pit 455, 457, and 459 is approximately 2–3 mils in width. Pits 455, 457, and 459 may also have other widths.

After creating pits 455, 457, and 459, substrate 400 is etched from the underside of the wafer in scribe line regions 415, 417, and 419 as defined by mask regions 453–454 to create trenches 465, 467, and 469. This is illustrated in FIGS. 20–21. FIG. 20 illustrates a cross-sectional side view of the wafer of FIG. 18 after the underside of the substrate of the wafer has been etched. FIG. 21 illustrates an underside view of the wafer of FIG. 20.

Any suitable etch technique and chemistry may be used here to create trenches 465, 467, and 469. Trenches 465, 467, and 469 serve to separate substrate 400. As illustrated in FIG. 20, trench 467 serves to separate substrate 400 into substrate regions 475–476.

The material from insulative regions 411–413 in scribe line regions 415, 417, and 419 is also etched here to expose portions of interconnects 421–423 in trenches 465, 467, and 469, respectively. As illustrated in FIG. 20, insulative region 411 is etched into insulative region 471, insulative region 412 is etched into separate insulative regions 472–473. Insulative region 413 is etched into insulative region 474. A single etch process may be used here to etch both the material of substrate 400 and the portions of insulative regions 411–413 exposed in trenches 465, 467, and 469, respectively. Separate etch processes may alternatively be used to remove the material of substrate 400 and the material used for insulative regions 411–413.

Insulative regions 411–413 may be initially patterned, as described above, to expose underlying substrate 400 in scribe line regions 415, 417, and 419. For this embodiment, only the material of substrate 400 would need to be removed to expose interconnects 421–423 in forming trenches 465, 467, and 469.

For an alternative embodiment, pits 455, 457, and 459 are not created at all. Rather, trenches 465, 467, and 469 are created by etching substrate 400 in scribe line regions 415, 417, and 419 as defined by mask regions 453–454. For this embodiment, mask layer 452 may be first patterned using photolithography techniques, for example, to define scribe line regions 415, 417, and 419 with mask regions 453–454. Any suitable etch technique and chemistry may then be used here to create trenches 465, 467, and 469.

Figure 22:
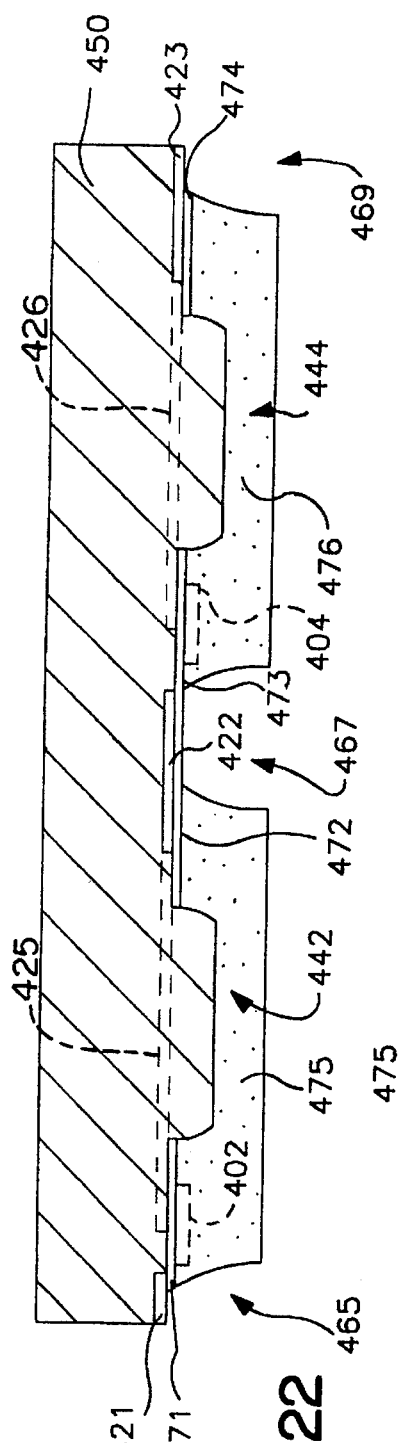
FIG. 22 illustrates a cross-sectional side view of the wafer of FIG. 20 after the underside mask layer has been removed.
Figure 23:
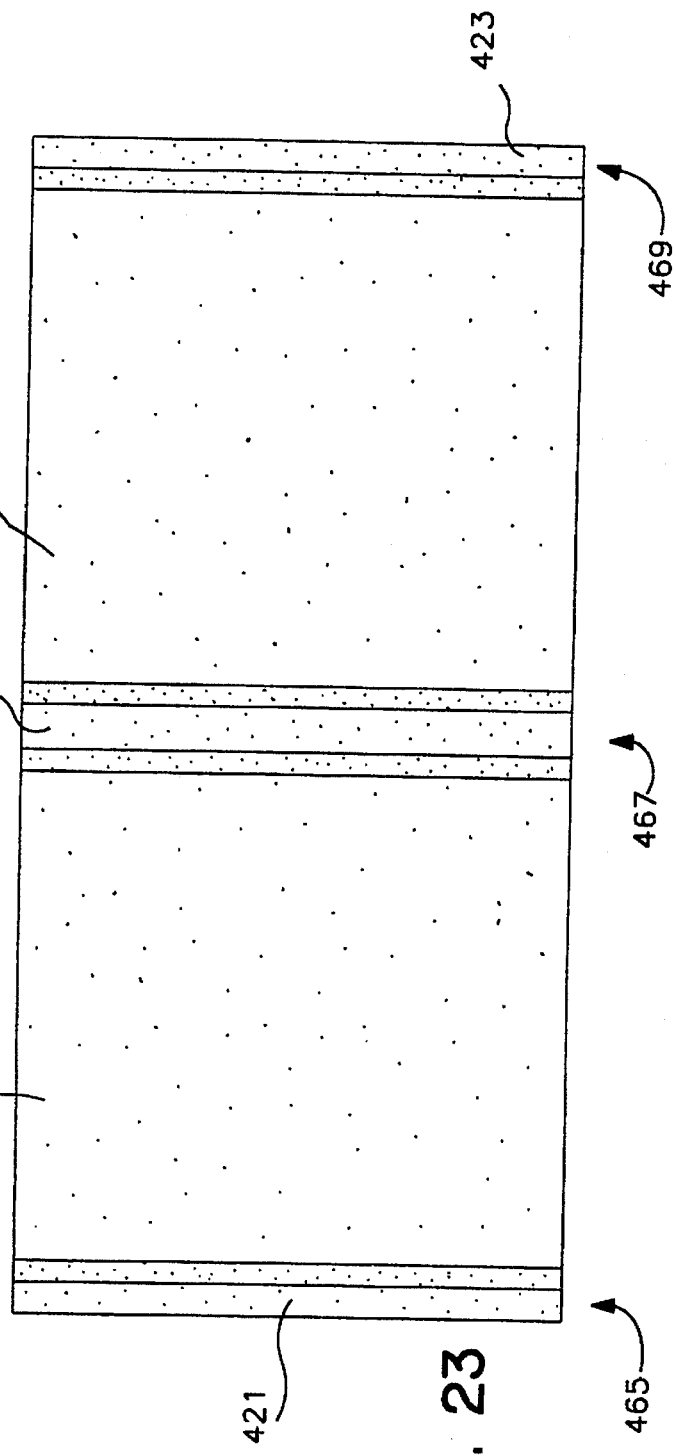
FIG. 23 illustrates an underside view of the wafer of FIG. 22.

After trenches 465, 467, and 469 have been formed, mask regions 453–454 are removed from the underside of the wafer as illustrated in FIGS. 22–23. FIG. 22 illustrates a cross-sectional side view of the wafer of FIG. 20 after underside mask regions 453–454 have been removed. FIG. 23 illustrates an underside view of the wafer of FIG. 22. Any suitable technique may be used here to remove mask regions 453–454.

Figure 24:
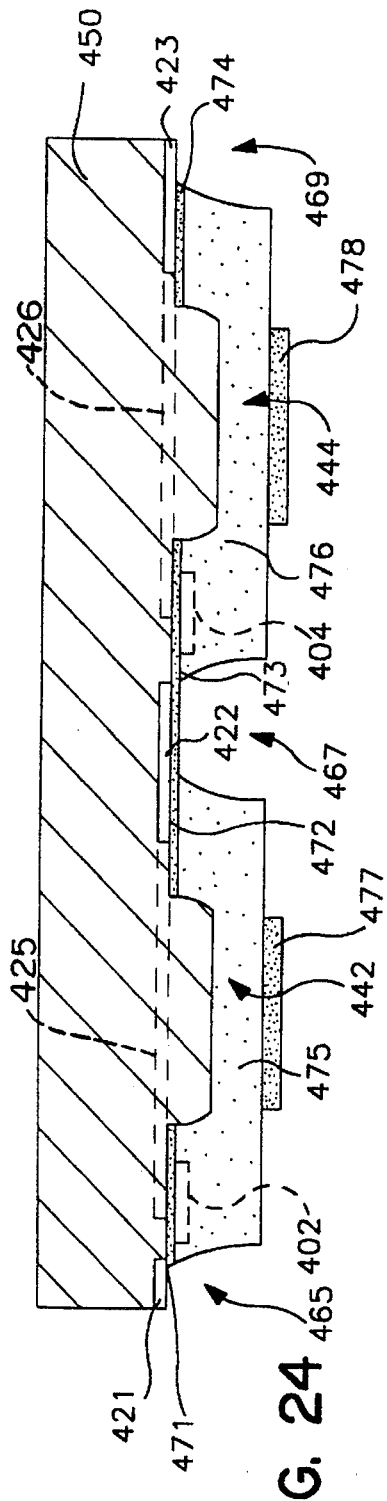
FIG. 24 illustrates a cross-sectional side view of the wafer of FIG. 22 after a conductor layer has been formed over the underside of the wafer and after a mask layer has been formed over the underside of the wafer.
Figure 25:
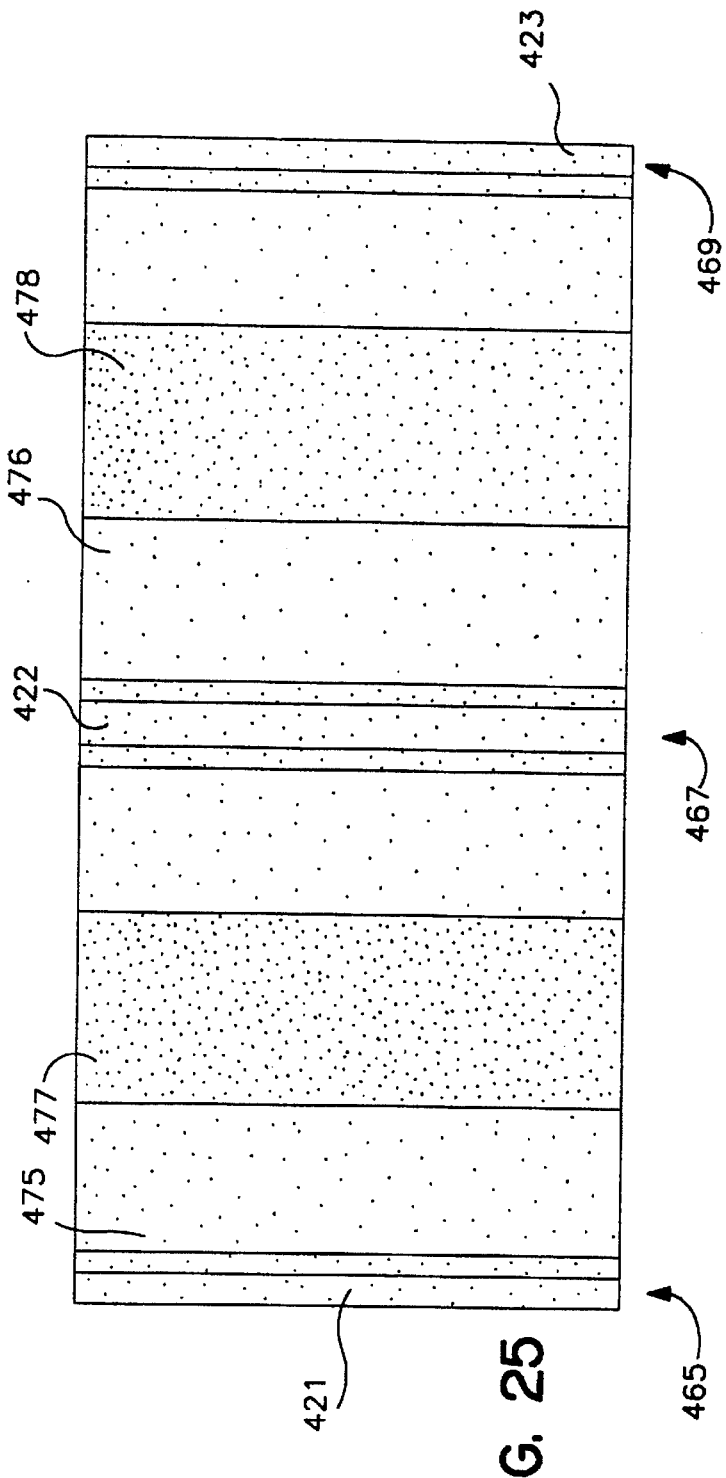
FIG. 25 illustrates an underside view of the wafer of FIG. 24.

For step 325 of FIG. 5, a patterned contact layer is formed over the underside of the wafer. One embodiment of this step is illustrated in FIGS. 24–29. FIG. 24 illustrates a cross-sectional side view of the wafer of FIG. 22 after a conductor layer has been formed over the underside of the wafer and after mask regions 477–478 have been formed over the underside of the wafer. FIG. 25 illustrates an underside view of the wafer of FIG. 24.

For this embodiment, the patterned contact layer is formed by first forming a conductor layer (not shown) over the wafer. For example, titanium-tungsten (Ti-W) may be sputter deposited over the wafer. This Ti-W layer may serve to provide for a diffusion barrier layer for the patterned contact layer. Gold (Au) may then be sputter deposited over the Ti-W layer. This Au layer may serve to facilitate the pattern plating of gold (Au) or nickel (Ni), for example, in forming the patterned contact layer. Alternatively, any suitable material or combination of materials may also be used in place of these Ti-W and/or Au layers. For example, nickel (Ni) may be used in place of Au here to facilitate the pattern plating of Ni, for example, in forming the patterned contact layer. Furthermore, any suitable technique may be used to form the conductor layer here.

A patterned mask layer having mask regions 477–478 is then formed over the underside of the wafer, as illustrated in FIGS. 24–25. Mask regions 477–478 are used in pattern plating contact material over the conductor layer to create the patterned contact layer. Mask regions 477–478 may include any suitable material and may be formed using any suitable technique. Photoresist, for example, may be spun-on over the underside of the wafer and subsequently patterned using photolithography techniques, for example, to form mask regions 477–478.

A suitable contact material may then be pattern plated over the underside of the wafer as illustrated in FIGS. 26–27. FIG. 26 illustrates a cross-sectional side view of the wafer of FIG. 24 after contact regions 480–482 have been formed over the underside of the wafer. FIG. 27 illustrates an underside view of the wafer of FIG. 26. Mask regions 477–478 serve to prevent contact material from forming over the underside of the wafer during pattern plating. For one embodiment nickel (Ni) is pattern plated over the underside of the wafer to form contact regions 480–482. Ni contact regions are preferable as Ni is well-suited for soldering. These Ni contact regions may be subsequently coated, for example, with a thin layer of gold (Au). Such a coating may serve to prevent the corrosion or oxidation of the Ni contact regions without destroying the soldering ability of Ni. For another embodiment, gold (Au) may be pattern plated over the underside of the wafer to form contact regions 480–482.

The contact material conforms to the contour of the underside of the wafer. Particularly, contact regions 480–482 are formed along the sides and bottom of underside trenches 465, 467, and 469, respectively, as illustrated in FIGS. 26–27. For one embodiment, portions of contact regions 480–482 form a durable and reliable surface-to-surface bond with the portions of interconnects 421–423, respectively, which are exposed in trenches 465, 467, and 469, respectively, when the contact material is formed over the underside of the wafer. Here, the material used for interconnects 421–423 that is exposed in trenches 465, 467, and 469 is preferably the same as the material used for contact regions 480–482 that is to come in contact with interconnects 421–423.

For one embodiment, titanium-tungsten (Ti-W) is used as the first interconnect layer and as the first contact region layer. As a result, a durable and reliable intermetallic surface-to-surface bond is formed for this embodiment. For other embodiments, another material in place of Ti-W may be used in creating a bond between interconnects 421–423 and contact regions 480–482. Using the same material here may facilitate the formation of a durable and reliable bond between interconnects 421–423 and contact regions 480–482 in trenches 465, 467, and 469, respectively. For still other embodiments, the materials used to bond interconnects 421–423 with contact regions 480–482 may be different.

After the contact material has been formed over the underside of the wafer, mask regions 477–478 are removed as illustrated in FIGS. 28–29. FIG. 28 illustrates a cross-sectional side view of the wafer of FIG. 26 after underside mask regions 477–478 have been removed. FIG. 29 illustrates an underside view of the wafer of FIG. 28.

Any suitable technique may be used here to remove mask regions 477–478. For the embodiment described above, portions of the conductor layer which are exposed on the underside of the wafer may then be removed, leaving contact regions 480–482 as illustrated in FIGS. 28–29. Any suitable etch technique and chemistry, for example, may be used to remove the exposed portions of the conductor layer.

Contact regions 480–482 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, contact regions 480–482 may be formed using any suitable technique. For example, a layer of the material or materials used to create contact regions 480–482 may be deposited over the wafer and subsequently patterned to create contact regions 480–482. Photolithography and etch techniques, for example, may be used here to pattern contact regions 480–482.

For step 330 of FIG. 5, underside trenches 466 and 468 are formed over the underside of the wafer. This is illustrated in FIGS. 30–31. FIG. 30 illustrates a cross-sectional side view of the wafer of FIG. 28 after the underside of the substrate of the wafer has been etched. FIG. 31 illustrates an underside view of the wafer of FIG. 30.

Any suitable etch technique may be used here to form underside trenches 466 and 468. Contact regions 480–482 may be used as a mask layer in etching trenches 466 and 468.

Trenches 466 and 468 expose overlying layer 450, as illustrated in FIGS. 30–31. Trenches 466 and 468 accordingly provide for a bottom-side separation of semiconductor for each diode module to be created from the wafer. In conjunction with the top-side separation of semiconductor by trenches 442 and 444, then, a complete separation of a device semiconductor region and a semiconductor post region is provided for each diode module to be formed from the wafer. Trenches 442 and 466 together separate substrate region 475 into device semiconductor region 486 and semiconductor post region 487. Trenches 444 and 468 together separate substrate region 476 into device semiconductor region 488 and semiconductor post region 489.

For an alternative embodiment, only underside trenches 466 and 468 are used to provide for the semiconductor separation described above. That is, trenches 442 and 444 are not formed at all. Rather only trenches 466 and 468 are formed by removing the substrate material through the entire thickness of the substrate, exposing overlying layer 450. For this alternative embodiment, however, bridge portions of interconnects 422–423 may be exposed at the underside of the wafer. A material resistive to corrosion is preferably used in forming interconnects 421–423 for this embodiment, then, as overlying layer 450 may not fully encapsulate interconnects 421–423 to protect them.

Figure 32:
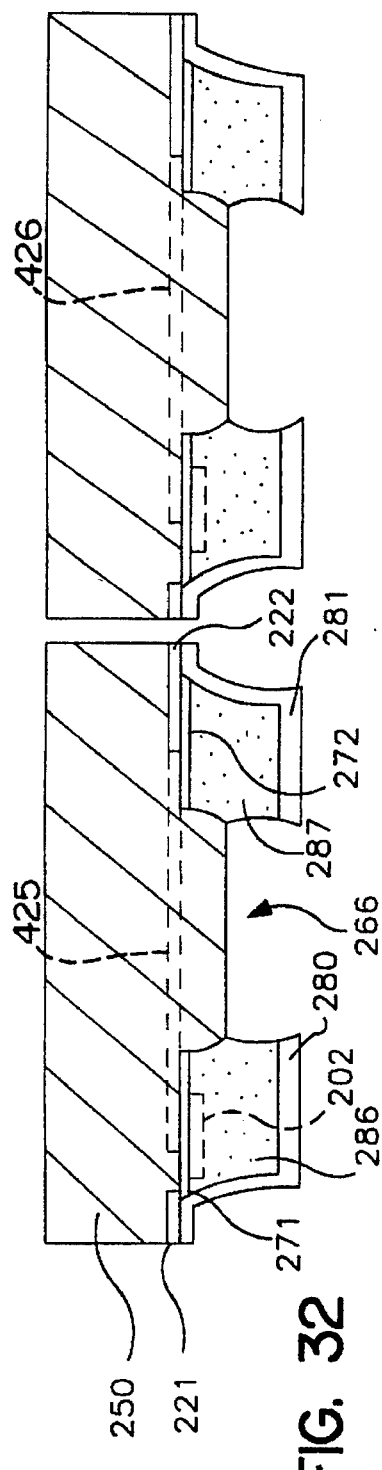
FIG. 32 illustrates a cross-sectional side view of the wafer of FIG. 30 after the wafer has been separated into diode modules.
Figure 33:
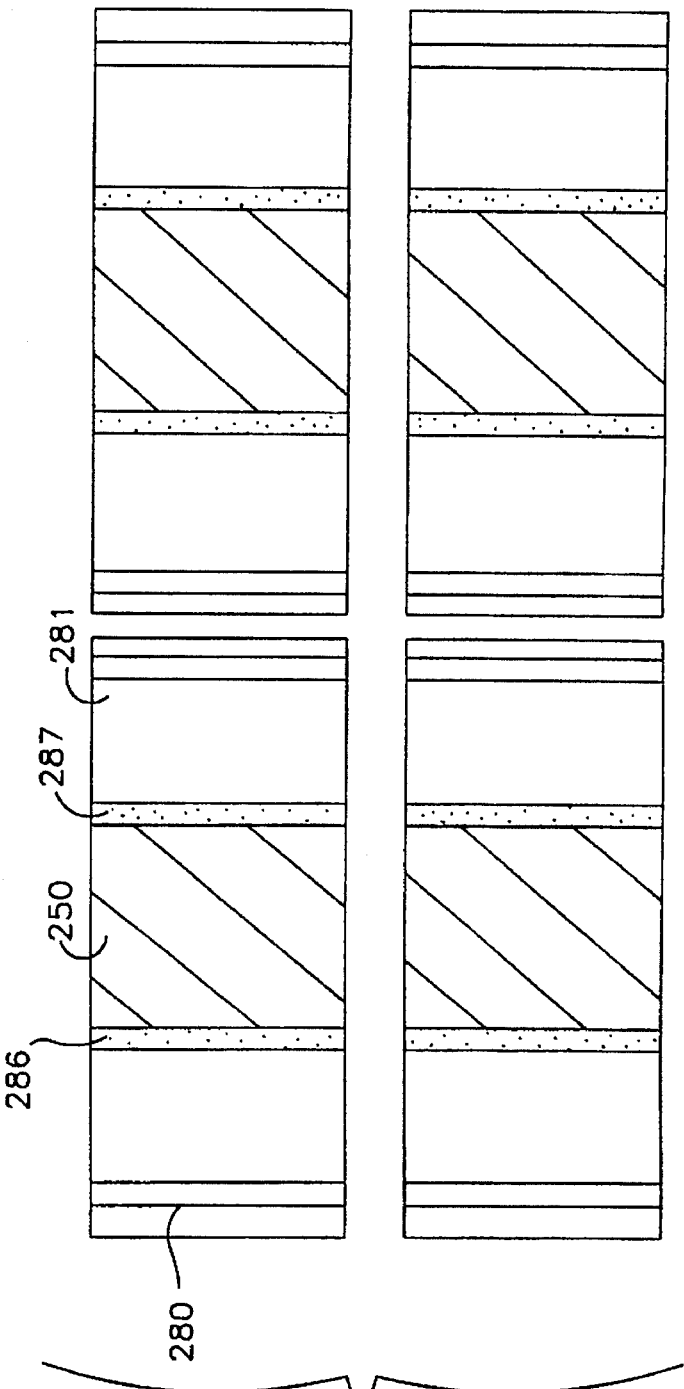
FIG. 33 illustrates an underside view of the wafer of FIG. 32.

For step 335 of FIG. 5, the wafer is separated into diode modules, as illustrated in FIGS. 32–33. FIG. 32 illustrates a cross-sectional side view of the wafer of FIG. 30 after the wafer has been separated into diode modules 200. FIG. 33 illustrates an underside view of the wafer of FIG. 32.

The wafer may be separated, for example, by sawing the wafer. The sawcut may be approximately one (1) mil in width. The sawcut may have other widths as well. Other techniques may also be used to separate the wafer and include, for example, using a laser scribe.

The wafer is separated through, for example, trench 467. Interconnects 421–423 which have been bonded with contact regions 480–482 form wrap-around flange interface contact regions as illustrated in FIGS. 32–33. Interconnect 422 and bonded contact region 481 are both separated in separating the wafer and create a wrap-around flange interface contact region for separate diode modules fabricated from the wafer. The reference numerals used in FIGS. 32–33 correspond to those used for FIGS. 2–4 above.

TRANSISTOR

Figure 34:
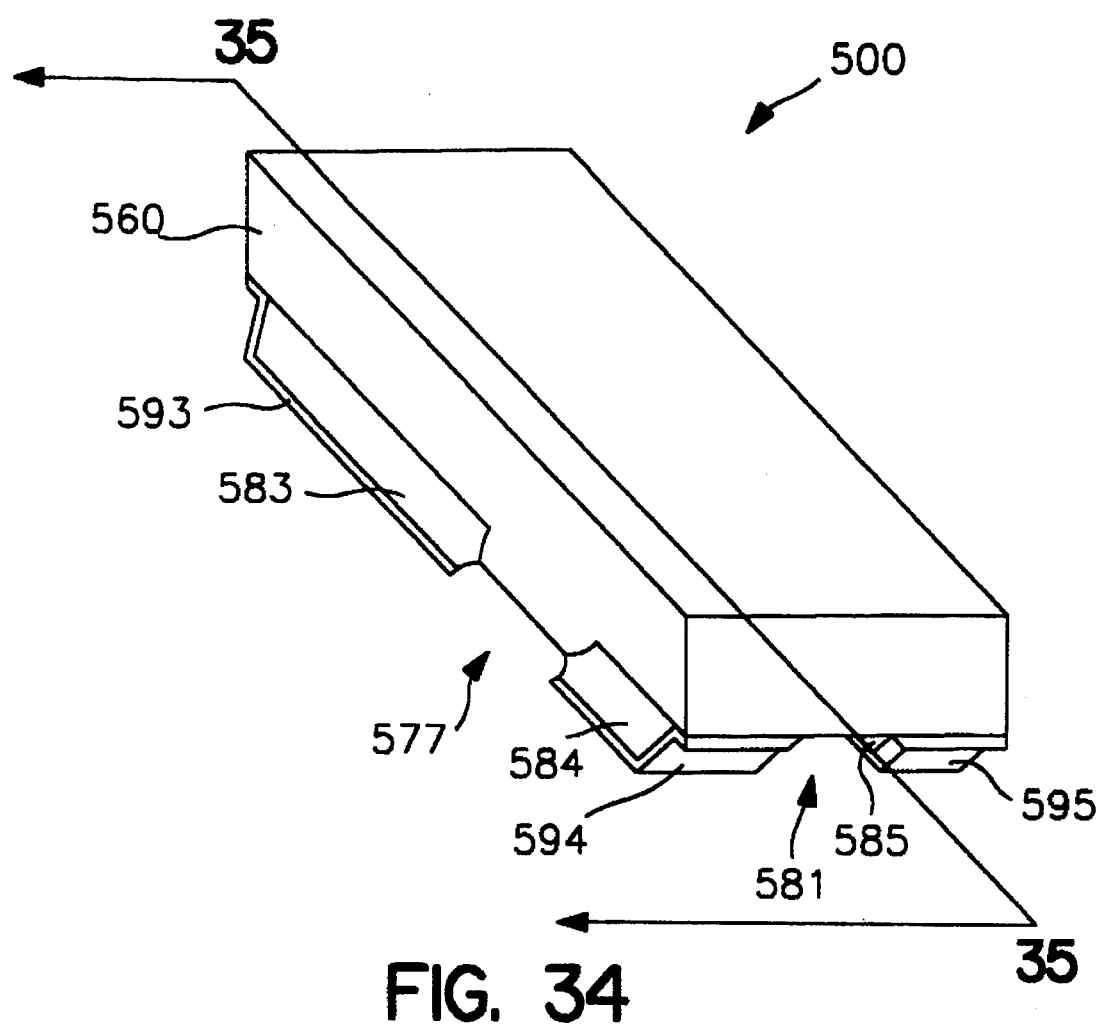
FIG. 34 illustrates a perspective view of a transistor module.

FIG. 34 illustrates a perspective view of a transistor module 500, which is one embodiment of the present invention. Transistor module 500 is also referred to as an apparatus or as an electrical apparatus. Transistor module 500 is also referred to as a device.

For one embodiment, transistor module 500 is a leadless monolithic device that is configured for surface mounting, for example, over a printed circuit board. As illustrated in FIG. 34, transistor module 500 includes an overlying layer 560, a device semiconductor region 583, base and emitter semiconductor post regions 584–585, a first contact region including collector contact layer 593, a second wrap-around flange interface contact region including emitter or base contact layer 594, and a third wrap-around flange interface contact region including base or emitter contact layer 595.

Figure 35:
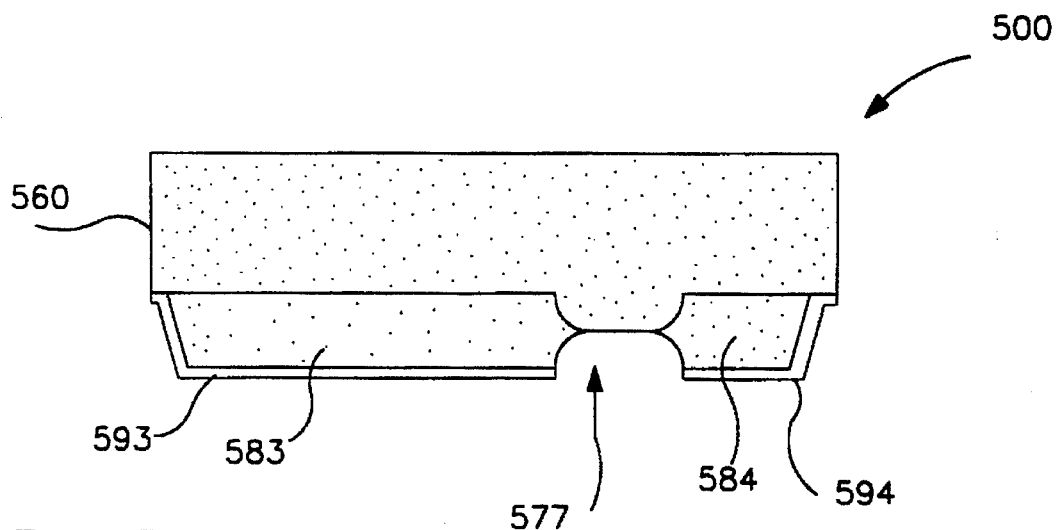
FIG. 35 illustrates a cross-sectional side view along line 35—35 of the transistor module of FIG. 34.

FIG. 35 illustrates a cross-sectional side view of transistor module 500 along line 35—35 of transistor module 500 of FIG. 34. FIG. 35 illustrates overlying layer 560, device semiconductor region 583, semiconductor post region 584, collector contact layer 593, and contact layer 594.

Figure 36:
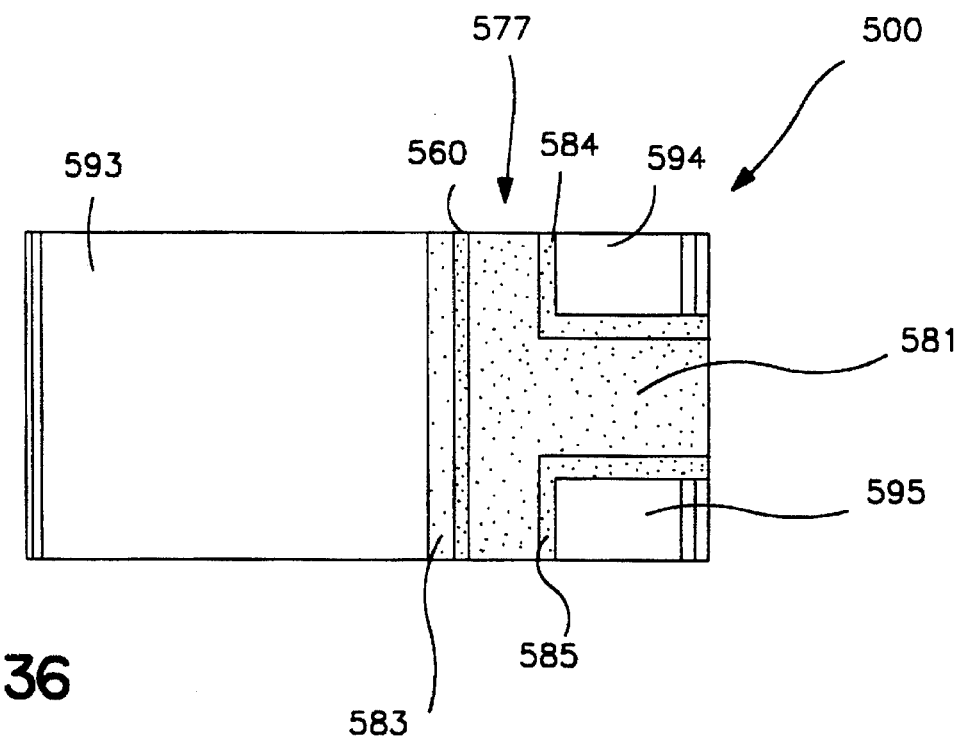
FIG. 36 illustrates a bottom view of the transistor module of FIG. 34.

FIG. 36 illustrates a bottom view of transistor module 500 of in FIG. 34. FIG. 36 illustrates overlying layer 560, collector contact layer 593, device semiconductor region 583, base and emitter semiconductor post regions 584–585, and base and emitter contact layers 594–595.

As seen in FIGS. 34–36, overlying layer 560 encapsulates the top sides of device semiconductor region 583 and base and emitter semiconductor post regions 584–585. Overlying layer 560 also separates device semiconductor region 583 and semiconductor post regions 584–585 from one another. Overlying layer 560 may include any suitable insulative material. For example, overlying layer 560 may include epoxy, silicon dioxide ($SiO_2$), silicon nitride ($Si_3N_4$), plastic, Teflon, a polyimide, or a glass. Overlying layer 560 may include other dielectric or insulative materials, or combinations of materials as well. Overlying layer 560 may serve to protect transistor module 500. Overlying layer 560 may serve as a passivation layer. Overlying layer 560 may also serve to mechanically hold transistor module 500 together.

Overlying layer 560 may also include an optional cap layer containing, for example, silicon, polysilicon, amorphous silicon, plastic, glass, epoxy, alumina, or diamond. Other materials or combinations of materials may also be used for this cap layer. This optional cap layer may serve to make transistor module 500 more rigid and rugged. This optional cap layer may also serve as a heat conduit for transistor module 500.

Trench or gap 577 separates device semiconductor region 583 from both base and emitter semiconductor post regions 584–585. Trench or gap 581 separates base and emitter semiconductor post regions 584–585.

A device resides in device semiconductor region 583 of transistor module 500. This device has a base region and an emitter region. The base region is electrically coupled to a base interconnect layer in transistor module 500. This base interconnect layer is electrically coupled to contact layer 594 or 595. The emitter region is electrically coupled to an emitter interconnect layer in transistor module 500. This emitter interconnect layer is electrically coupled to contact layer 594 or 595. When semiconductor post region 584 and contact layer 594 are used for the base region, semiconductor post region 585 and contact layer 595 are used for the emitter region. Alternatively, where semiconductor post region 585 and contact layer 595 are used for the base region, semiconductor post region 584 and contact layer 594 are used for the emitter region.

The base and emitter interconnect layers may be comprised of titanium-tungsten (Ti-W) and gold (Au) in one embodiment. Ti-W may provide for a diffusion barrier layer. Other diffusion barrier materials may also be used here. The interconnect layers may include other conductive materials as well. For example, aluminum (Al) or copper (Cu) may be used. Indium titanium oxide (ITO) or gold tin oxide (ATO) may also be used. Other metals or combinations of materials including metals may also be used.

The first contact region covers the underside of and extends over the sidewall of device semiconductor region 583. The second wrap-around flange interface contact region covers the underside of and extends over the sidewall of semiconductor post region 584. The third wrap-around flange interface contact region covers the underside of and extends over the sidewall of semiconductor post region 585.

Collector contact layer 593 and base and emitter contact layers 594-595 are the connection points for transistor module 500 to external circuitry. Contact layers 593-595 are all relatively flat on the underside of semiconductor regions 583-585, respectively. Contact layers 593-595 are also both relatively large. These features help to ensure good contact to external circuitry.

Contact layers 593-595 may be comprised of titanium-tungsten (Ti-W) and nickel (Ni) in one embodiment. Ni is preferable as Ni is well-suited for soldering. These Ni contact layers may be subsequently coated, for example, with a thin layer of gold (Au). Such a coating may serve to prevent the corrosion or oxidation of the Ni contact layers without destroying the soldering ability of Ni. For another embodiment, gold (Au) may be used in place of Ni. Contact layers 593-595 may include other conductive materials as well. For example, aluminum (Al) or copper (Cu) may be used. Indium titanium oxide (ITO) or gold tin oxide (ATO) may also be used. Other metals or combinations of materials including metals may also be used.

The base and emitter interconnect layers each form a flange interface with contact layers 594-595. In each case, the flange interface provides for a durable and reliable bond between the interconnect layer and the contact layer.

For one embodiment, titanium-tungsten (Ti-W) is used as the bonding interconnect layer and as the bonding contact layer for both contact regions. That is, Ti-W is formed at the bottom of the interconnect layers and at the top of contact layers 594-595. As a result a durable and reliable intermetallic surface-to-surface bond is formed between each interconnect and each contact layer 594-595, respectively, for this embodiment. For other embodiments, another material in place of Ti-W may be used in creating a bond between interconnects and contact layers 594-595, respectively. Using the same material here may facilitate the formation of a durable and reliable bond between the interconnects and contact layers 594-595, respectively. For still other embodiments, the materials used to bond the interconnects with contact layers 594-595, respectively, may be different.

Transistor module 500 may be die-attached across standard beam circuit gaps using either solder or conductive epoxy. Transistor module can be configured to be a drop-in replacement for present beam lead devices. Alternatively, transistor module 500 can be made smaller or larger to address a custom requirement. The design of transistor module 500 allows the device to be made relatively small.

Figure 37:
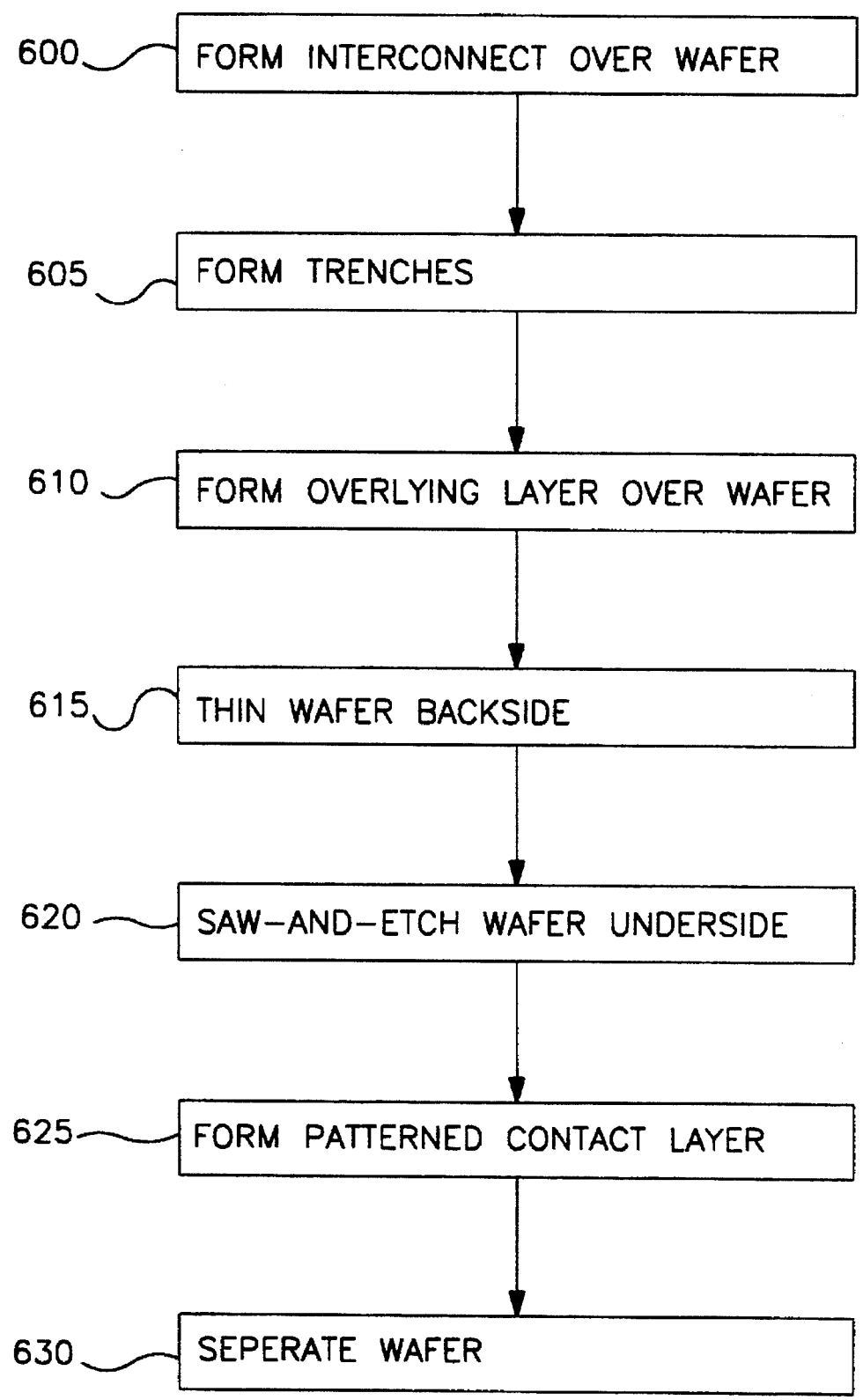
FIG. 37 illustrates, in flow diagram form, an exemplary semiconductor fabrication method used in fabricating the transistor module of FIG. 34.

FIG. 37 illustrates, in flow diagram form, an exemplary method for use in semiconductor fabrication. The method of FIG. 37 may be used to fabricate transistor module 500 for example. To better explain the method of FIG. 37, FIGS. 38-71 will be used to illustrate the various steps of the method of FIG. 37.

Figures 38, 39:
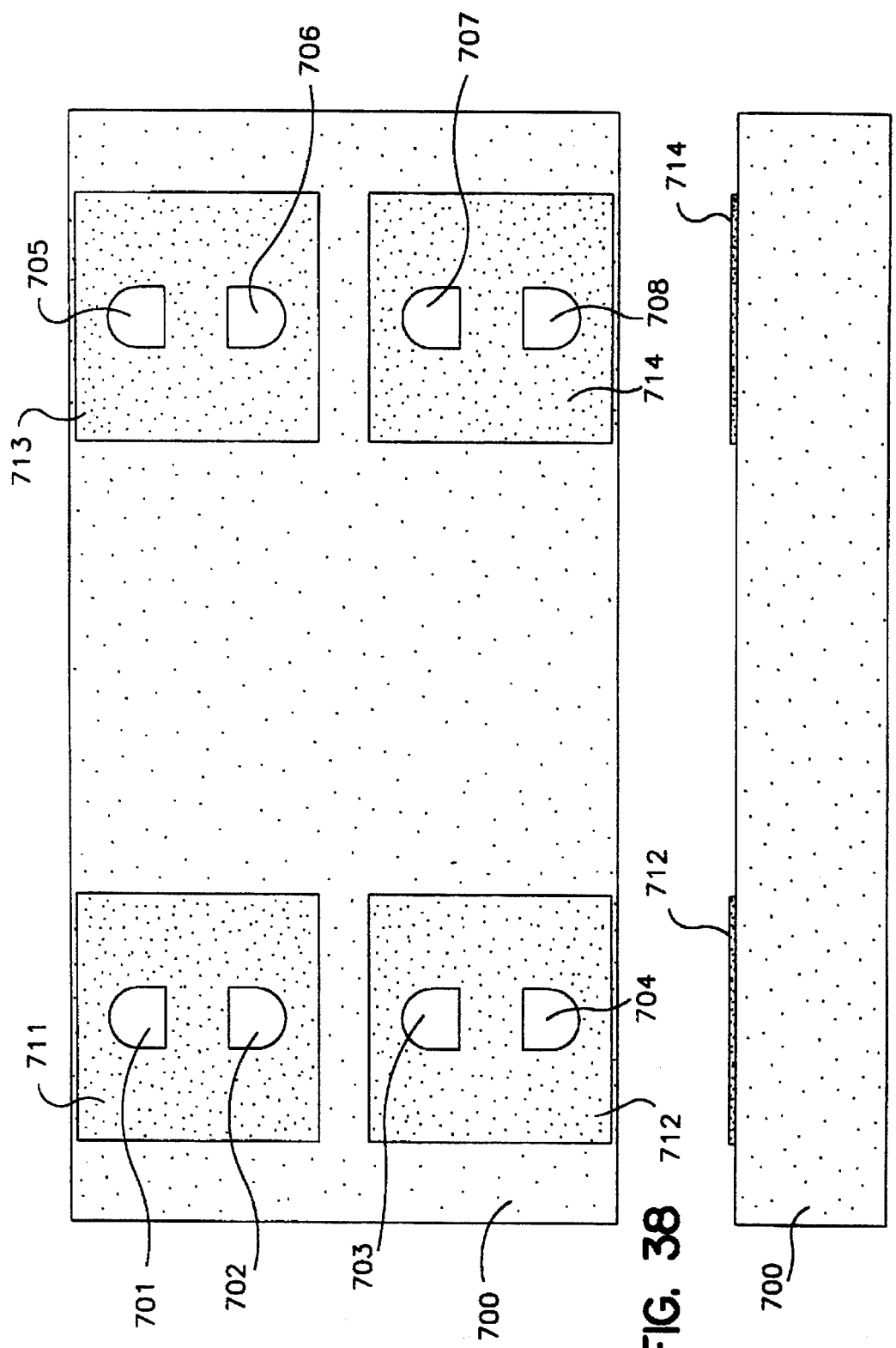
FIG. 38 illustrates a top view of a semiconductor wafer used to fabricate the transistor module of FIG. 34.
FIG. 39 illustrates a cross-sectional side view of the wafer of FIG. 38.

FIG. 38 illustrates a top view of a semiconductor wafer used to fabricate the transistor module of FIG. 34. FIG. 39 illustrates a cross-sectional side view of the wafer of FIG. 38.

In performing the method of FIG. 37, a semiconductor substrate is provided. This substrate is illustrated, for example, in FIGS. 38-39 as substrate 700. Substrate 700 may be a silicon (Si) substrate, yet a variety of other types of semiconductor substrates may be used.

The wafer of FIGS. 38-39 includes substrate 700 in which base and emitter region pairs 701-702, 703-704, 705-706, and 707-708 have been formed to provide for four transistor devices. This number of devices is exemplary and has been chosen so as to provide for a clearer understanding of the present invention. Any number of devices may be formed using the same wafer and may depend, for example, on the size of the wafer. Base and emitter region pairs 701-708 may be provided with appropriate ohmic contacts.

A patterned insulative layer including regions 711, 712, 713, and 714 has been formed over the wafer. For one embodiment this insulative layer is formed by depositing silicon nitride ($Si_3N_4$). The insulative layer may also be formed from silicon dioxide ($SiO_2$) that has been either deposited or grown over the surface of substrate 400. The insulative layer may include other materials or combinations of materials as well. The insulative layer is then patterned, for example using photolithography and etch techniques, into regions 711-714.

As illustrated in FIGS. 38-39, the insulative layer is patterned to expose base/emitter region pairs 701-708. Insulative region 711 has been patterned to expose base/emitter region pair 701-702. Insulative region 712 has been patterned to expose base/emitter region pair 703-704. Insulative region 713 has been patterned to expose base/emitter region pair 705-706. Insulative region 714 has been patterned to expose base/emitter region pair 707-708.

For an alternative embodiment, contact regions or bonding pads may be formed over substrate 700 to provide for electrical connection to base/emitter region pairs 701-708. Insulative regions 711-714 may then be patterned to expose such contact regions or bonding pads as opposed to exposing base/emitter region pairs 701-708.

Figures 40, 41:
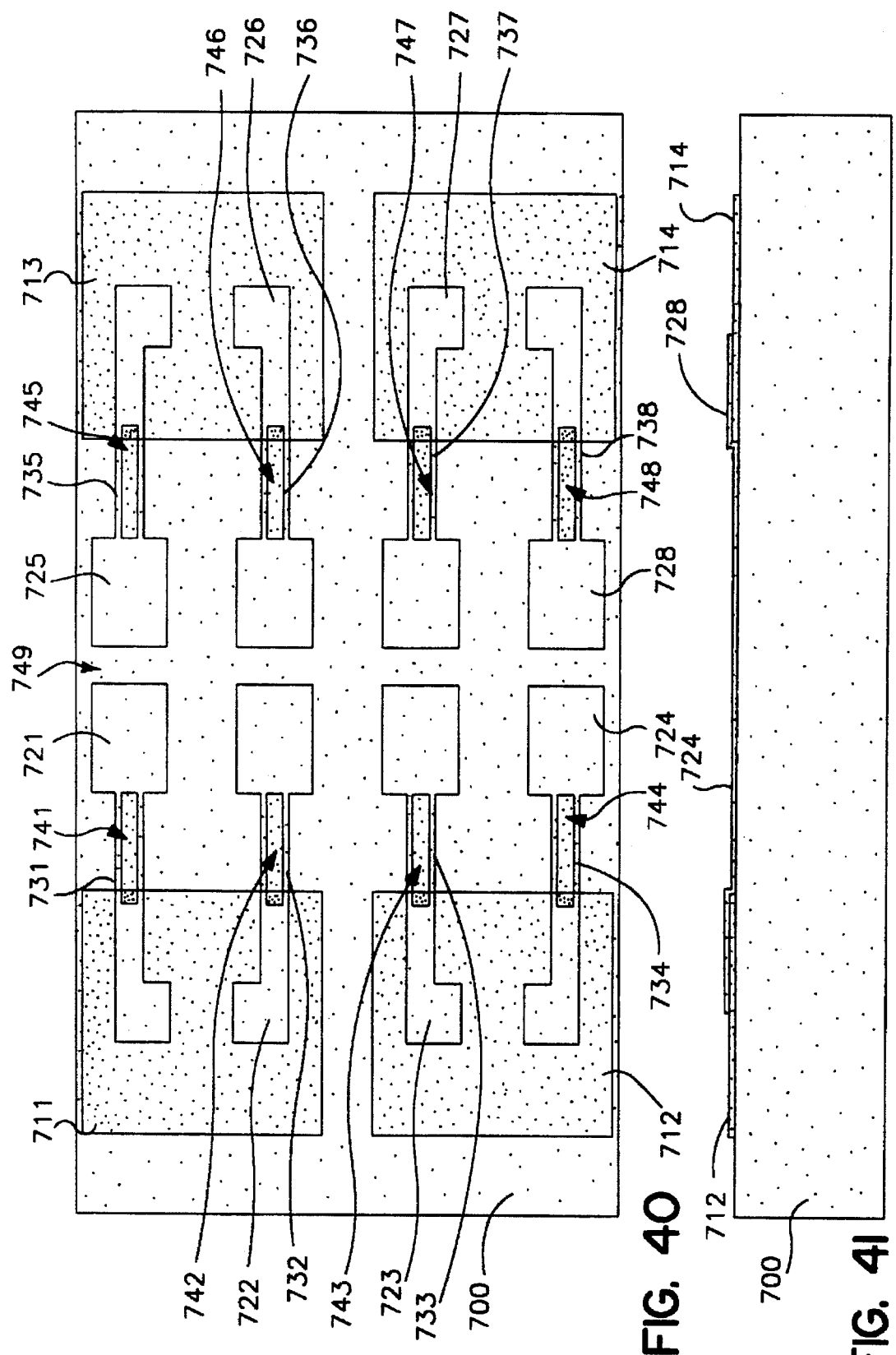
FIG. 40 illustrates a top view of the wafer of FIG. 38 after interconnects have been formed over the wafer.
FIG. 41 illustrates a cross-sectional side view of the wafer of FIG. 40.

For step 600 of FIG. 37, interconnects 721, 722, 723, 724, 725, 726, 727, and 728 are formed over the wafer. This is illustrated in FIGS. 40-41. FIG. 40 illustrates a top view of the wafer of FIG. 38 after interconnects 721-728 have been formed over the wafer. FIG. 41 illustrates a cross-sectional side view of the wafer of FIG. 40.

Interconnects 721-728 are also referred to as interconnect layers. Interconnect 721 includes bridge portion 731.

Likewise, interconnects 722–728 include bridge portions 732, 733, 734, 735, 736, 737, and 738, respectively. Bridge portions 731–738 include gaps 741, 742, 743, 744, 745, 746, 747, and 748, respectively. For an alternative embodiment, bridge portions 731–738 do not contain gaps 741–748, respectively, but rather are solid bridges.

Interconnects 721–722 provide for an electrical connection to base/emitter region pairs 701–702. Interconnects 723–724 provide for an electrical connection to base/emitter region pairs 703–704. Interconnects 725–726 provide for an electrical connection to base/emitter region pairs 705–706. Interconnects 727–728 provide for an electrical connection to base/emitter region pairs 707–708.

For one embodiment, interconnects 721–728 are formed by first forming a conductor layer over the wafer. For example, titanium-tungsten (Ti-W) may be sputter deposited over the wafer. This Ti-W layer may serve to provide for a diffusion barrier layer for interconnects 721–728. Other diffusion barrier materials may also be used here. Gold (Au) is then sputter deposited over the Ti-W layer. This Au layer may serve to facilitate the pattern plating of gold, for example, in forming interconnects 721–728. A patterned mask layer, for example comprising photoresist, may then be formed over the wafer. This patterned mask layer is used in pattern plating gold (Au), for example approximately 10 μm in thickness, over the Ti-W-Au layers to create interconnects 721–728. After this pattern plating process, the patterned mask layer is removed. Portions of the Ti-W-Au layers which are exposed on the surface of the wafer may then be etched, leaving interconnects 721–728 as illustrated in FIGS. 40–41. Interconnects 721–728 as a result contain Ti-W and Au.

Interconnects 721–728 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, interconnects 721–728 may be formed using any suitable technique. As another example, a layer of the material or materials used to create interconnects 721–728 may be deposited over the wafer and subsequently patterned to create interconnects 721–728. Photolithography and etch techniques, for example, may be used here to pattern interconnects 721–728.

For an alternative embodiment, interconnects 721–728 are not entirely separate when formed. For example, interconnects 721 and 725 may be formed as an integral interconnect pattern, joined at the closest edge 749 in FIG. 40 between interconnects 721 and 725. Interconnect pairs 722/726, 723/727, and 724/728 may also be formed in this manner. The wafer will later be separated such that joined interconnect pairs 721/725, 722/726, 723/727, and 724/728 will become separated.

For step 605 of FIG. 37, then, moats or trenches are formed from substrate 700. In forming these trenches, any suitable processing technique may be used. For one embodiment, a mask layer 750 is first formed and patterned over the wafer. This is illustrated in FIGS. 42–43. FIG. 42 illustrates a top view of the wafer of FIG. 40 after mask layer 750 has been formed over the wafer. FIG. 43 illustrates a cross-sectional side view of the wafer of FIG. 42.

Mask layer 750 may include photoresist. Mask layer 750 may also include silicon nitride ($Si_3N_4$) or silicon dioxide ($SiO_2$). Mask layer 750 may include other materials or combinations of materials as well. Mask layer 750 may be deposited over the wafer and later patterned using photolithography techniques. Other process steps may also be used to form mask layer 750. Mask layer 750 is patterned to define trench regions 751, 752, 753, and 754, as illustrated in FIGS. 42–43.

Trench region 751 traverses over two transistors which will be created using base/emitter region pairs 701–704. Trench region 752 traverses over two transistors which will be created using base/emitter region pairs 705–708. Trench regions 751–752 run parallel to one another. Trench regions 753–754 run perpendicularly between trench regions 751–752.

Bridge portions 731–734 cross over trench region 751. Gaps 741–744 overlie trench region 751. Bridge portions 735–738 cross over trench region 752. Gaps 745–748 overlie trench region 752.

Trenches 755, 756, 757, and 758 are then etched from substrate 700 in trench regions 751–754, respectively, as defined by mask layer 750. Mask layer 750 is subsequently removed from the wafer. This is illustrated in FIGS. 44–45. FIG. 44 illustrates a top view of the wafer of FIG. 42 after trenches 755–758 have been formed from substrate 700 of the wafer and after mask layer 750 has been removed. FIG. 45 illustrates a cross-sectional side view of the wafer of FIG. 44.

In etching trenches 755–758 here, any suitable etch technique and chemistry may be used. As mask layer 750 serves as a mask when etching trenches 755–758, the etch technique and chemistry is preferably selective to the material used for mask layer 750. The etch technique and chemistry is also preferably selective to the material used for interconnects 721–728 as bridge portions 731–738 are subjected to this etch process.

The material of substrate 700 in trench regions 751–752 which lies beneath bridge portions 731–738 is removed in forming trenches 751–752. Gaps 741–748 may serve to facilitate the removal of underlying substrate 700 in etching trenches 755–756 here by allowing the etchant to flow through bridge portions 731–738, respectively.

For an alternative embodiment, bridge portions 731–738 may be solid bridges without gaps 741–748 as discussed above. Bridge portions 731–738 may need to be thinner in width, though, for this alternative embodiment so as to ensure underlying substrate 700 is removed beneath bridge portions 731–738 in forming trenches 755–756.

The formation of trenches 755–756 will not cause a short between substrate 700 and interconnects 721–728. That is, insulative regions 711–714 protect interconnects 721–728 from contacting substrate 700 after forming trenches 755–756. Insulative region 711 protects interconnects 721–722 from contacting substrate 700. Insulative region 712 protects interconnects 723–724 from contacting substrate 700. Insulative region 713 protects interconnects 725–726 from contacting substrate 700. Insulative region 714 protects interconnects 727–728 from contacting substrate 700. This is illustrated in FIG. 45 where insulative regions 712 and 714 protect interconnects 724 and 728, respectively, from contacting substrate 700 after forming trenches 755–756, respectively. Here, trench 755 has been partly formed by undercutting beneath an edge of insulative region 712. Likewise, trench 756 has also been partly formed by undercutting beneath an edge of insulative region 714. Trenches 755–756 are similarly formed with respect to insulative regions 711 and 713 as well.

After trenches 755–758 have been formed, mask layer 750 is removed from the underside of the wafer as illustrated in FIGS. 44–45. Any suitable technique may be used here to remove mask layer 750.

For an alternative embodiment, the insulative layer including insulative regions 711–714 may be patterned not only to expose base/emitter region pairs 701–708 but also to define trench regions 751–754. This embodiment is similar to the use of the insulative layer discussed above with regard to the diode module. Mask layer 750 would not be needed, then, as this insulative layer may be used as a mask in etching trenches 755–758. Trenches 755–758 may be etched with a suitable etch technique and chemistry using this mask.

Trenches 755–758 essentially provide for a top-side separation of semiconductor for each transistor module to be created from the wafer, providing for a device semiconductor region, a base semiconductor post region, and an emitter semiconductor post region for each transistor module to be fabricated from the wafer. This separation of semiconductor for each transistor module will be described in more detail below.

Figure 46:
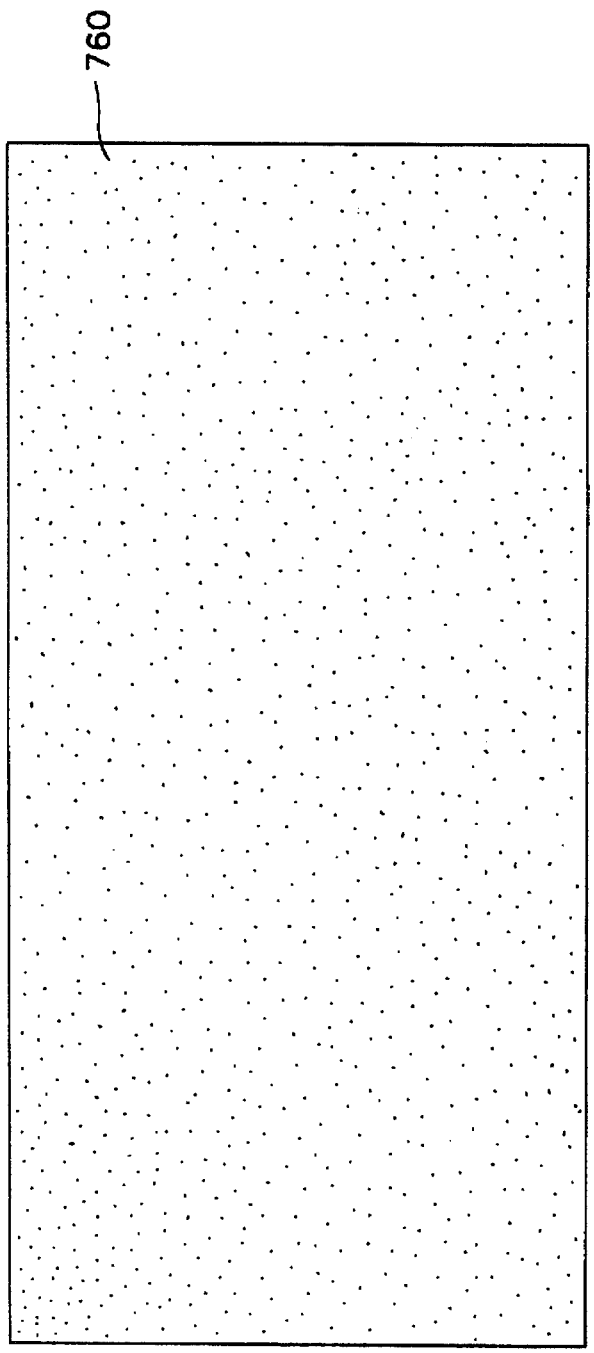
FIG. 46 illustrates a top view of the wafer of FIG. 44 after an overlying layer has been formed over the wafer.
Figure 47:
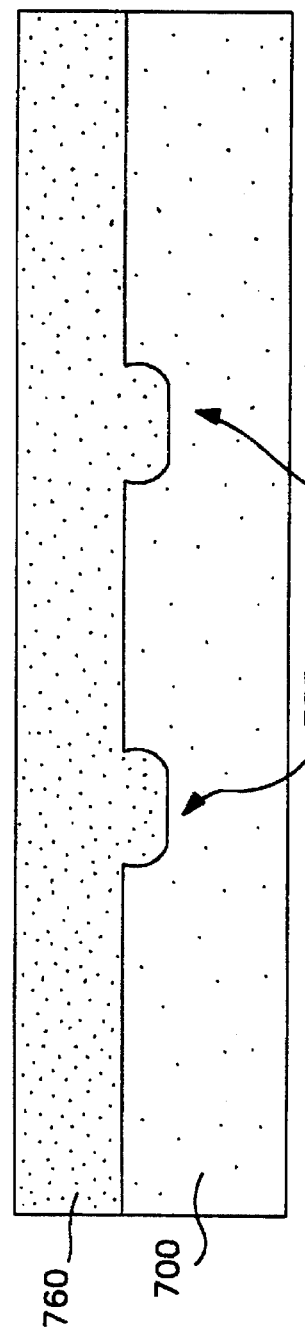
FIG. 47 illustrates a cross-sectional side view of the wafer of FIG. 46.

For step 610 of FIG. 37, overlying layer 760 is formed over the wafer as illustrated in FIGS. 46–47. FIG. 46 illustrates a top view of the wafer of FIG. 44 after overlying layer 760 has been formed over the wafer. FIG. 47 illustrates a cross-sectional side view of the wafer of FIG. 46.

Overlying layer 760 substantially encapsulates the entire surface of the wafer and substantially fills trenches 755–758. For one embodiment, overlying layer 760 includes epoxy that has been centrifuged over the wafer. A controlled vacuum environment may also be used to spin-on epoxy here. For alternative embodiments, overlying layer 760 may include silicon dioxide ($SiO_2$), silicon nitride ($Si_3N_4$), plastic, Teflon, a polyimide, or a glass. Overlying layer 760 may be formed using other dielectric or insulative materials, or combinations of materials, and may be formed using any suitable technique.

Overlying layer 760 may serve to protect each transistor device created from the wafer. Overlaying layer 760 may serve as a passivation layer. Overlying layer 760 may also serve to mechanically hold together each transistor device created from the wafer.

Overlying layer 760 may also include an optional cap layer containing, for example, silicon, polysilicon, amorphous silicon, plastic, glass, epoxy, alumina, or diamond. Other materials or combinations of materials may also be used. This optional cap layer may serve to make each transistor device created from the wafer more rigid and rugged. This optional cap layer may also serve as a heat conduit for each device fabricated from the wafer.

Figure 49:
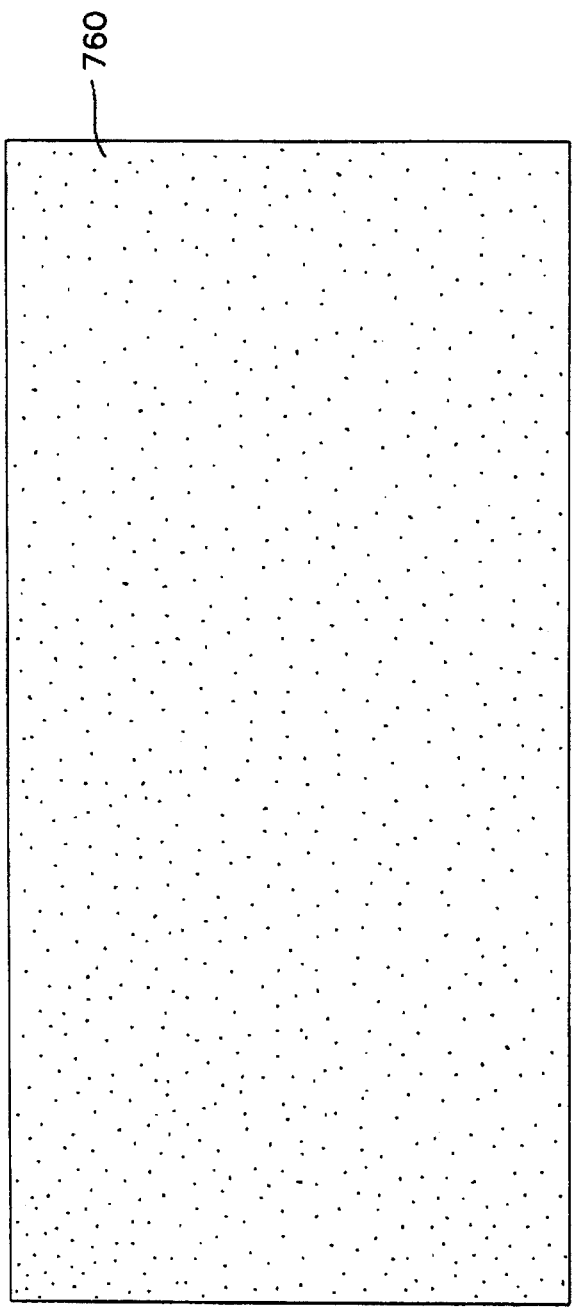
FIG. 49 illustrates a top view of the wafer of FIG. 48.
Figure 48:
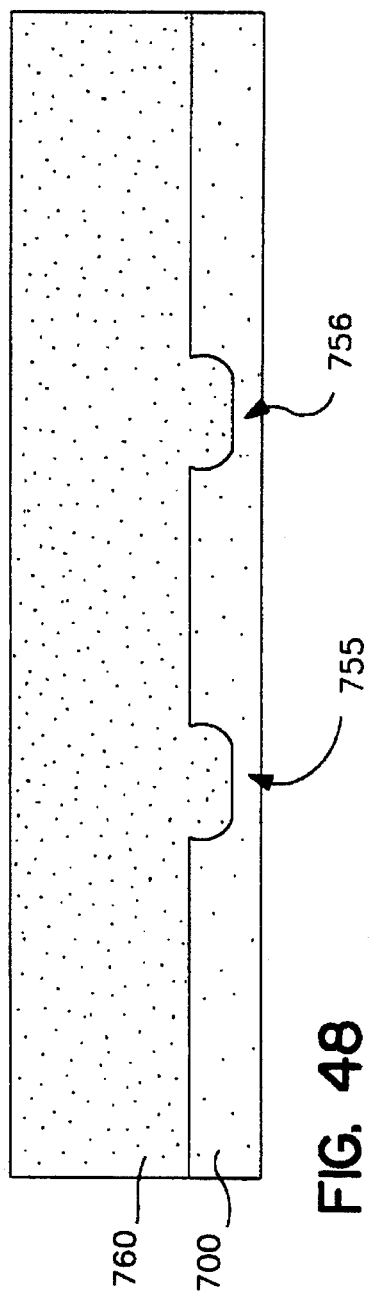
FIG. 48 illustrates a cross-sectional side view of the wafer of FIG. 47 after the underside of the wafer has been thinned.

For step 615 of FIG. 37, the backside or underside of the wafer is thinned as illustrated in FIG. 48, as compared to the wafer illustrated in FIG. 47. FIG. 48 illustrates a cross-sectional side view of the wafer of FIG. 47 after the underside of the wafer has been thinned. FIG. 49 illustrates a top view of the wafer of FIG. 48.

The underside of substrate 700 may be thinned using any suitable technique. For example, the underside of substrate 700 may be sandblasted. The underside of substrate 700 may also be etched using a suitable etch technique and chemistry or, alternatively, may be thinned by grinding it. The underside of substrate 700 may also be thinned by lapping. The bottom of substrate 700 beneath base/emitter region pairs 701–708 may be provided with appropriate ohmic contacts.

For step 620 of FIG. 37, a saw-and-etch process is used to pattern the underside of the wafer. One embodiment of this step is illustrated in FIGS. 50–55. A patterned mask layer 762 is first formed over the underside of the wafer. This is illustrated in FIGS. 50–51. FIG. 50 illustrates a cross-sectional side view of the wafer of FIG. 48 after mask layer 762 has been formed over the underside of the wafer. FIG. 51 illustrates an underside view of the wafer of FIG. 50.

Mask layer 762 may comprise photoresist, for example, that has been spun-on. Other suitable mask materials, including other photosensitive materials, may also be used and may be formed over the underside of the wafer using any suitable technique.

As illustrated in FIGS. 50–51, mask layer 762 is patterned to define scribe line regions 763, 765, and 767, which define where the wafer will later be separated. Mask layer 762 is also patterned to define underside trench regions 764, 766, 768, and 769. Underside trench regions 764, 766, 768, and 769 lie beneath trenches 755–758 formed in substrate 700. Mask layer 762 may be patterned using any suitable patterning technique. For example, mask layer 762 may be patterned using photolithography techniques.

The underside of the wafer is then sawed along scribe line regions 763, 765, and 767 to create pits 771, 773, and 775. This is illustrated in FIGS. 52–53. FIG. 52 illustrates a cross-sectional side view of the wafer of FIG. 50 after the underside of the wafer has been sawed. FIG. 53 illustrates an underside view of the wafer of FIG. 52.

For one embodiment, the underside of the wafer may be sawed using as a guide scribe line regions 763, 765, and 767 as defined by mask layer 762 to create pits 771, 773, and 775. For another embodiment, mask layer 762 may be patterned to define only trench regions 764, 766, 768, and 769. That is, mask layer 762 in this other embodiment would not be initially patterned to define scribe line regions 763, 765, and 767. The sawing of the underside of the wafer to create pits 771, 773, and 775 would then serve to pattern mask layer 762 so as to define these scribe line regions, as illustrated in FIGS. 52–53.

The wafer is not entirely separated here in sawing the underside of the wafer to create pits 771, 773, and 775, as illustrated in FIGS. 52–53. Each pit 771, 773, and 775 is approximately 2–3 mils in width. Pits 771, 773, and 775 may also have other widths. Preferably, pits 771, 773, and 775 are sawed such that the distance between the top surface of substrate 700 and the top of pit 773 (said distance illustrated in FIG. 52 as distance 774) is substantially equal to the distance between the bottom of trench 755, for example, and the bottom of substrate 700 (as illustrated in FIG. 52 as distance 772). This may serve to facilitate the later etch of trenches as the depth of substrate 700 to be etched from scribe line regions 763, 765, and 767 and from underside trench regions 764, 766, 768, and 769 is then about the same.

After creating pits 771, 773, and 775, substrate 700 is etched from the underside of the wafer in scribe line regions 763, 765, and 767 and in underside trench regions 764, 766, 768, and 769 as defined by mask layer 762 to create trenches 776, 777, 778, 779, 780, 781, and 782. This is illustrated in FIGS. 54–55. FIG. 54 illustrates a cross-sectional side view of the wafer of FIG. 52 after the underside of the substrate of the wafer has been etched and after underside mask layer 762 has been removed. FIG. 55 illustrates an underside view of the wafer of FIG. 54.

Any suitable etch technique and chemistry may be used here to create trenches 776–782. Trenches 776–782 serve to separate substrate 700. As illustrated in FIGS. 54–55, trenches 777–782 serve to separate substrate 700 into substrate regions 783, 784, 785, 786, 787, 788, 789, and 790.

After trenches 776–782 have been formed, mask layer 762 is removed from the underside of the wafer as illustrated in FIGS. 54–55. Any suitable technique may be used here to remove mask layer 762.

A portion of each interconnect 721–728 becomes exposed in trench 778 along scribe line region 765 after this etch. This is illustrated in FIGS. 54–55. Underside trenches 776–782 expose overlying layer 760, as illustrated in FIGS. 54–55.

Trenches 777–779 and 781–782 accordingly provide for a bottom-side separation of semiconductor for each transistor module to be created from the wafer. In conjunction with the top-side separation of semiconductor by trenches 755–758 a complete separation of a device semiconductor region, a base semiconductor post region, and an emitter semiconductor post region for each transistor module has been formed.

For an alternative embodiment, only underside trenches 776–782 are used to provide for the semiconductor separation described above. That is, trenches 755–758 are not formed at all. Rather, only underside trenches 776–782 are formed by removing the substrate material through the entire thickness of the substrate, exposing overlying layer 760 for each underside trench. For this alternative embodiment, however, bridge portions of interconnects 721–728 may be exposed at the underside of the wafer in trench regions 764, 766, 768, and 769. A material resistive to corrosion is preferably used in forming interconnects 721–728 for this embodiment as overlying layer 760 may not fully encapsulate interconnects 721–728 to protect them.

Figures 56, 57:
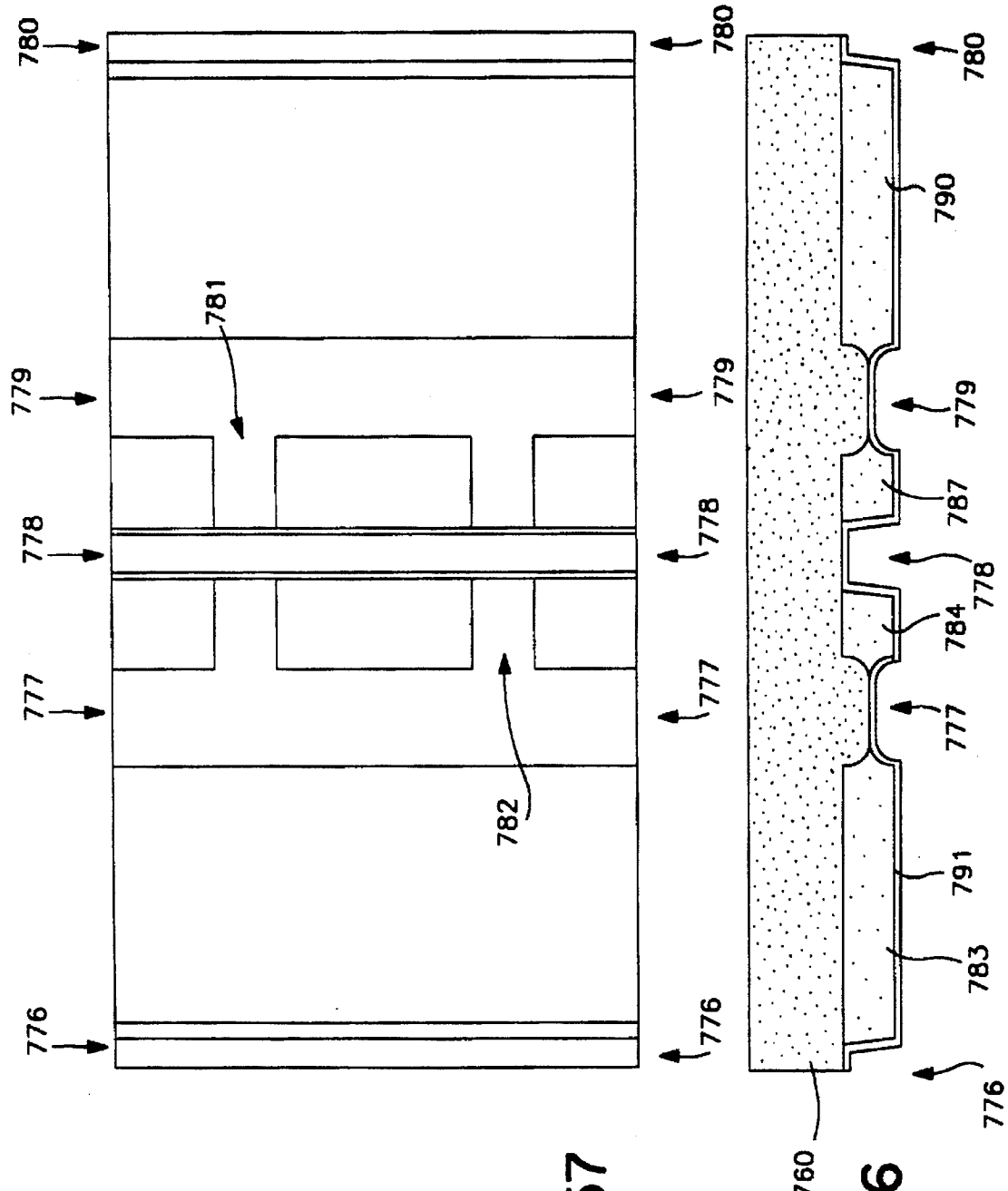
FIG. 56 illustrates a cross-sectional side view of the wafer of FIG. 54 after a contact layer has been formed over the underside of the wafer.
FIG. 57 illustrates an underside view of the wafer of FIG. 56.

For step 625 of FIG. 37, a patterned contact layer is formed over the underside of the wafer to provide contact regions for each transistor module to be created from the wafer. One embodiment of this step is illustrated in FIGS. 56–61. For this embodiment, a contact layer 791 is first formed over the underside of the wafer. FIG. 56 illustrates a cross-sectional side view of the wafer of FIG. 54 after contact layer 791 has been formed over the underside of the wafer. FIG. 57 illustrates an underside view of the wafer of FIG. 56.

Here, titanium-tungsten (Ti-W) may be sputter deposited over the wafer. This Ti-W layer may serve to provide for a diffusion barrier layer for the patterned contact layer. Nickel (Ni) may then be sputter deposited over the underside of the wafer. Ni is preferable because it is well-suited for soldering. This Ni contact layer may be subsequently coated, for example, with a thin layer of gold (Au). Such a coating may serve to prevent the corrosion or oxidation of the contact layer without destroying the soldering ability of Ni. For another embodiment, gold (Au) may be formed over the underside of the wafer in place of Ni. Any suitable conductive material or combination of materials may also be used to form contact layer 791. Furthermore, any suitable technique may be used to form contact layer 791.

Contact layer 791 conforms to the contour of the underside of the wafer. Particularly, contact layer 791 is formed along the sides and bottom of underside trenches 776, 778, and 780, respectively, as illustrated in FIGS. 56–57. For one embodiment, portions of contact layer 791 form a durable reliable surface-to-surface bond with the portions of interconnects 721–728 that are exposed in underside trench 778 when contact layer 791 is formed over the underside of the wafer. The material used for interconnects 721–728 that is exposed in trench 778 is preferably the same as the material used for contact layer 791 that is to come in contact with interconnects 721–728.

For one embodiment, titanium-tungsten (Ti-W) is used as the first interconnect layer and as the first contact layer. As a result, a durable reliable intermetallic surface-to-surface bond is formed for this embodiment. For other embodiments, another material in place of Ti-W may be used in creating a bond between interconnects 721–728 and contact layer 791. Using the same material here may facilitate the formation of a durable and reliable bond between interconnects 721–728 and contact layer 791 in trench 778. For still other embodiments, the materials used to bond interconnects 721–728 with contact layer 791 may be different.

A patterned mask layer 792 is then formed over the underside of the wafer, as illustrated in FIGS. 58–59. FIG. 58 illustrates a cross-sectional side view of the wafer of FIG. 56 after mask layer 792 has been formed over the underside of the wafer. FIG. 59 illustrates an underside view of the wafer of FIG. 58.

Mask layer 792 may include photoresist. Mask layer 792 may also include other suitable materials or combinations of materials as well. Mask layer 792 may be deposited over the wafer and later patterned using photolithography techniques. Other process steps may also be used to form mask layer 792. Mask layer 792 is patterned to define underside trench regions 764, 766, 768, and 769 where trenches 777, 779, 781, and 782 have been formed, respectively.

Contact layer 791 is then patterned into contact regions 793, 794, 795, 796, and 797 using mask layer 792 as a mask. Mask layer 792 is subsequently removed. This is illustrated in FIGS. 60–61. FIG. 60 illustrates a cross-sectional side view of the wafer of FIG. 58 after contact layer 791 has been patterned and after mask layer 792 has been removed. FIG. 61 illustrates an underside view of the wafer of FIG. 60.

Contact layer 791 is etched from underside trench regions 764, 766, 768, and 769 as defined by mask layer 792. That is, contact layer 791 is etched from underside trenches 777, 779, 781, and 782 to create contact regions 793–797. Any suitable etch technique and chemistry may be used here. Mask layer 792 may then be removed using any suitable technique.

Contact regions 793–797 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, contact regions 793–797 may be formed using any suitable technique. For example, contact regions 793–797 may be pattern plated over the underside of the wafer.

Figures 62, 63:
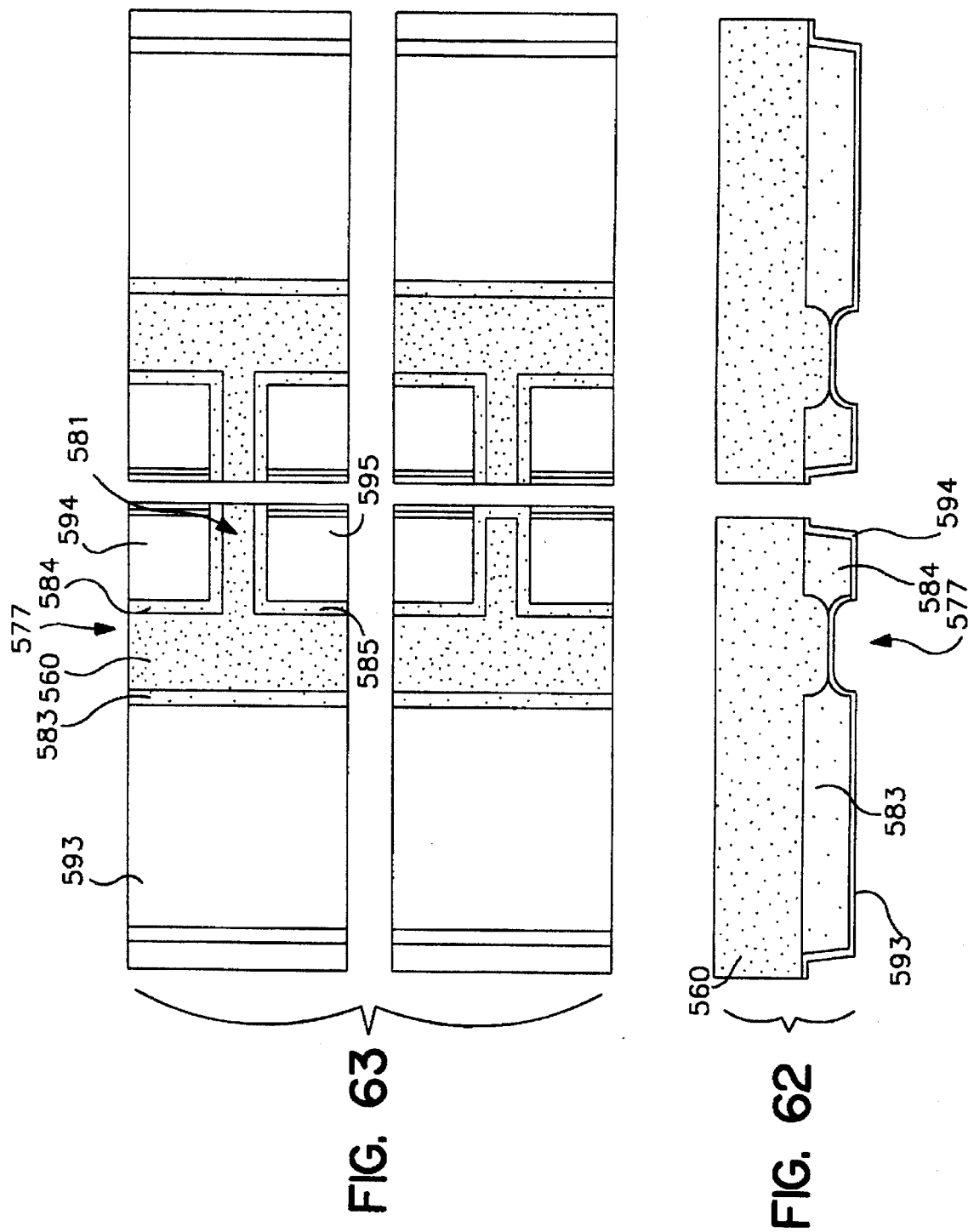
FIG. 62 illustrates a cross-sectional side view of the wafer of FIG. 60 after the wafer has been separated into transistor modules.
FIG. 63 illustrates an underside view of the wafer of FIG. 62.

For step 630 of FIG. 37, the wafer is separated into transistor modules, as illustrated in FIGS. 62–63. FIG. 62 illustrates a cross-sectional side view of the wafer of FIG. 60 after the wafer has been separated into transistor modules. FIG. 63 illustrates an underside view of the wafer of FIG. 62.

The wafer may be separated, for example, by sawing the wafer. The sawcut may be approximately one (1) mil in width. The sawcut may have other widths as well. Other techniques may also be used to separate the wafer and include, for example, using a laser scribe.

The wafer is separated through, for example, trench 778. Interconnects 721–728 which have been bonded with contact regions 794–796 form wrap-around flange interface contact regions as illustrated in FIGS. 62–63. Bonded contact regions 794–796 are separated in separating the wafer. The reference numerals used in FIGS. 62–63 correspond to those used for FIGS. 34–36 above.

For another embodiment for fabricating transistor modules, an alternative saw-and-etch process is used in etching the underside of the wafer for step 620 of FIG. 37. This embodiment is illustrated in FIGS. 64–71. In the illustration of the method of FIG. 37 using FIGS. 38–63 above, FIGS. 50–53 are replaced by FIGS. 64–71 here.

For this alternative embodiment, a mask layer 761 is first formed over the underside of the wafer of FIGS. 48–49. This is illustrated in FIGS. 64–65. FIG. 64 illustrates a cross-sectional side view of the wafer of FIG. 48 after mask layer 761 has been formed over the underside of the wafer. FIG. 65 illustrates an underside view of the wafer of FIG. 64.

Mask layer 761 may comprise photoresist, for example, that has been spun-on. Other suitable mask materials, including other photosensitive materials, may also be used here and may be formed over the underside of the wafer using any suitable technique.

As illustrated in FIGS. 64–65, mask layer 761 is patterned to define scribe line regions 763, 765, and 767, which define where the wafer will later be separated. Mask layer 761 may be patterned using any suitable patterning technique. For example, mask layer 761 may be patterned using photolithography techniques.

The underside of the wafer is then sawed along scribe line regions 763, 765, and 767 to create pits 771, 773, and 775. This is illustrated in FIGS. 66–67. FIG. 66 illustrates a cross-sectional side view of the wafer of FIG. 64 after the underside of the wafer has been sawed. FIG. 67 illustrates an underside view of the wafer of FIG. 66.

For one embodiment, the underside of the wafer may be sawed using as a guide scribe line regions 763, 765, and 767 as defined by mask layer 761 to create pits 771, 773, and 775. For another embodiment, mask layer 761 would not be initially patterned to define scribe line regions 763, 765, and 767. The sawing of the underside of the wafer to create pits 771, 773, and 775 would then serve to pattern mask layer 761 so as to define these scribe line regions, as illustrated in FIGS. 66–67.

The wafer is not entirely separated here in sawing the underside of the wafer to create pits 771, 773, and 775, as illustrated in FIGS. 66–67. Each pit 771, 773, and 775 is approximately 2–3 mils in width. Pits 771, 773, and 775 may also have other widths.

After creating pits 771, 773, and 775, substrate 700 is etched from the underside of the wafer in scribe line regions 763, 765, and 767 as defined by mask layer 761 to create trenches 776, 778, and 780. Mask layer 761 is then removed. This is illustrated in FIGS. 68–69. FIG. 68 illustrates a cross-sectional side view of the wafer of FIG. 66 after the underside of the substrate of the wafer has been etched and after underside mask layer 761 has been removed. FIG. 69 illustrates an underside view of the wafer of FIG. 68.

Any suitable etch technique and chemistry may be used here to create trenches 776, 778, and 780. Trenches 776, 778, and 780 serve to separate substrate 700.

After trenches 776, 778, and 780 have been formed, mask layer 761 is removed from the underside of the wafer as illustrated in FIGS. 68–69. Any suitable technique may be used here to remove mask layer 761.

A portion of each interconnect 721–728 becomes exposed in trench 778 along scribe line region 765 after this etch. This is illustrated in FIGS. 68–69. Underside trenches 776, 778, and 780 expose overlying layer 760, as illustrated in FIGS. 68–69.

A mask layer 759 is then formed over the underside of the wafer. This is illustrated in FIGS. 70–71. FIG. 70 illustrates a cross-sectional view of the wafer of FIG. 68 after mask layer 759 has been formed over the underside of the wafer. FIG. 71 illustrates an underside view of the wafer of FIG. 70.

Mask layer 759 may comprise photoresist, for example, that has been spun-on. Other suitable mask materials, including other photosensitive materials, may also be used here and may be formed over the underside of the wafer using any suitable technique. As illustrated in FIGS. 70–71, mask layer 759 is patterned to define underside trench regions 764, 766, 768, and 769. Underside trench regions 764, 766, 768, and 769 lie beneath trenches 755–758 formed in substrate 700. Mask layer 759 may be patterned using any suitable patterning technique. For example, mask layer 759 may be patterned using photolithography techniques.

Substrate 700 is then etched from the underside of the wafer in underside trench regions 764, 766, 768, and 769 as defined by mask layer 759 to create trenches 777, 779, 781, and 782. This is illustrated in FIGS. 54–55. FIG. 54 for this embodiment illustrates a cross-sectional side view of the wafer of FIG. 70 after the underside of the substrate of the wafer has been etched and after underside mask layer 759 has been removed. FIG. 55 illustrates an underside view of the wafer of FIG. 54. Any suitable etch technique and chemistry may be used here to create trenches 777, 779, 781, and 782. As illustrated in FIGS. 54–55, trenches 777–782 serve to separate substrate 700 into substrate regions 783, 784, 785, 786, 787, 788, 789, and 790.

After trenches have been formed, mask layer 759 is removed from the underside of the wafer as illustrated in FIGS. 54–55. Any suitable technique may be used here to remove mask layer 759.

A portion of each interconnect 721–728 is exposed in trench 778 along scribe line region 765. This is illustrated in FIGS. 54–55. Underside trenches 776–782 expose overlying layer 760, as illustrated in FIGS. 54–55.

The method of FIG. 37 then continues with step 625, as discussed above, for this embodiment.

For still yet other embodiments, the saw-and-etch process of step 620 may be replaced with other patterning processes. For example, a simple etch technique may be used. Here, a mask layer may be formed over the underside of the wafer of FIG. 48 and patterned, for example using photolithography techniques, to define scribe line regions 763, 765, and 767 and also to define underside trench regions 764, 766, 768, and 769. Substrate 700 may then be etched using any suitable etch technique and chemistry to create underside trenches 776–782 using the mask layer as a mask. The resulting wafer would then appear as illustrated in FIGS. 54–55.

As yet another example, a mask layer may be patterned to define scribe line regions 763, 765, and 767. Trenches 776, 778, and 780 may then be etched from the underside of the wafer using this mask. Another mask layer may then be patterned to define underside trench regions 764, 766, 768, and 769. Trenches 777, 779, and 781–782 may then be etched from the underside of the wafer using this mask. The resulting wafer would then appear as illustrated in FIGS. 54–55.

The method of FIG. 37 may be similarly used to provide for differently structured transistor modules. For example, the method of FIG. 37 may be similarly used to form the transistor modules illustrated in FIGS. 72–86.

Figure 72:
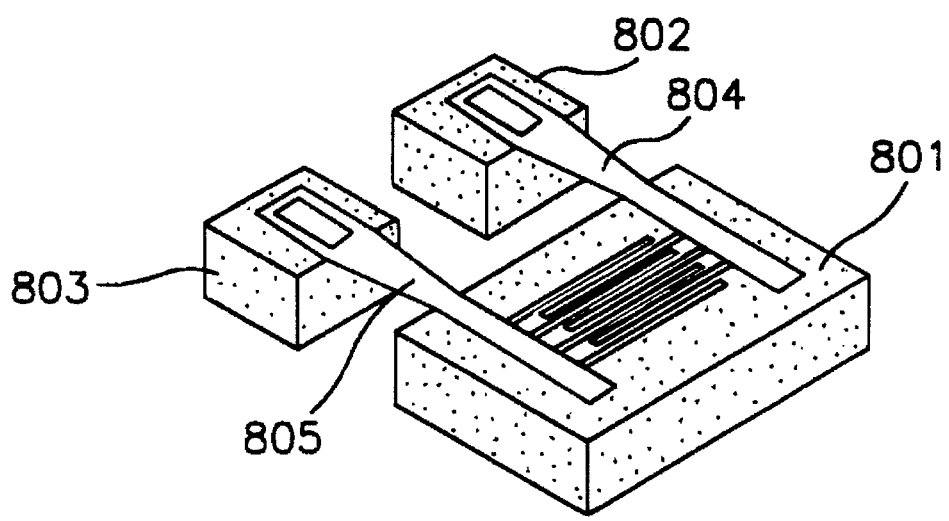
FIG. 72 illustrates a perspective view of another transistor module.

FIG. 72 illustrates a perspective view of another transistor module. The transistor module of FIG. 72 includes device semiconductor region 801, base and emitter semiconductor post regions 802–803, and interconnect layers 804–805. Interconnect layers 804–805 have been formed in wells of semiconductor post regions 802–803.

Figure 73:
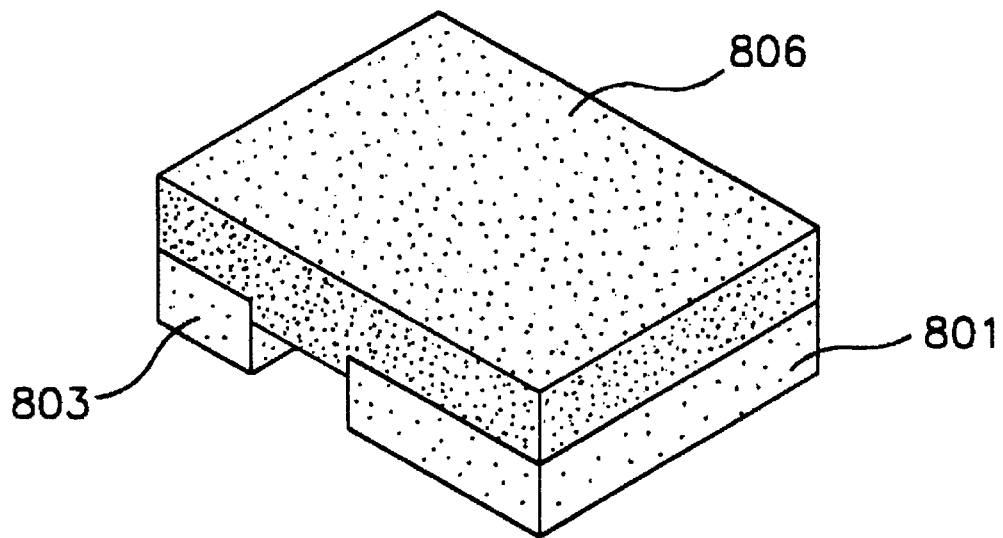
FIG. 73 illustrates a perspective view of the transistor module of FIG. 72 with an overlying layer.

FIG. 73 illustrates a perspective view of the transistor module of FIG. 72 with overlying layer 806.

The transistor module of FIGS. 72–73 has been formed without wrap-around flange interface contact regions. Suitable contact regions may be formed over the underside of semiconductor regions 801–803 to provide for base, collector, and emitter contact regions. These contact regions may also extend over the sidewalls of semiconductor regions 801–803.

Figure 74:
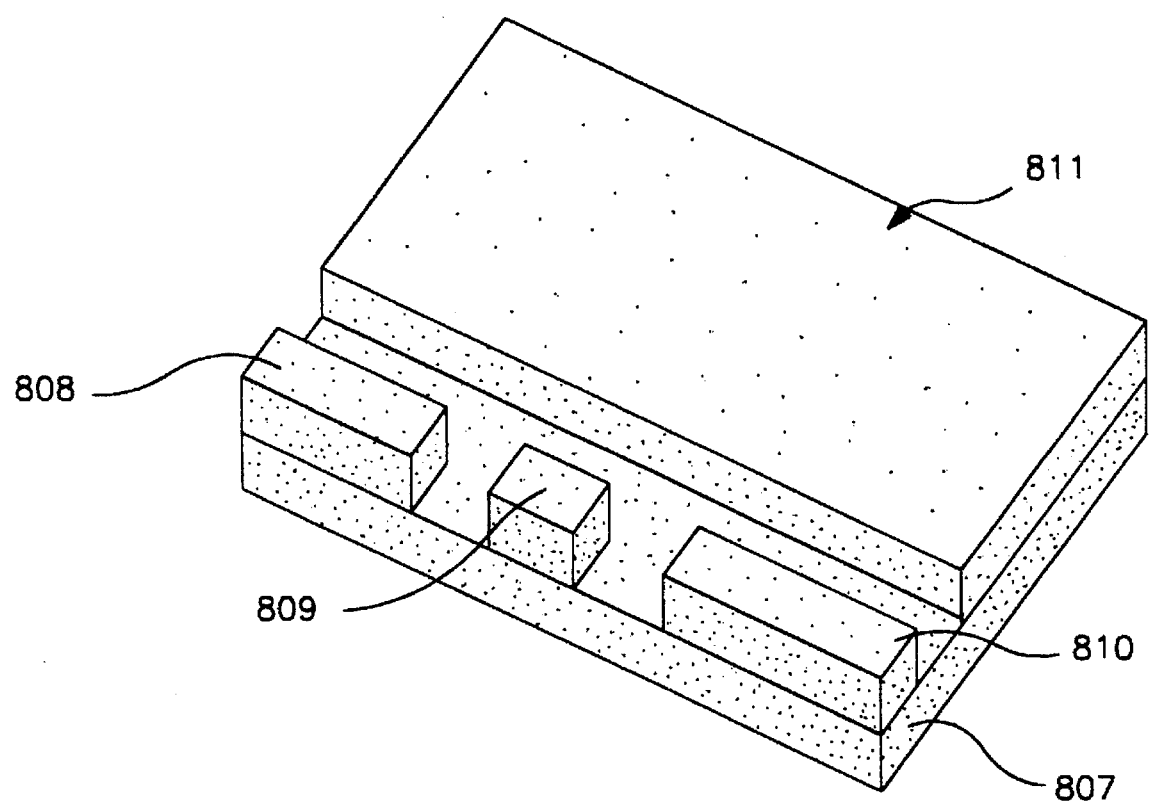
FIG. 74 illustrates a perspective bottom-up view of a field effect transistor module.

FIG. 74 illustrates a perspective bottom-up view of a field effect transistor module. This field effect transistor module may include a J-FET or MOSFET transistor, for example. This field effect transistor module includes overlying layer 807, source semiconductor post region 808, gate semiconductor post region 809, drain semiconductor post region 810, and device semiconductor region 811.

The transistor module of FIG. 74 may also include suitable contact regions formed over the underside of semiconductor regions 808–811. Such contact regions may also be formed to extend over the sidewalls of semiconductor regions 808–811. Wrap-around flange interface contact regions may also be formed over semiconductor regions 808–811.

FIGS. 75–80 illustrate bottom views of various other transistor modules. The transistor module of FIG. 75 includes overlying layer 812, emitter contact region 813, collector contact region 814, and base contact region 815. Contact regions 813–815 may each include a wrap-around contact region having a flange interface exposed on the same side of the transistor module as illustrated in FIG. 75.

The transistor module of FIG. 76 includes overlying layer 816, emitter contact region 817, collector contact region 818, and base contact region 819. Contact regions 817–819 may each include a wrap-around contact region having a flange interface exposed on opposite sides of the transistor module as illustrated in FIG. 76.

The transistor module of FIG. 77 includes overlying layer 820, emitter contact region 821, collector contact region 822, and base contact region 823. Contact regions 821 and 823 may each include a wrap-around contact region having a flange interface formed on the same side of the transistor module, as illustrated in FIG. 77. Contact region 822 may include a wrap-around contact region having a flange interface formed on an opposite side of the transistor module, as illustrated in FIG. 77.

The transistor module of FIG. 78 includes overlying layer 824, emitter contact region 825, collector contact region 826, and base contact region 827. Contact regions 825 and 827 may include wrap-around contact regions having a flange interface formed on opposite sides of the transistor module as illustrated in FIG. 78. Contact region 826 may include a wrap-around contact region having a flange interface formed on a third side of the transistor module as illustrated in FIG. 78.

The transistor module of FIG. 79 includes overlying layer 828, emitter contact region 829, collector contact region 830, and base contact region 831. Contact regions 829 and 831 may each include a wrap-around contact region having a flange interface formed on three sides of the transistor module as illustrated in FIG. 79. Contact region 830 may include a wrap-around contact region having a flange interface formed on opposite sides of the transistor module as illustrated in FIG. 79.

The transistor module of FIG. 80 includes overlying layer 832, emitter contact region 833, collector contact region 834, and base contact region 835. Contact regions 833 and 834 may each include a wrap-around contact region having a flange interface formed on two sides of the transistor module as illustrated in FIG. 80. Contact region 834 may include a wrap-around contact region having a flange interface formed on one side of the transistor module as illustrated in FIG. 80.

Figure 81:
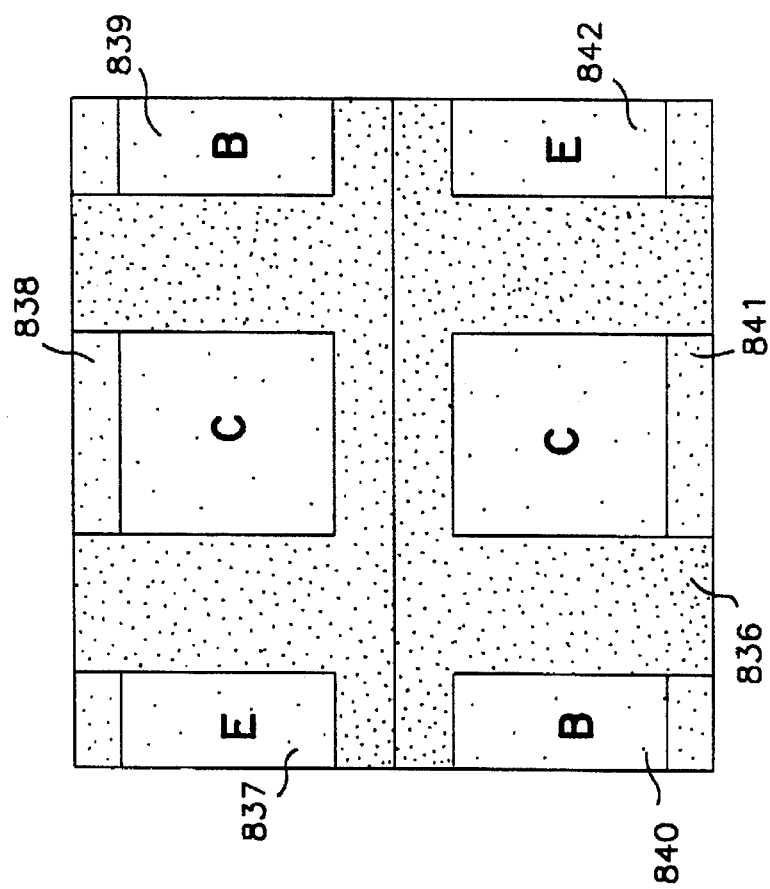
FIG. 81 illustrates a bottom view of a dual transistor module.

FIG. 81 illustrates a bottom view of a dual transistor module. This dual transistor module includes overlying layer 836 and emitter contact regions 837 and 842, collector contact regions 838 and 841, and base contact regions 839 and 840. Each contact region 837–842 may include a wrap-around contact region having a flange interface formed on one side of the dual transistor module. The configuration of each transistor of dual transistor module of FIG. 81 may be used for single transistor modules.

Figure 82:
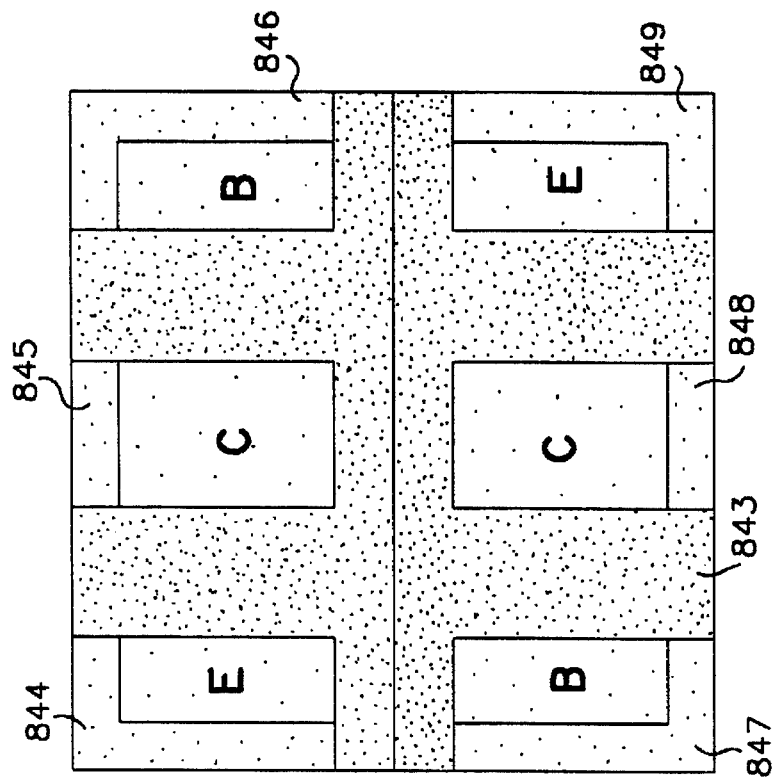
FIG. 82 illustrates a bottom view of another dual transistor module.

FIG. 82 illustrates a bottom view of another dual transistor module. This dual transistor module includes overlying layer 843 and emitter contact regions 844 and 849, collector contact regions 845 and 848, and base contact regions 846 and 847. Each contact region 844, 846–847, and 849 may include a wrap-around contact region having a flange interface formed on two sides of the dual transistor module. Contact regions 845 and 848 may each include a wrap-around contact region having a flange interface formed on one side of the dual transistor module. The configuration of each transistor of dual transistor module of FIG. 82 may be used for single transistor modules.

Figure 83:
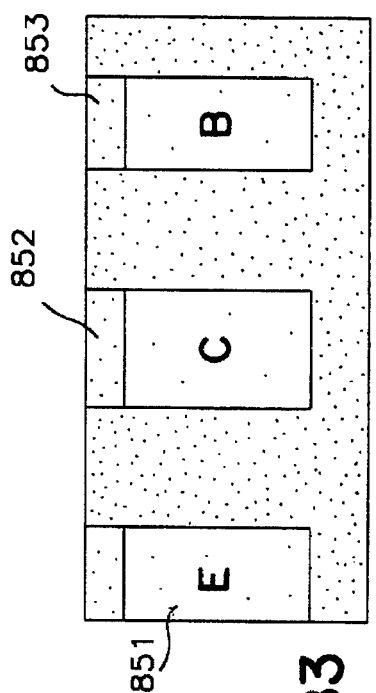
FIG. 83 illustrates a bottom view of yet another transistor module.

FIG. 83 illustrates a bottom view of yet another transistor module. The transistor module of FIG. 83 includes overlying layer 850, emitter contact region 851, collector contact region 852, and base contact region 853. Contact regions 851–853 may each include a wrap-around contact region having a flange interface formed on the same side of the transistor module as illustrated in FIG. 83.

Figure 84:
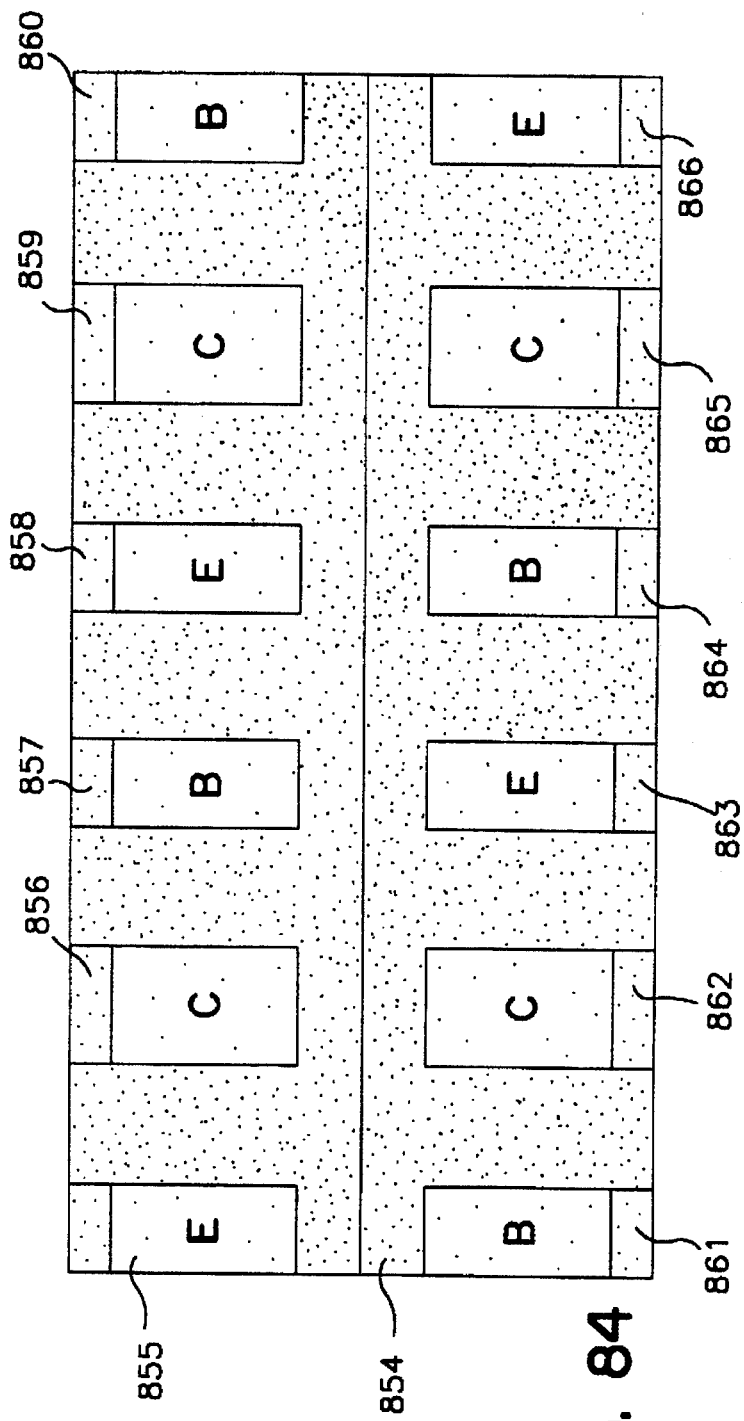
FIG. 84 illustrates a bottom view of a quad transistor module.

FIG. 84 illustrates a bottom view of a quad transistor module. The quad transistor module of FIG. 84 includes overlying layer 854 and contact regions 855, 856, 857, 858, 859, 860, 861, 862, 863, 864, 865, and 866. Each transistor of this quad transistor module corresponds to the transistor module illustrated in FIG. 83. That is, the quad transistor module of FIG. 84 is made up of four of the transistor module illustrated in FIG. 83.

Figure 85:
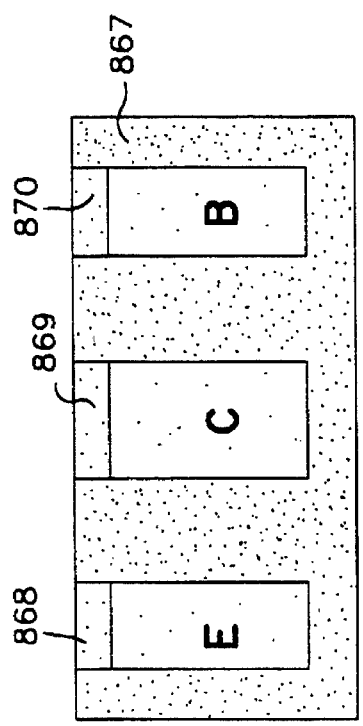
FIG. 85 illustrates a bottom view of yet another transistor module.

FIG. 85 illustrates a bottom view of yet another transistor module. The transistor module of FIG. 85 includes overlying layer 867, emitter contact region 868, collector contact region 869, and base contact region 870. Contact regions 868–870 may each include a wrap-around contact region having a flange interface formed on the same side of the transistor module, as illustrated fit FIG. 85.

Figure 86:
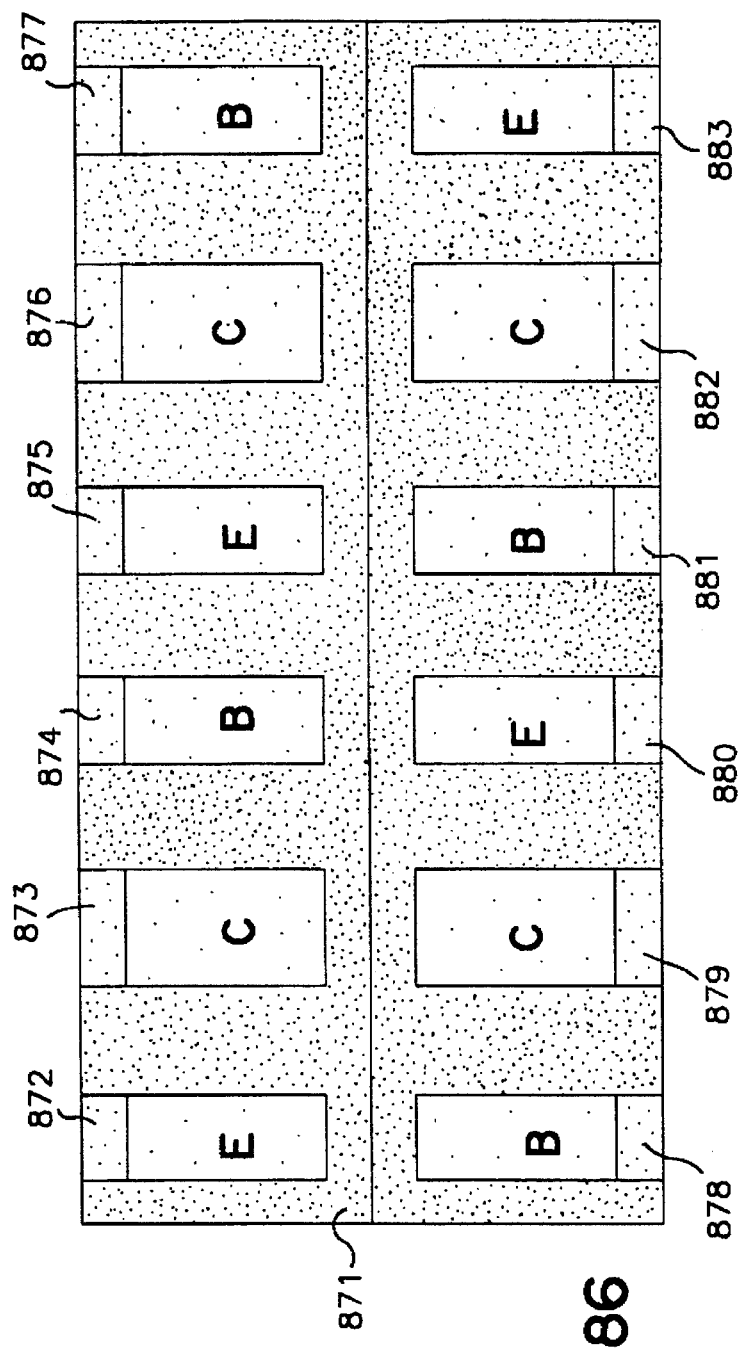
FIG. 86 illustrates a bottom view of another quad transistor module.

FIG. 86 illustrates a bottom view of another quad transistor module. The quad transistor module of FIG. 86 includes overlying layer 871 and contact regions 872, 873, 874, 875, 876, 877, 878, 879, 880, 881, 882, and 883. Each transistor of this quad transistor module corresponds to the transistor module illustrated in FIG. 85. That is, the quad transistor module of FIG. 86 is made up of four of the transistor module illustrated in FIG. 85.

INTEGRATED CIRCUIT

Figure 87:
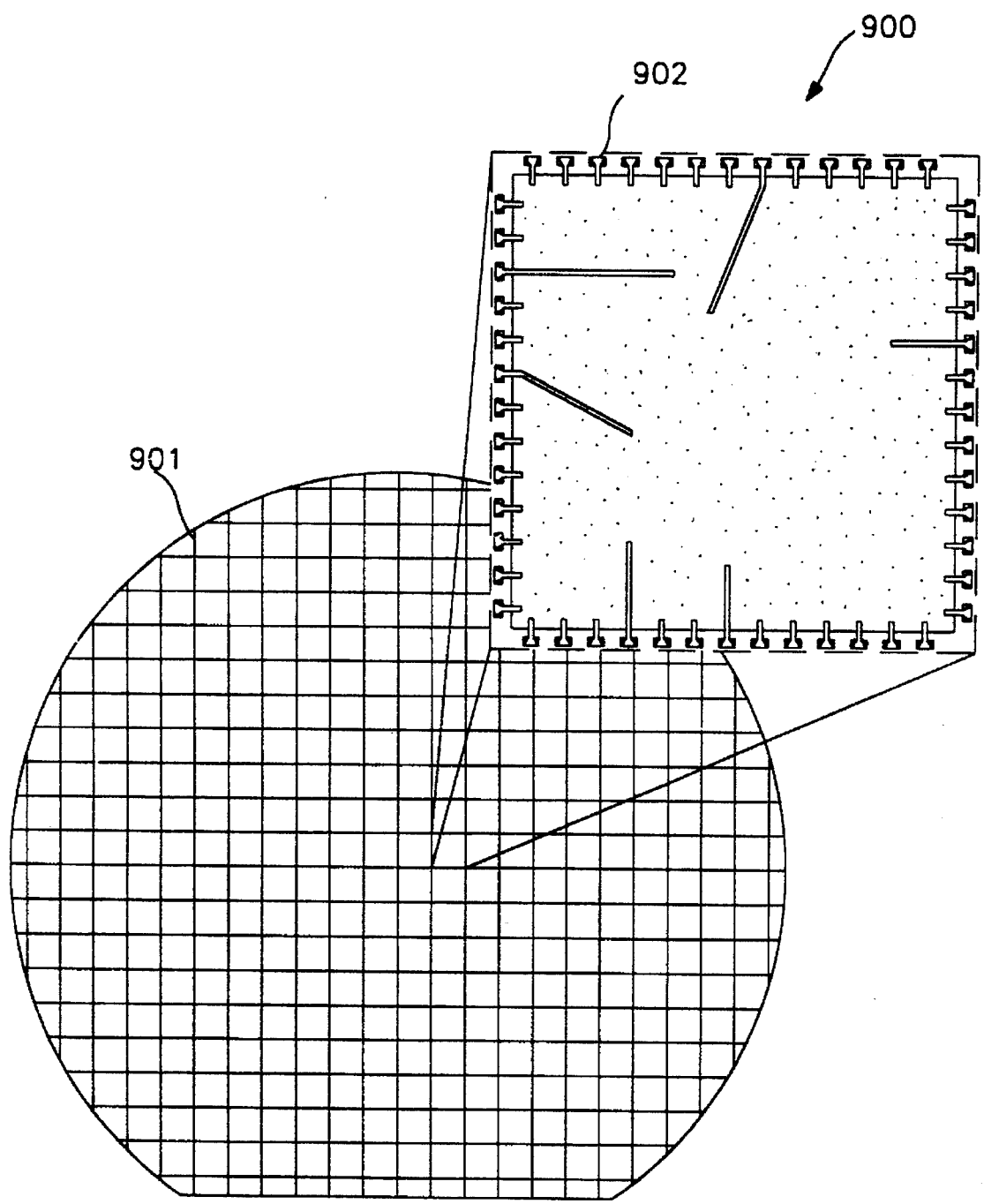
FIG. 87 illustrates an integrated circuit in relation to a semiconductor wafer.

FIG. 87 illustrates integrated circuit 900 in relation to a semiconductor wafer 901 from which integrated circuit 900 is fabricated. Integrated circuit 900 is one embodiment of the present invention. Integrated circuit 900 may include one or more transistors, diodes, resistors, and other circuit elements, for example. Integrated circuit 900 can be comprised of, for example, complementary metal oxide semiconductor (CMOS) circuits, bipolar circuits, or gallium arsenide circuits. Integrated circuit 900 is also referred to as an apparatus or as an electrical apparatus that includes one of a variety of elements or devices, such as those elements or devices described above. Integrated circuit 900 is also referred to as a device.

For one embodiment, integrated circuit 900 is a leadless monolithic device that is configured for surface mounting, for example, over a printed circuit board.

Integrated circuit 900 includes a number of contact leads, for example contact lead 902, arranged along a side or sides of integrated circuit 900. These contact leads provide integrated circuit 900 with electrical connection to external circuitry.

Figure 88:
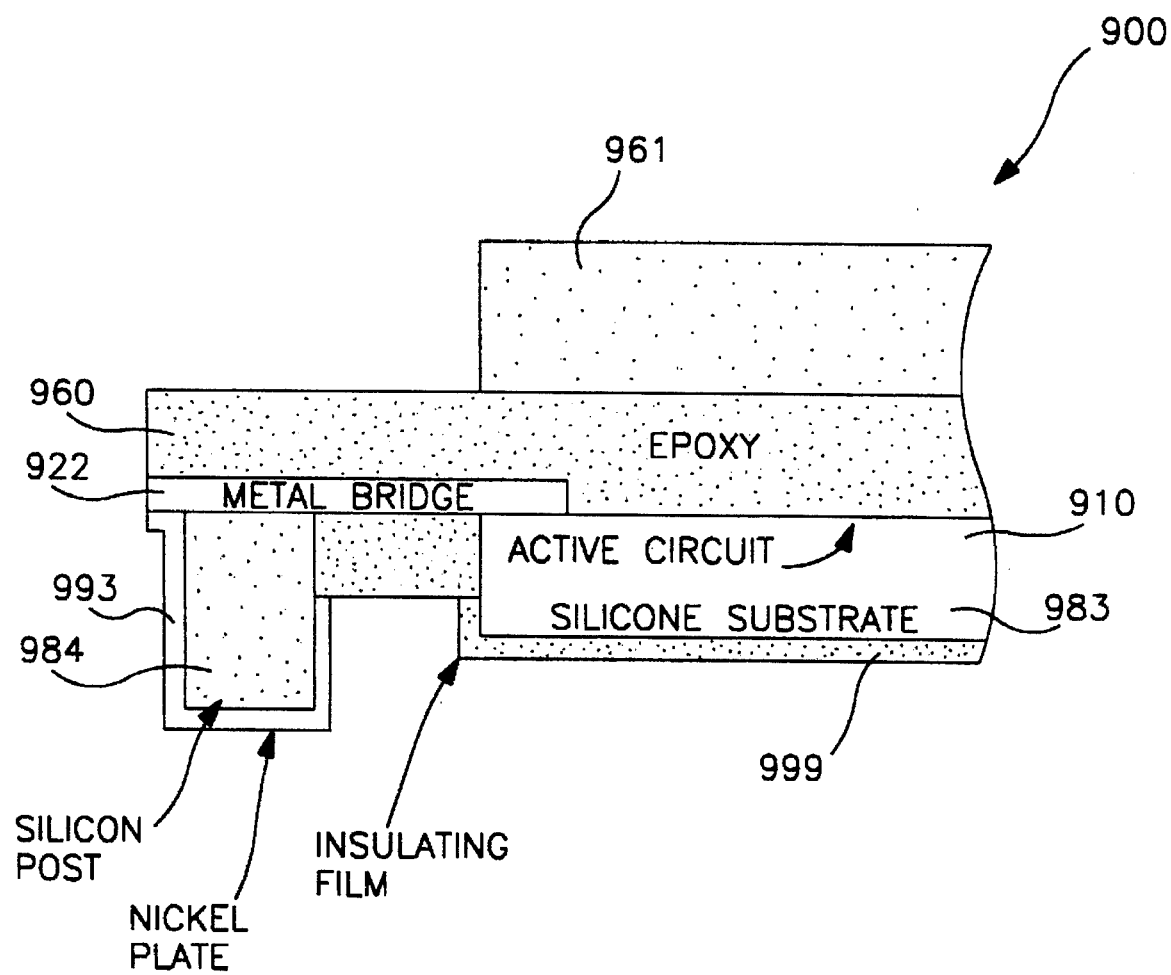
FIG. 88 illustrates a contact lead for an integrated circuit fabricated in accordance with the present invention.

FIG. 88 illustrates a contact lead for integrated circuit 900 fabricated in accordance with the present invention. Integrated circuit 900 of FIG. 88 includes semiconductor region 983 upon which an active circuit region 910 has been formed. Semiconductor region 983 may include silicon (Si) for example. An insulating film 999 coats the underside of semiconductor region 983. This insulating film is optional and may include any suitable insulative material.

Integrated circuit 900 also includes optional cap layer 961, overlying layer 960, interconnect 922, semiconductor post region 984, and contact layer 993.

Overlying layer 960 encapsulates the top sides of device semiconductor region 983, interconnect 922, and semiconductor post region 984. Overlying layer 960 also separates device semiconductor region 983 and semiconductor post region 984. Overlying layer 960 may include any suitable insulative material. For example, overlying layer 960 may include epoxy, silicon dioxide ($SiO_2$), silicon nitride ($Si_3N_4$), plastic, Teflon, a polyimide, or a glass. Overlying layer 960 may include other dielectric or insulative materials or combinations of materials as well.

Overlying layer 960 may serve to protect integrated circuit 900. Overlying layer 960 may serve as a passivation layer. Overlying layer 960 may also serve to mechanically hold integrated circuit 900 together.

Cap layer 961 covers overlying layer 960. Cap layer 961 may include, for example, silicon, polysilicon, amorphous silicon, plastic, glass, epoxy, alumina, or diamond. Other materials or combinations of materials may also be used for cap layer 961. Cap layer 961 is optional.

Cap layer 961 may serve to make integrated circuit 900 more rigid and rugged. Cap layer 961 may also serve as a heat conduit for integrated circuit 900.

Interconnect 922 is electrically coupled to active circuit region 910. Interconnect 922 together with contact layer 993 form a wrap-around flange interface contact region. Interconnect 922 is electrically coupled to contact layer 993. Interconnect 922 forms a conductive bridge from active circuit region 910 to contact layer 993.

Interconnect 922 may be comprised of titanium-tungsten (Ti-W) and gold (Au) in one embodiment. Ti-W may provide for a diffusion barrier layer. Other diffusion barrier materials may also be used here. Interconnect layer 922 may include other conductive materials as well. For example, aluminum (Al) or copper (Cu) may be used. Indium titanium oxide (ITO) or gold tin oxide (ATO) may also be used. Other metals or combinations of materials including metals may also be used.

Contact layer 993 covers the underside of and extends over the sidewall of semiconductor post region 984. Semiconductor post region 984 may comprise silicon (Si) for example.

Contact layer 993 is a connection point for integrated circuit 900 to external circuitry. Contact layer 993 is relatively flat on the underside of semiconductor post region 984. Contact layer 993 is also relatively large. These features help to ensure good contact to external circuitry.

Contact layer 993 may be comprised of titanium-tungsten (Ti-W) and nickel (Ni) in one embodiment. Contact layer 993 may be formed, for example, by plating Ni over semiconductor post region 984. Ni is preferable as Ni is well-suited for soldering. This Ni contact layer may be subsequently coated, for example, with a thin layer of gold (Au). Such a coating may serve to prevent the corrosion or oxidation of the Ni contact layer without destroying the soldering ability of Ni. For another embodiment, gold (Au) may be used in place of Ni. Contact layer 993 may include other conductive materials as well. For example, aluminum (Al) or copper (Cu) may be used. Indium titanium oxide (ITO) or gold tin oxide (ATO) may also be used. Other metals or combinations of materials inducting metals may also be used.

Interconnect 922 forms a flange interface with contact layer 993. The flange interface provides for a durable and reliable bond between the interconnect and the contact layer. For one embodiment, titanium-tungsten (Ti-W) is used as the bonding interconnect layer and as the bonding contact layer. That is, Ti-W is formed at the bottom of interconnect 922 and at the top of contact layer 993. As a result a durable and reliable intermetallic surface-to-surface bond is formed between interconnect 922 and contact layer 993 for this embodiment. For other embodiments, another material in place of Ti-W may be used in creating a bond between interconnect 922 and contact layer 993. Using the same material here may facilitate the formation of a durable and reliable bond between interconnect 922 and contact layer 993. For still other embodiments, the materials used to bond interconnect 922 with contact layer 993 may be different.

Integrated circuit 900 can be die-attached to external circuitry using solder or epoxy.

For integrated circuit 900 of FIG. 88, optional cap layer 961 may include approximately 0.004 in. of silicon (Si) in thickness. Overlying layer 960 may include approximately 0.003 in. of epoxy in thickness (between cap layer 961 and active circuit region 910). Device semiconductor region 983, together with active circuit region 910, may be approximately 0.003 in. in thickness. Contact layer 993 may include approximately 0.0005 in. of nickel (Ni) plate in thickness. The bottom of semiconductor post 984 may extend approximately 0.005 in. from the top of active circuit region 910. Integrated circuit 900 may be fabricated with features having other dimensions as well.

The method of FIG. 37 may also be used in fabricating integrated circuits, such as the integrated circuit illustrated in FIG. 88. So as to better explain the exemplary application of the method of FIG. 37 in fabricating integrated circuits, FIGS. 89–106 will be used to illustrate the various steps of the method of FIG. 37.

FIG. 89 illustrates a top view of a semiconductor wafer used to fabricate the integrated circuit of FIG. 88. FIG. 90 is a cross-sectional side view of the wafer of FIG. 89.

In performing the method of FIG. 37, a semiconductor substrate is provided. This substrate is illustrated, for example, in FIGS. 89–90 as substrate 1000. Substrate 1000 may be a silicon (Si) substrate, but alternatively a variety of other types of semiconductor substrates may be used.

The wafer of FIGS. 89–90 includes substrate 1000 which has active circuit regions 1001–1002 and substrate contact regions 1005–1006. Substrate 1000 as illustrated in FIGS. 89–90 is used to fabricate two integrated circuits. The number of devices is exemplary and has been chosen so as to provide for a clearer understanding of the present invention. Any number of devices may be formed using the same wafer and may depend, for example, on the size of the wafer. Substrate contact regions 1005–1006 are optional.

Figures 91, 92:
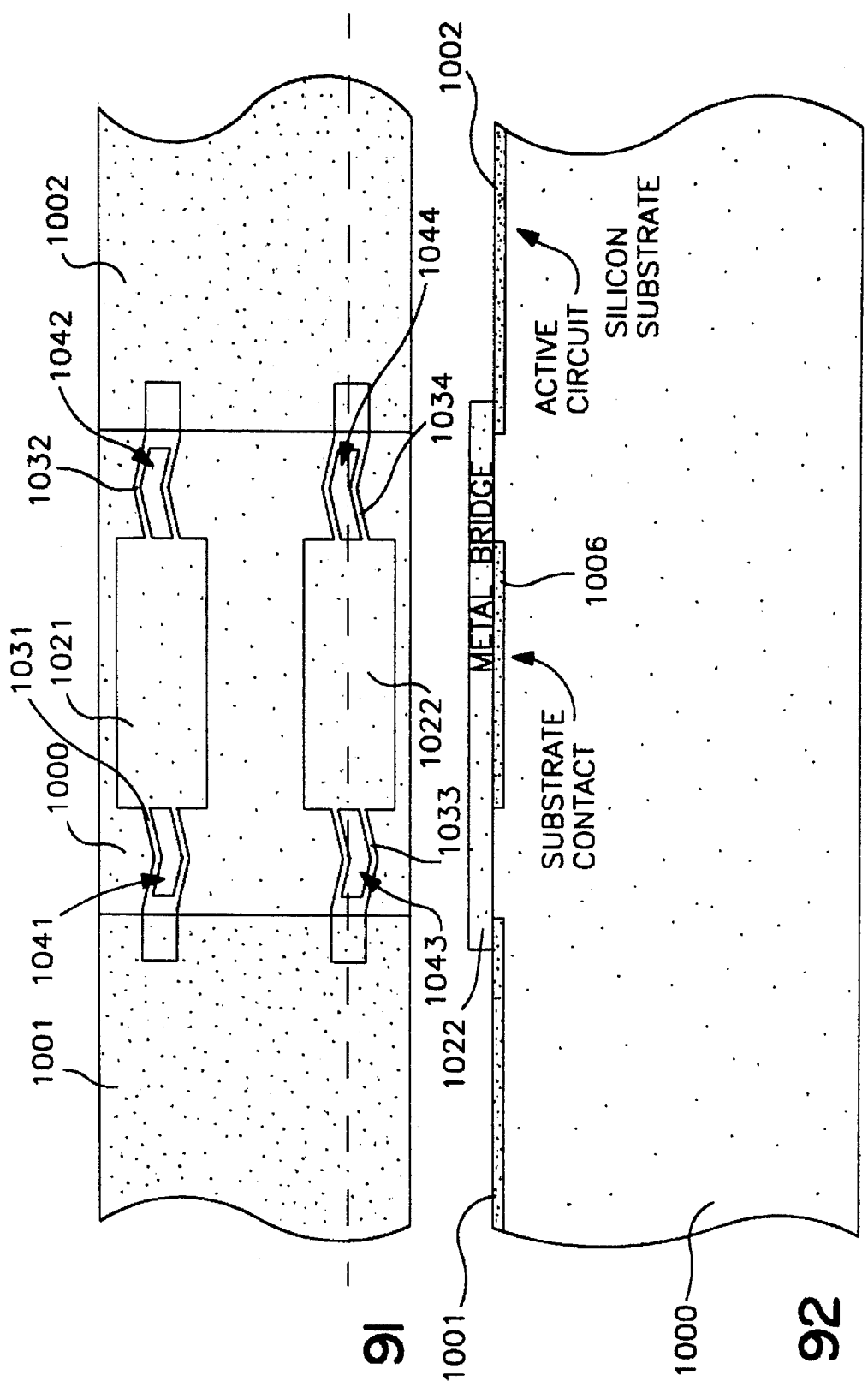
FIG. 91 illustrates a top view of the wafer of FIG. 89 after interconnect layers have been formed over the wafer.
FIG. 92 illustrates a cross-sectional side view of the wafer of FIG. 91.

For step 600 of FIG. 37, interconnects 1021–1022 are formed over the wafer. This is illustrated in FIGS. 91–92. FIG. 91 illustrates a top view of the wafer of FIG. 89 after interconnect layers 1021–1022 have been formed over the wafer. FIG. 92 illustrates a cross-sectional side view of the wafer of FIG. 91.

Interconnects 1021–1022 are also referred to as interconnect layers. Interconnect 1021 includes bridge portions 1031–1032. Likewise, interconnect 1022 includes bridge portions 1033–1034. Bridge portions 1031–1034 include gaps 1041–1044, respectively. For an alternative embodiment, bridge portions 1031–1034 do not contain gaps 1041–1044, respectively, but rather are solid bridges. Interconnects 1021–1022 provide for an electrical connection to active circuit regions 1001–1002.

For one embodiment, interconnects 1021–1022 are formed by first forming a conductor layer over the wafer. For example, titanium-tungsten (Ti-W) may be sputter deposited over the wafer. This Ti-W layer may serve to provide for a diffusion barrier layer for interconnects 1021–1022. Other diffusion barrier materials may also be used. Gold (Au) is then sputter deposited over the Ti-W layer. This Au layer may serve to facilitate the pattern plating of gold, for example, in forming interconnects 1021–1022. A patterned mask layer, for example comprising photoresist, may then be formed over the wafer. This patterned mask layer is used in pattern plating gold (Au) approximately 10 µm in thickness over the Ti-W-Au layers to create interconnects 1021–1022. After this pattern plating process, the patterned mask layer is removed. Portions of the Ti-W-Au layers that are formed on the surface of the wafer may then be etched, leaving interconnects 1021–1022, as illustrated in FIGS. 91–92. Interconnects 1021–1022 as a result contain Ti-W and Au.

Interconnects 1021–1022 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, interconnects 1021–1022 may be formed using any suitable technique. As another example, a layer of the material or materials used to create interconnects 1021–1022 may be deposited over the wafer and subsequently patterned to create interconnects 1021–1022, Photolithography and etch techniques, for example, may be used to pattern interconnects 1021–1022.

For another embodiment, separate interconnects may be formed over the wafer. That is, a separate interconnect may be formed over the wafer for each integrated circuit contact lead to be fabricated. Instead of having interconnect 1021 with two separate bridge portions 1031–1032, for example, two separate interconnects may be formed over the wafer with bridge portions 1031–1032, respectively.

Figure 93:
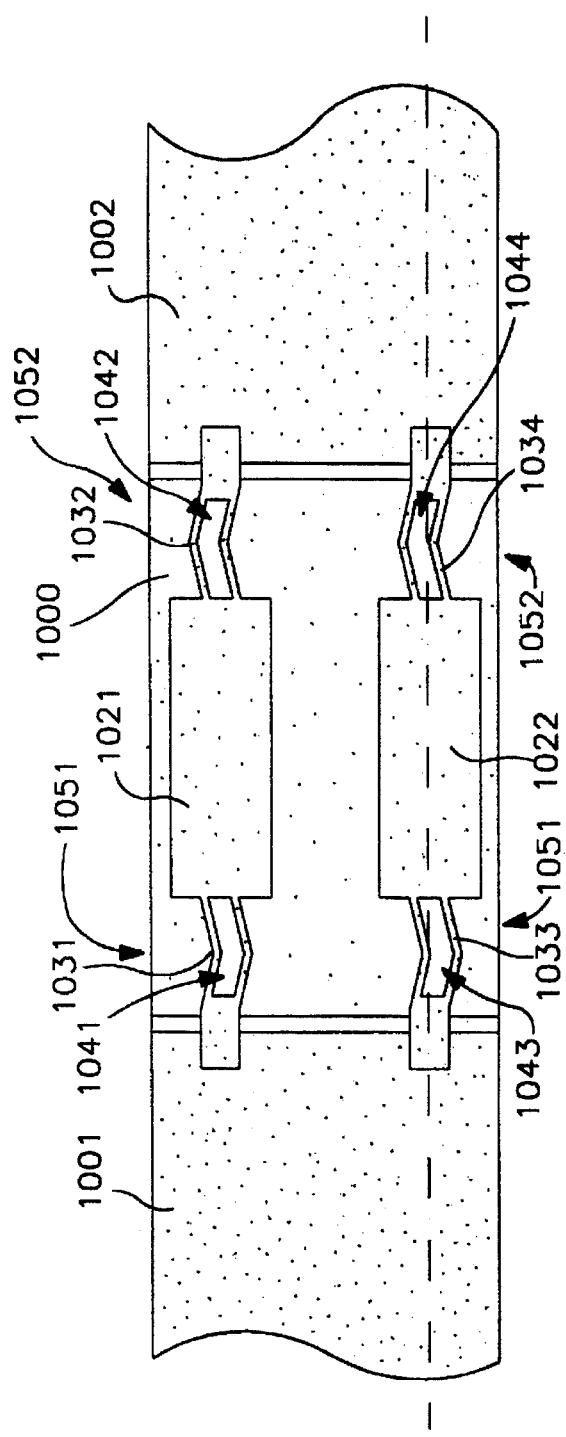
FIG. 93 illustrates a top view of the wafer of FIG. 91 after trenches have been formed from the substrate of the wafer.
Figure 94:
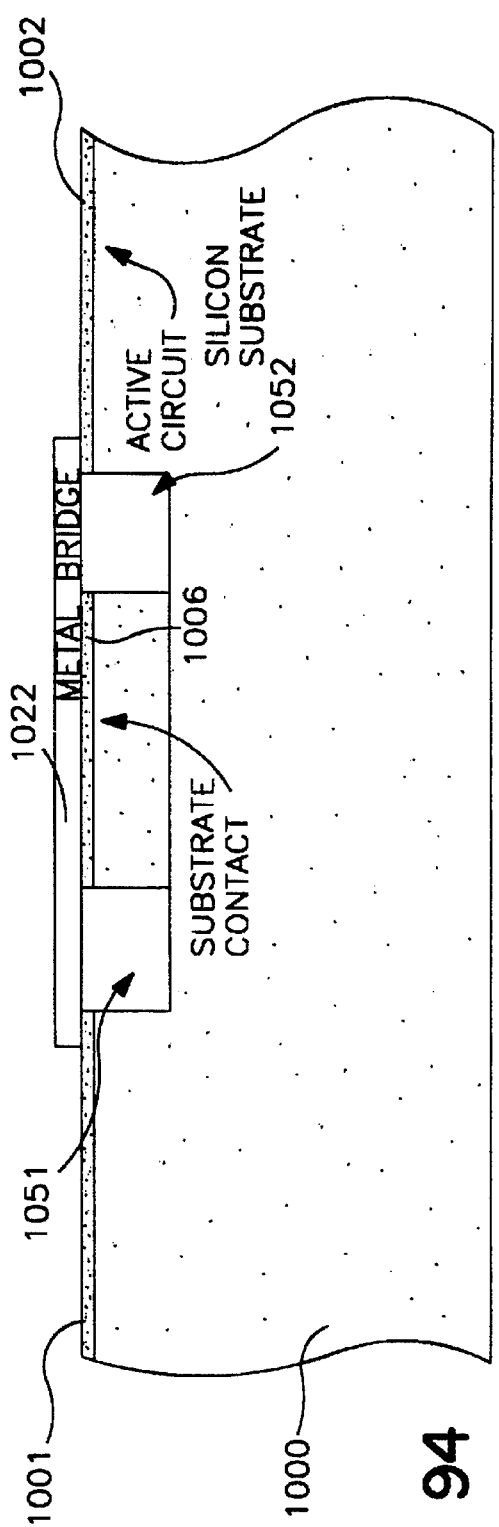
FIG. 94 illustrates a cross-sectional side view of the wafer of FIG. 93.

For step 605 of FIG. 37, moats or trenches 1051–1052 are formed from substrate 1000. In forming trenches 1051–1052, any suitable processing technique may be used. This is illustrated in FIGS. 93–94. FIG. 93 illustrates a top view of the wafer of FIG. 91 after trenches 1051–1052 have been formed from the substrate of the wafer. FIG. 94 illustrates a cross-sectional side view of the wafer of FIG. 93. Trenches 1051–1052 may be formed similarly as the trenches are formed for transistor modules as described above.

The material of substrate 1000 that lies beneath bridge portions 1031–1034 is removed in forming trenches 1051–1052. Gaps 1041–1044 may serve to facilitate the removal of underlying substrate 1000 in etching trenches 1051–1052 by allowing the etchant to flow through bridge portions 1031–1034, respectively. For an alternative embodiment discussed above, bridge portions 1031–1034 may be solid bridges without gaps 1041–1044. Bridge portions 1031–1034 may need to be thinner in width, though, for this alternative embodiment so as to ensure underlying substrate 1000 is removed beneath bridge portions 1031–1034 in forming trenches 1051–1052.

Trenches 1051–1052 essentially provide for a top-side separation of semiconductor for each integrated circuit contact lead to be created from the wafer, providing for a device semiconductor region and a semiconductor post region. This separation of semiconductor will be described in more detail below.

Figure 95:
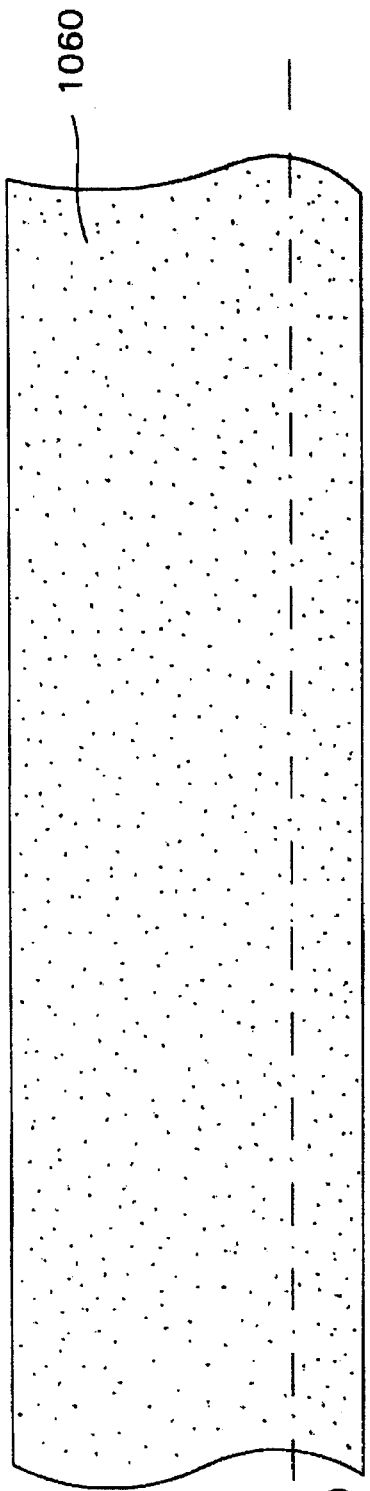
FIG. 95 illustrates a top view of the wafer of FIG. 93 after an overlying layer has been formed over the wafer.
Figure 96:
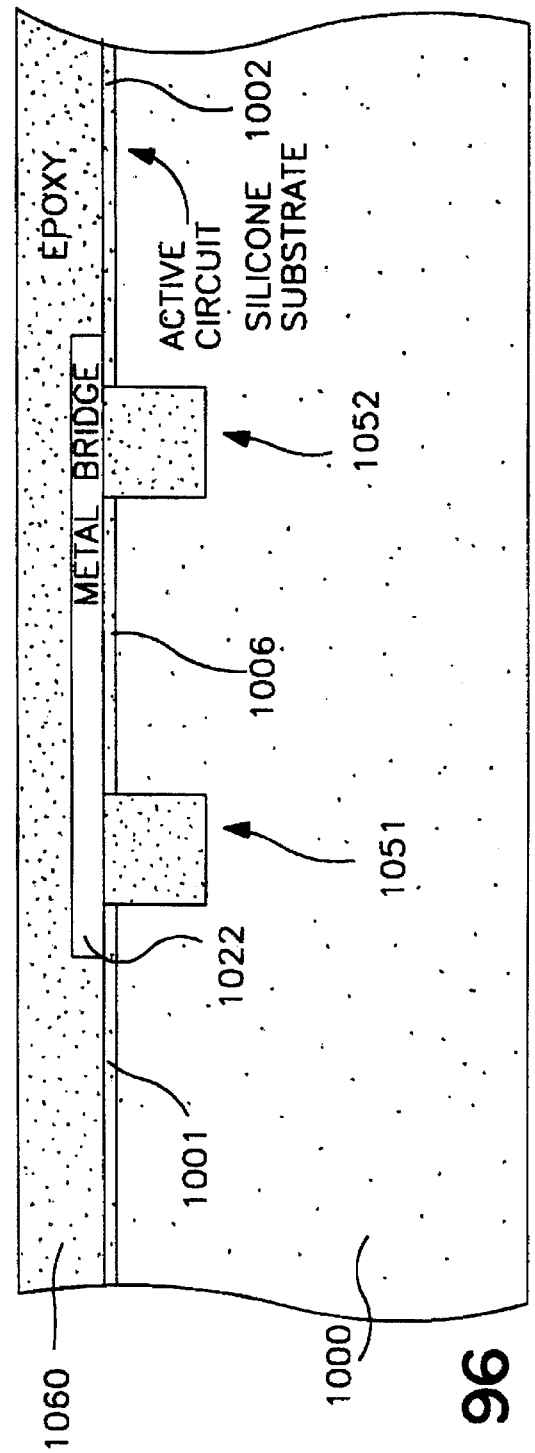
FIG. 96 illustrates a cross-sectional side view of the wafer of FIG. 95.

For step 610 of FIG. 37, overlying layer 1060 is formed over the wafer as illustrated in FIGS. 95–96. FIG. 95 illustrates a top view of the wafer of FIG. 93 after overlying layer 1060 has been formed over the wafer. FIG. 96 illustrates a cross-sectional side view of the wafer of FIG. 94. Overlying layer 1060 substantially encapsulates the entire surface of the wafer and substantially fills trenches 1051–1052. For one embodiment, overlying layer 1060 includes epoxy that has been centrifuged over the wafer. A controlled vacuum environment may also be used to spin-on epoxy. For alternative embodiments, overlying layer 1060 may include silicon dioxide ($SiO_2$), silicon nitride ($Si_3N_4$), plastic, Teflon, a polyimide, or glass. Overlying layer 1060 may be formed using other dielectric or insulative materials or combinations of materials, and may be formed using any suitable technique.

Overlying layer 1060 may serve a protective role. Overlying layer 1060 may serve as a passivation layer. Overlying layer 1060 may also serve a mechanical role in holding together components of the integrated circuits fabricated from the wafer.

Figure 97:
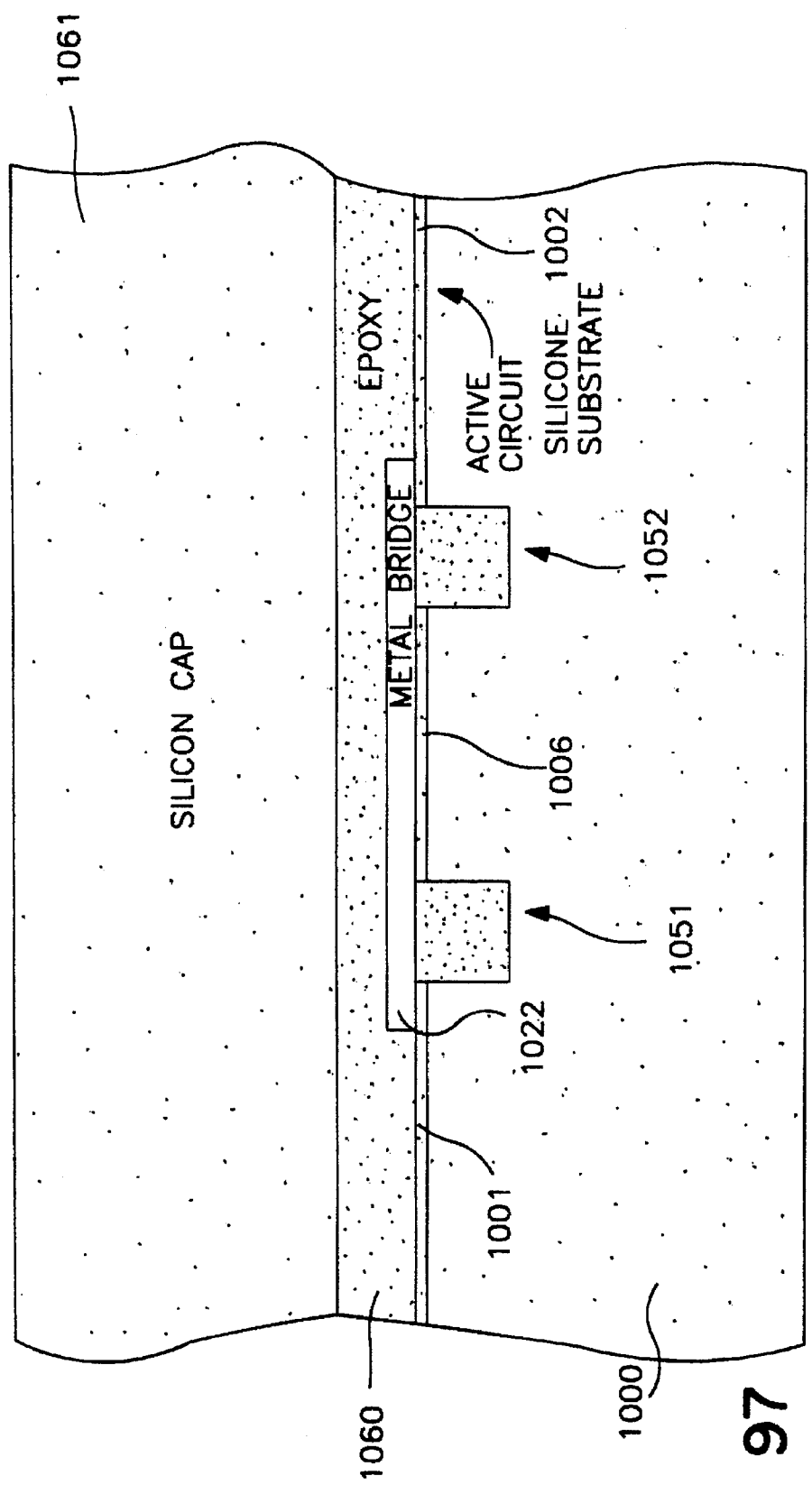
FIG. 97 illustrates a cross-sectional side view of the wafer of FIG. 96 after a cap layer has been formed over the wafer.

A cap layer 1061 may then be formed over overlying layer 1060. This is illustrated in FIG. 97. FIG. 97 illustrates a cross-sectional side view of the wafer of FIG. 96 after cap layer 1061 has been formed over the wafer.

Cap layer 1061 may contain, for example, silicon, polysilicon, amorphous silicon, plastic, glass, epoxy, alumina, or diamond. Other materials or combinations of materials may also be used for cap layer 1061.

Cap layer 1061 is optional. Cap layer 1061 may serve to make each integrated circuit created from the wafer more rigid and rugged. Cap layer 1061 may also serve as a heat conduit for each integrated circuit fabricated from the wafer.

Figure 98:
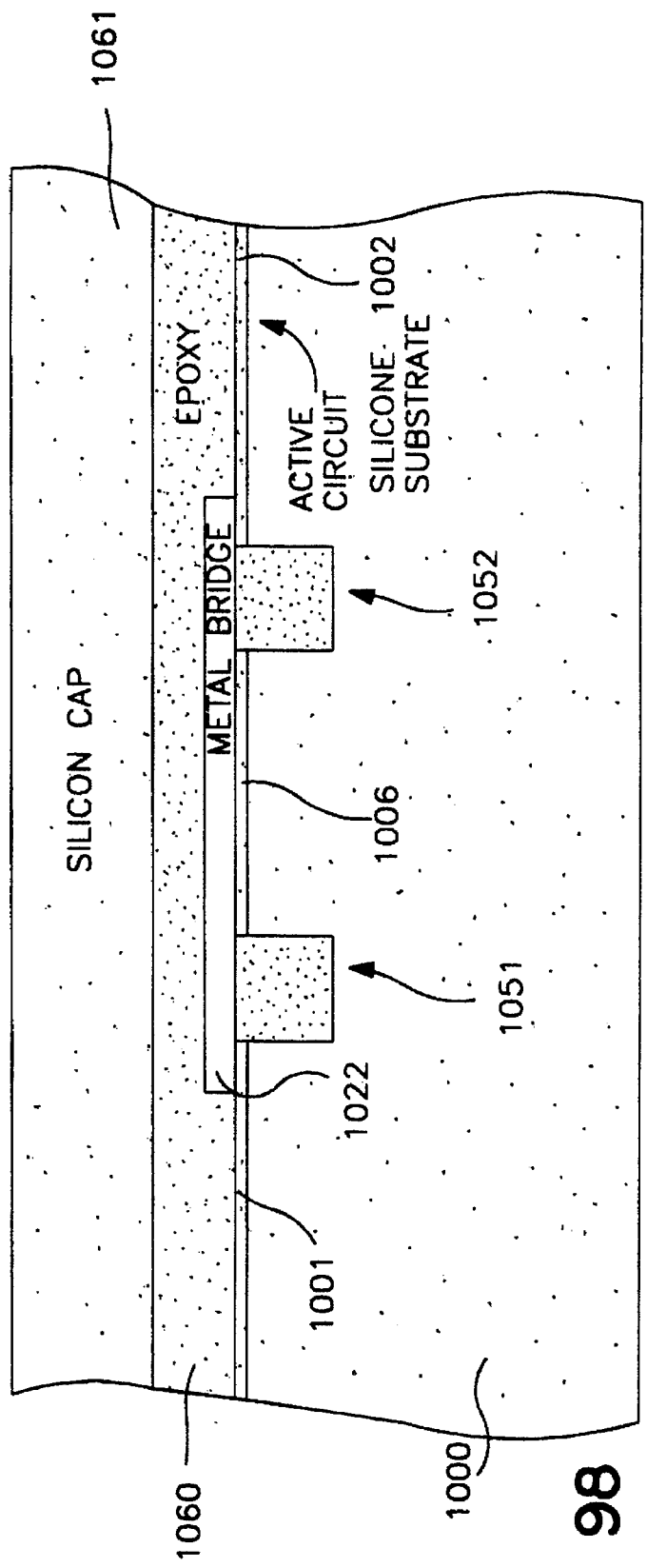
FIG. 98 illustrates a cross-sectional side view of the wafer of FIG. 97 after the cap layer has been thinned.

Cap layer 1061 may then be thinned, as illustrated in FIG. 98. FIG. 98 illustrates a cross-sectional side view of the wafer of FIG. 97 after cap layer 1061 has been thinned.

Cap layer 1061 may be thinned here using any suitable technique. For example, cap layer 1061 may be sandblasted. Cap layer 1061 may also be etched using a suitable etch technique and chemistry or, alternatively, may be thinned by grinding it. Cap layer 1061 may also be thinned by lapping.

Cap layer 1061 may also be patterned. For example, Cap layer 1061 may be patterned so as to appear as cap layer 961 of integrated circuit 900 illustrated in FIG. 88.

Figure 99:
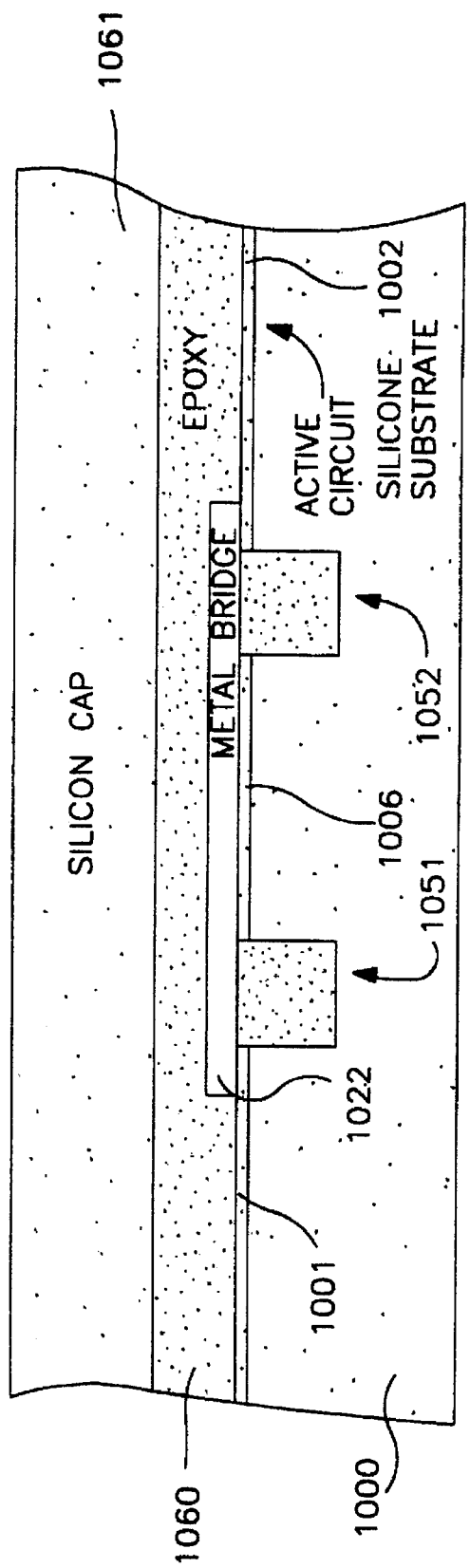
FIG. 99 illustrates a cross-sectional side view of the wafer of FIG. 98 after the underside of the wafer has been thinned.

For step 615 of FIG. 37, the backside or underside of the wafer is thinned as illustrated in FIG. 99 as compared to the wafer illustrated in FIG. 98. FIG. 99 illustrates a cross-sectional side view of the wafer of FIG. 98 after the underside of the wafer has been thinned.

The underside of substrate 1000 may be thinned here using any suitable technique. For example, the underside of substrate 1000 may be sandblasted. The underside of substrate 1000 may also be etched using a suitable etch technique and chemistry or, alternatively, may be thinned by grinding it. The underside of substrate 1000 may also be thinned by lapping.

Figure 100:
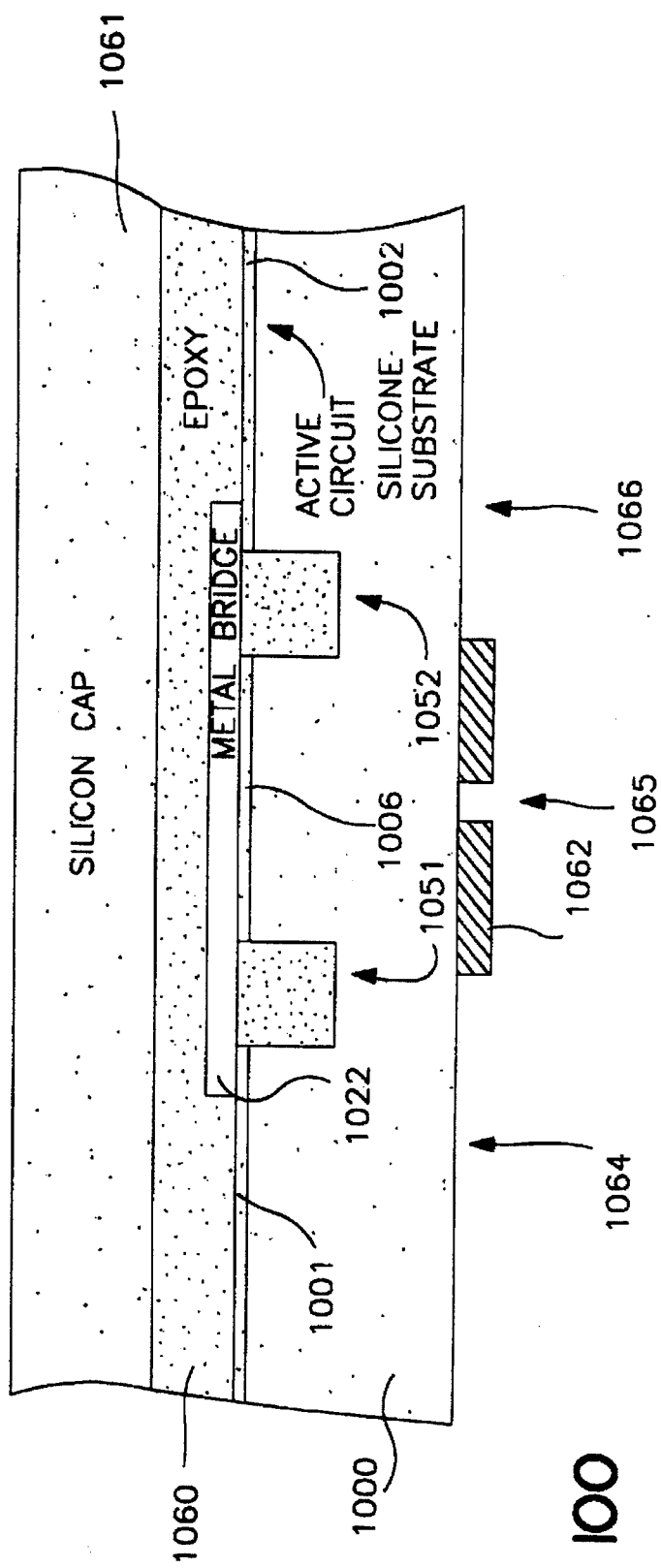
FIG. 100 illustrates a cross-sectional side view of the wafer of FIG. 99 after a mask layer has been formed over the underside of the wafer.
Figure 101:
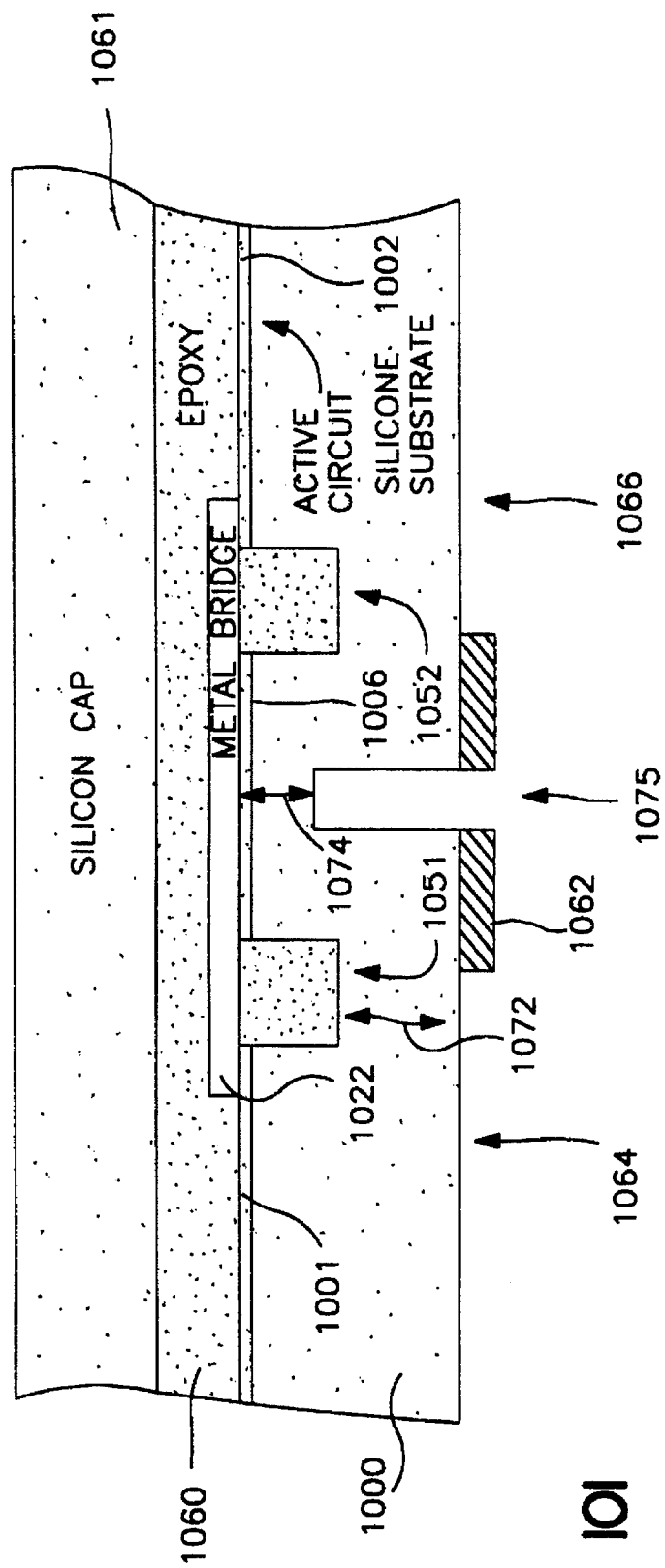
FIG. 101 illustrates a cross-sectional side view of the wafer of FIG. 100 after the underside of the wafer has been sawed.
Figure 102:
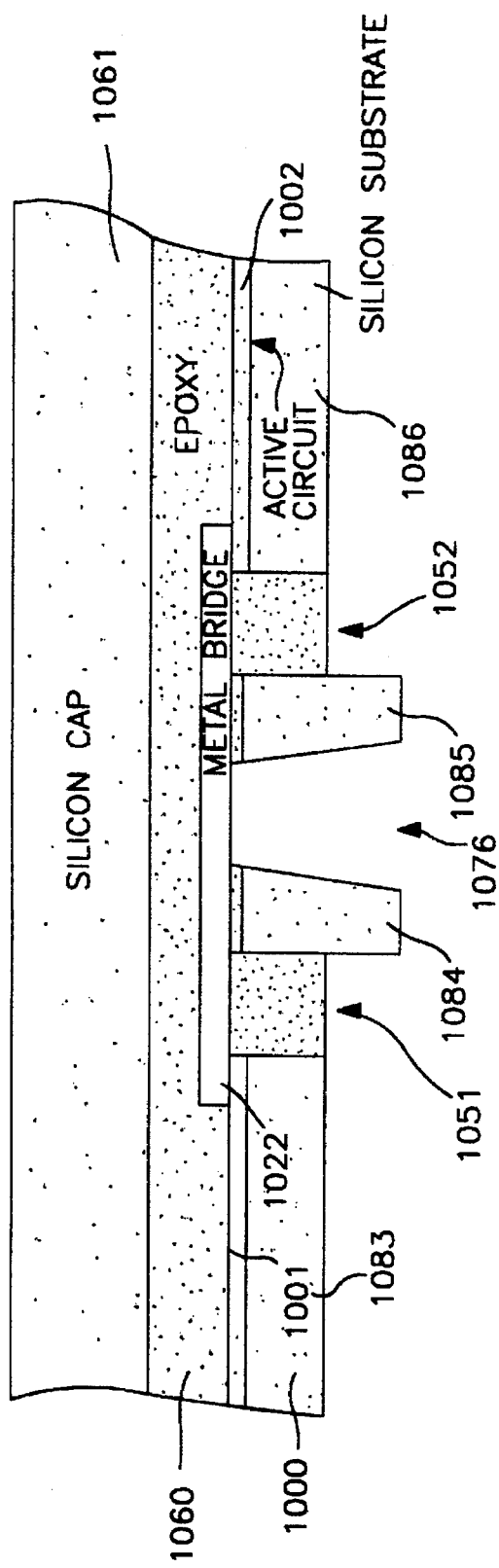
FIG. 102 illustrates a cross-sectional side view of the wafer of FIG. 101 after the underside of the wafer has been etched and after the underside mask layer has been removed.

For step 620 of FIG. 37, a saw-and-etch process is used to pattern the underside of the wafer. One embodiment of this step is illustrated in FIGS. 100–102. A patterned mask layer 1062 is first formed over the underside of the wafer. This is illustrated in FIG. 100. FIG. 100 illustrates a cross-sectional side view of the wafer of FIG. 99 after mask layer 1062 has been formed over the underside of the wafer.

Mask layer 1062 may comprise photoresist, for example, that has been spun-on. Other suitable mask materials, including other photosensitive materials, may also be used and may be formed over the underside of the wafer using any suitable technique.

As illustrated in FIG. 100, mask layer 1062 is patterned to define scribe line region 1065, which defines where the wafer will later be separated. Mask layer 1062 is also patterned to define underside regions 1064 and 1066 which lie beneath at least trenches 1051–1052 formed in substrate 1000. Mask layer 1062 may be patterned using any suitable patterning technique. For example, mask layer 1062 may be patterned using photolithography techniques. Mask layer 1062 is also patterned to define each semiconductor post for each contact lead to be formed.

The underside of the wafer is then sawed along scribe line region 1065 to create pit 1075. This is illustrated in FIG. 101. FIG. 101 illustrates a cross-sectional side view of the wafer of FIG. 100 after the underside of the wafer has been sawed.

For one embodiment, the underside of the wafer may be sawed using as a guide scribe line region 1065 as defined by mask layer 1062 to create pit 1075. For another embodiment, mask layer 1062 may be patterned to define only underside regions 1064 and 1066. That is, mask layer 1062 in this other embodiment would not be initially patterned to define scribe line region 1065. The sawing of the underside of the wafer to create pit 1075 would then serve to pattern mask layer 1062 so as to define these scribe line regions, as illustrated in FIG. 101.

The wafer is not entirely separated in sawing the underside of the wafer to create pit 1075, as illustrated in FIG. 101. Pit 1075 is approximately 2–3 mils in width. Pit 1075 may also have other widths. Preferably, pit 1075 is sawed such that the distance between the top surface of substrate 1000 and the top of pit 1075 (as illustrated in FIG. 101 as distance 1074) is substantially equal to the distance between the bottom of trench 1051, for example, and the bottom of substrate 1000 (as illustrated in FIG. 101 as distance 1072). This may serve to facilitate the later etch of substrate 1000, as the depth of substrate 1000 to be etched from scribe line region 1065 and from underside regions 1064 and 1066 is then about the same.

After creating pit 1075, substrate 1000 is etched from the underside of the wafer in scribe line region 1065 and in underside regions 1064 and 1066 as defined by mask layer 1062 to create trench 1076 and to remove portions of substrate 1000, particularly those beneath trenches 1051 and 1052. This is illustrated in FIG. 102. FIG. 102 illustrates a cross-sectional side view of the wafer of FIG. 101 after the underside of the wafer has been etched and after underside mask layer 1062 has been removed.

Any suitable etch technique and chemistry may be used here to create trench 1076 and to remove portions of substrate 1000 beneath trenches 1051 and 1052. Trenches 1051, 1052, and 1076 now serve to separate substrate 1000. As illustrated in FIG. 102, trenches 1051, 1052, and 1076 serve to separate substrate 1000 into substrate regions 1083, 1084, 1085, and 1086. Each semiconductor post for each contact lead has also been formed.

Mask layer 1062 is then removed from the underside of the wafer as illustrated in FIG. 102. Any suitable technique may be used here to remove mask layer 1062.

A portion of each interconnect 1021–1022 becomes exposed in trench 1076 along scribe line region 1065 after this etch. This is illustrated in FIG. 102. Overlying layer 1060, which fills trenches 1051–1052, has become exposed on the underside of the wafer, as illustrated in FIG. 102.

A complete separation of a device semiconductor region and a semiconductor post region has thus been created for each contact lead to be fabricated from the wafer.

For an alternative embodiment, the separation of semiconductor described above may be accomplished differently. For example, rather than forming trenches 1051–1052, suitable underside trenches may be formed by removing the substrate material through the entire thickness of the substrate, exposing overlying layer 1060. For this alternative embodiment, however, bridge portions of interconnects 1021–1022 may be exposed at the underside of the wafer. A material resistive to corrosion is preferably used in forming interconnects 1021–1022 for this embodiment, as overlying layer 1060 may not fully encapsulate interconnects 1021–1022 to protect them.

Figure 103:
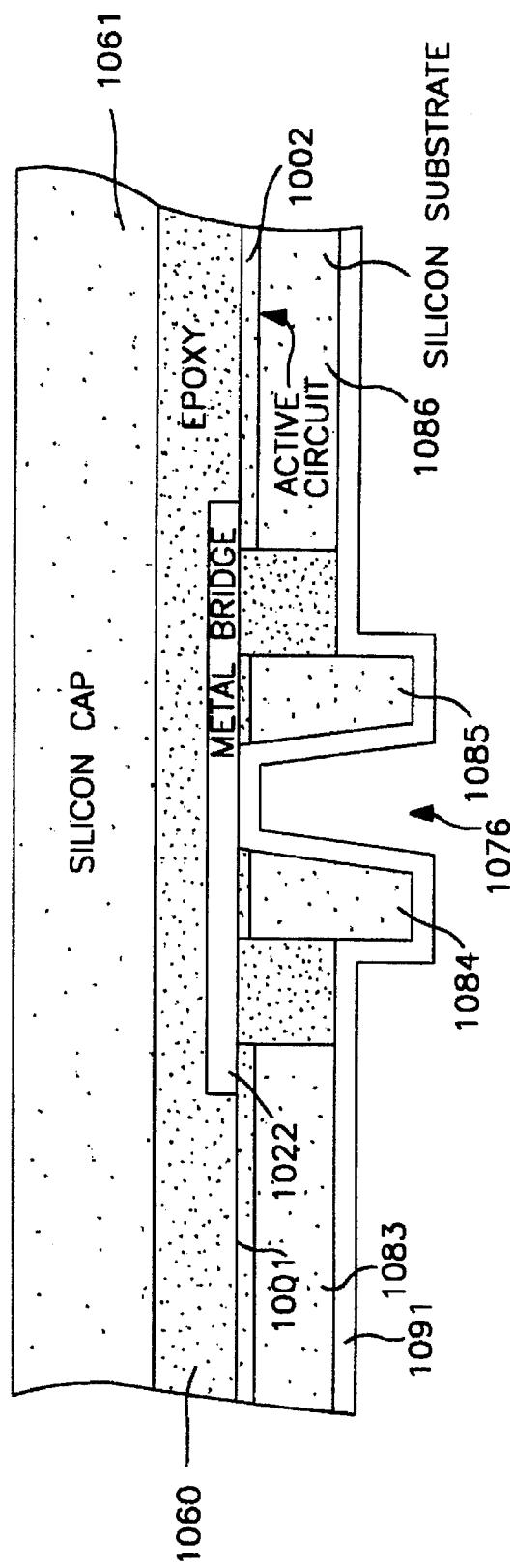
FIG. 103 illustrates a cross-sectional side view of the wafer of FIG. 102 after a contact layer has been formed over the underside of the wafer.
Figure 104:
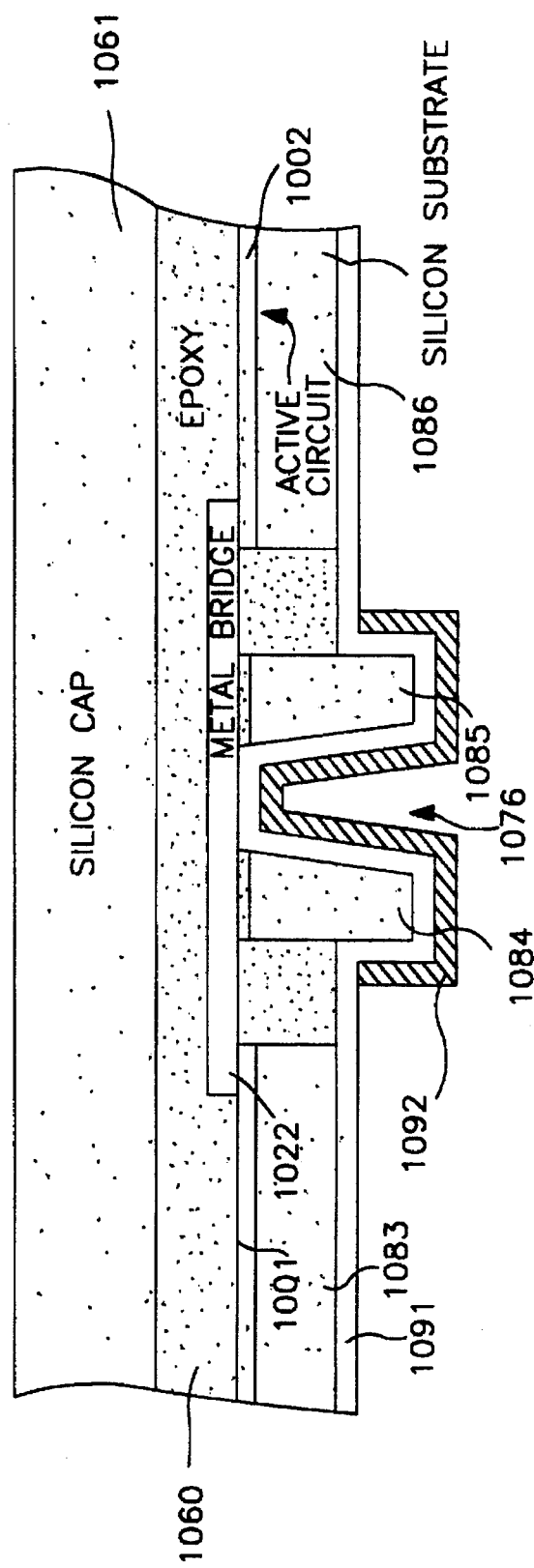
FIG. 104 illustrates a cross-sectional side view of the wafer of FIG. 103 after a mask layer has been formed over the underside of the wafer.
Figure 105:
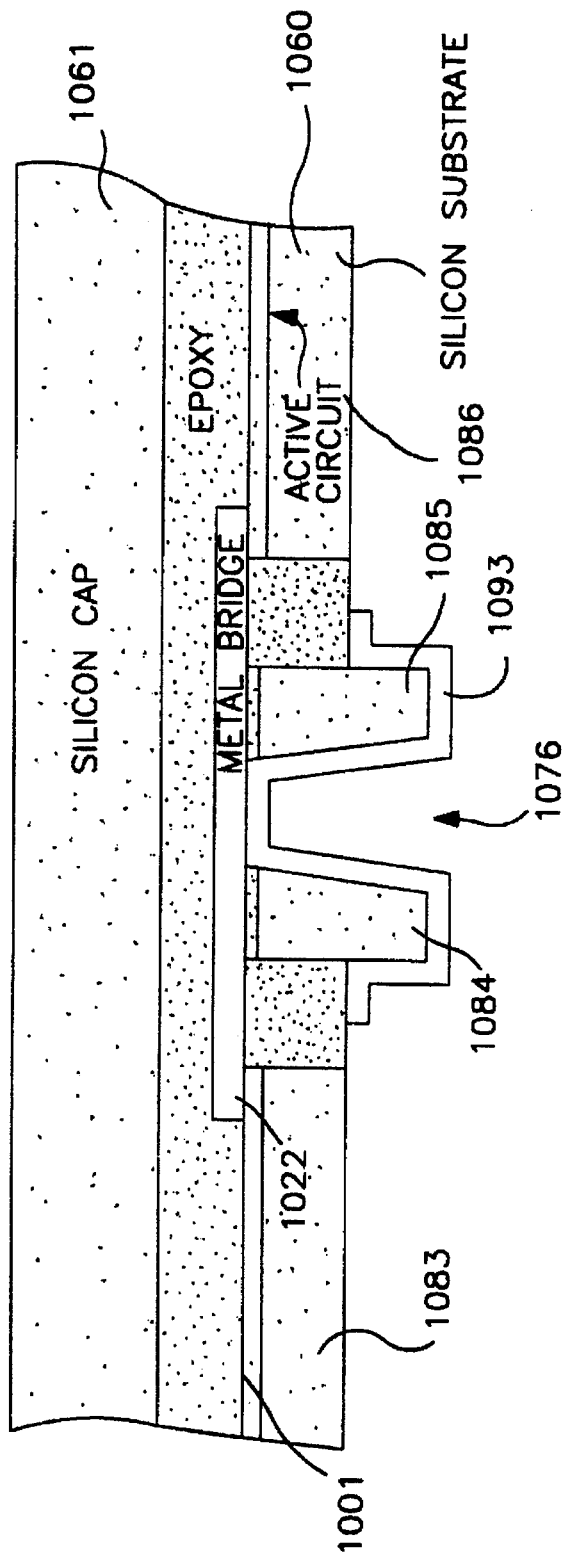
FIG. 105 illustrates a cross-sectional side view of the wafer of FIG. 104 after the contact layer has been patterned and after the underside mask layer has been removed.

For step 625 of FIG. 37, a patterned contact layer is formed over the underside of the wafer to provide contact regions for each contact lead to be created from the wafer. One embodiment of this step is illustrated in FIGS. 103–105. For this embodiment, a contact layer 1091 is first formed over the underside of the wafer. FIG. 103 illustrates a cross-sectional side view of the wafer of FIG. 102 after a contact layer has been formed over the underside of the wafer.

For one embodiment, titanium-tungsten (Ti-W) may be sputter deposited over the wafer. This Ti-W layer may serve to provide for a diffusion barrier layer for the patterned contact layer. Nickel (Ni) may then be sputter deposited over the underside of the wafer. Ni is preferable because it is well-suited for soldering. This Ni of the contact layer may be subsequently coated, for example, with a thin layer of gold (Au). Such a coating may serve to prevent the corrosion or oxidation of the contact layer without destroying the soldering ability of Ni. For another embodiment, gold (Au) may be formed over the underside of the wafer in place of Ni. Any suitable conductive material or combination of materials may also be used to form the contact layer. Furthermore, any suitable technique may be used to form this contact layer.

The contact layer conforms to the contour of the underside of the wafer. Particularly, contact layer 1091 is formed along the sides and bottom of underside trench 1076, as illustrated in FIG. 103. For one embodiment, portions of contact layer 1091 form a durable and reliable surface-to-surface bond with the portions of interconnects 1021–1022 which are exposed in underside trench 1076 when contact layer 1091 is formed over the underside of the wafer. The material used for interconnects 1021–1022 that is exposed in trench 1076 is preferably the same as the material used for contact layer 1091 that is to come in contact with interconnects 1021–1022.

For one embodiment, titanium-tungsten (Ti-W) is used as the first interconnect layer and as the first contact layer. As a result, a durable and reliable intermetallic surface-to-surface bond is formed for this embodiment. For other embodiments, another material in place of Ti-W may be used in creating a bond between interconnects 1021–1022 and contact layer 1091. Using the same material here may facilitate the formation of a durable and reliable bond between interconnects 1021–1022 and contact layer 1091 in trench 1076. For still other embodiments, the materials used to bond interconnects 1021–1022 with contact layer 1091 may be different.

A patterned mask layer 1092 is then formed over the underside of the wafer, as illustrated in FIG. 104. FIG. 104 illustrates a cross-sectional side view of the wafer of FIG. 103 after mask layer 1092 has been formed over the underside of the wafer.

Mask layer 1092 may include photoresist. Mask layer 1092 may also include other suitable materials or combinations of materials as well. Mask layer 1092 may be deposited over the wafer and later patterned using photolithography techniques. Other process steps may also be used to form mask layer 1092. Mask layer 1092 is patterned to define underside regions 1064 and 1066.

Contact layer 1091 is then patterned into contact region 1093 using mask layer 1092 as a mask. Mask layer 1092 is subsequently removed. This is illustrated in FIG. 105. FIG. 105 illustrates a cross-sectional side view of the wafer of FIG. 104 after contact layer 1091 has been patterned and after mask layer 1092 has been removed.

Contact layer 1091 is etched from underside regions 1064 and 1066 as defined by mask layer 1092. Any suitable etch technique and chemistry may be used here. Mask layer 1092 may then be removed using any suitable technique.

Contact region 1093 may include other conductive materials as well. For example, aluminum (Al) or copper (Cu) may be used. Indium titanium oxide (ITO) or gold tin oxide (ATO) may also be used. Other metals or combinations of materials including metals may also be used. Furthermore, contact region 1093 may be formed using any suitable technique. For example, contact region 1093 may be pattern plated over the underside of the wafer.

Figure 106:
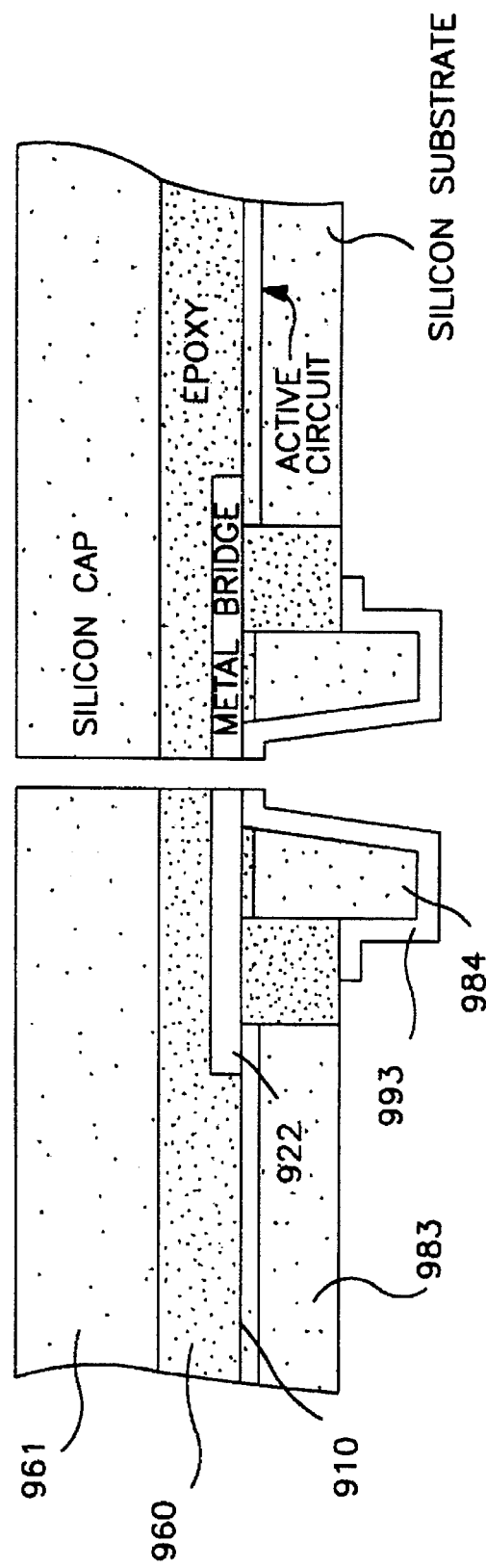
FIG. 106 illustrates a cross-sectional side view of the wafer of FIG. 105 after the wafer has been separated into integrated circuits.

For step 630 of FIG. 37, the wafer is separated, as illustrated in FIG. 106. FIG. 106 illustrates a cross-sectional side view of the wafer of FIG. 105 after the wafer has been separated into integrated circuits. The wafer may be separated, for example, by sawing the wafer. The sawcut may be approximately one (1) mil in width. The sawcut may have other widths as well. Other techniques may also be used to separate the wafer and include, for example, using a laser scribe.

The wafer is separated through, for example, trench 1076. Interconnects 1021–1022 which have been bonded with contact region 1093 form wrap-around flange interface contact regions as illustrated in FIG. 106. Bonded contact region 1093 is separated in separating the wafer. The reference numerals used in FIG. 106 correspond to those used for FIG. 88 above.

An optional insulating film or insulative layer may be formed over the underside of semiconductor region 983, for example. This optional insulative layer, as illustrated in FIG. 88 as insulative layer 999, for example, may comprise any suitable insulative material.

For another embodiment for fabricating integrated circuits, an alternative saw-and-etch process is used in etching the underside of the wafer for step 620 of FIG. 37. This alternative saw-and-etch process is similar to that discussed above with regard to FIGS. 64–71. Accordingly, the above discussion pertaining to this alternative saw-and-etch process applies here as well. Briefly, pit 1075 is first formed on the underside of the wafer. The underside of the wafer is subsequently etched in scribe line region 1065 to create trench 1076. Substrate 1000 may then be etched in underside regions 1064 and 1066. The method of FIG. 37 would then continue with step 625, as discussed above, for this embodiment.

For still yet other embodiments, the saw-and-etch process of step 620 may be replaced with other patterning processes. For example, a simple etch technique may be used. A mask layer may be formed over the underside of the wafer of FIG. 99 and patterned, for example using photolithography techniques, to define scribe line region 1065 and also to define underside region 1064 and 1066. Substrate 1000 may then be etched in accordance with this mask using any suitable etch technique and chemistry. The resulting wafer would then appear as illustrated in FIG. 102.

As yet another example, a mask layer may be patterned to define scribe line region 1065. Trench 1076 may then be etched from the underside of the wafer using this mask. Another mask layer may then be patterned to define underside regions 1064 and 1066. The underside of the wafer may then be etched using this mask. The resulting wafer would then appear as illustrated in FIG. 102.

The underside of the wafer may patterned in regions 1064 and 1065 differently. For example, the underside of the wafer directly beneath trenches 1051–1052 may be etched more than those portions which lie directly beneath active circuit regions 1001–1002. As a result semiconductor regions 1083 and 1086 would extend below the bottom of the overlying layer used to fill trenches 1051–1052. FIG. 88 illustrates this result.

Alternatively, the underside of the wafer directly beneath trenches 1051–1052 may be the only portions etched in regions 1064–1065. The underside of the wafer directly beneath active circuit regions 1001–1002 would not be etched. This embodiment is similar to those described above in patterning the underside of the wafer in fabricating diode modules and transistor modules.

Steps 320, 325, and 330 of FIG. 5 as discussed above with regard to fabricating diode modules may be used in fabricating other devices with contact regions. Steps 320, 325, and 330 may be used to form contact regions, for example, for transistor modules and integrated circuit contact leads. The discussion above pertaining to steps 320, 325, and 330 of FIG. 5 is therefore also applicable to the fabrication of transistor modules and integrated circuit contact leads.

Likewise, steps 620 and 625 of FIG. 37 may be used in fabricating other devices with contact regions. Steps 620 and 625 of FIG. 37 may be used to form contact regions, for example, for diode modules. The discussion above pertaining to steps 620 and 625 therefore is also applicable to the fabrication of diode modules.

The following dimensions are generally applicable for the fabrication of devices. The semiconductor regions for each device may be approximately 4–6 mils in thickness. The interconnects may contain approximately 8–10 µm of gold, for example. The overlying layer may contain approximately 6–7 mils in thickness of epoxy. The contact layers may contain approximately 0.5–0.7 mils in thickness of nickel. The sawcut formed in the saw-and-etch process may be approximately 2 mils in depth and approximately 2.5 mils in width. The dimensions of the above features may vary and may depend on various design considerations.

The devices fabricated in accordance with the present invention may be approximately 20×40 mils. The dimensions may also be approximately 20×30 mils. The dimensions of each device may vary and may depend on various design considerations.

The present invention may also be used in fabricating semiconductor devices such that contact regions have flange-interfaces on more than one side of the device being fabricated. For example, a contact region having a flange interface on three sides of a device as well as on the underside may be formed in accordance with the present invention. Such contact regions include those similar to the contact regions illustrated on the transistor modules of FIGS. 76, 79, 80, and 82, for example.

The present invention may further be used not only in fabricating the devices specifically described above but also in fabricating various other devices. The present invention, for example, may be used in fabricating ring-quads, bridge-quads, and various other four-foot devices. The present invention may be used in fabricating semiconductor devices having any number of contact region feet. The present invention may also be used in fabricating capacitors, for example.

While the detailed description in accordance with the present invention has been set forth above with regard to the best mode and preferred embodiment or embodiments contemplated by the inventors, it is to be appreciated that the present invention is not limited to the above embodiment or embodiments and that various modifications may be made to the above embodiment or embodiments without departing from the broader spirit or scope of the present invention as defined in the following claims. The specific embodiment or embodiments are, accordingly, to be regarded in an illustrative rather than a restrictive sense.

What is claimed is:

1. A method for use in semiconductor fabrication with a wafer having a first side and a second side, comprising the steps of:
    (a) forming a first layer having a first material over the first side of the wafer;
    (b) forming an opening in the wafer from the second side, the opening exposing a portion of the first layer;
    (c) forming a second layer having a second material over the second side of the wafer such that a portion of the second layer contacts the portion of the first layer exposed in the opening, wherein the first material includes a first conductive material and the second material includes a second conductive material; and
    (d) separating the wafer into two separate wafer parts through the opening such that a flange interface of the first and second layers is formed for each of the two wafer parts;
    (e) separating the wafer at a trench region of the wafer to form a device semiconductor region and a semiconductor post region; and
    the forming step (a) comprising the step of forming the first layer such that the first layer is electrically coupled to a region over the device semiconductor region and such that the first layer bridges from the device semiconductor region over the trench region to the semiconductor post region.

2. The method of claim 1, further comprising the step of:
    (f) forming an overlying layer over the first layer on the first side of the wafer.

3. The method of claim 1, wherein the separating step (e) comprises the steps of:
    (e)(i) forming a first trench in the trench region from the first side of the wafer, and
    (e)(ii) forming a second trench in the trench region from the second side of the wafer such that the first trench and the second trench separate the wafer.

4. The method of claim 1, wherein the device semiconductor region includes a diode.

5. The method of claim 1, wherein the device semiconductor region includes a circuit and the region over the device semiconductor region is electrically coupled to the circuit.

6. The method of claim 1, wherein the semiconductor post region is a first semiconductor post region and the trench region is a first trench region;
    the device semiconductor region includes a transistor;
    the region over the device semiconductor region includes a base region;
    the method further comprises the steps of:
        (f) separating the wafer at a second trench region of the wafer to form a second semiconductor post region;
        (g) forming a third layer having a third material over the first side of the wafer such that the third layer is electrically coupled to an emitter region over the device semiconductor region and such that the third layer bridges from the device semiconductor region over the first trench region to the second semiconductor post region;
    the opening formed in the forming step (b) exposes a portion of the third layer; and
    the forming step (c) includes the step of forming the second layer such that a portion of the second layer contacts the portion of the third layer exposed in the opening.

7. The method of claim 1, wherein the first layer includes a first plurality of materials including the first conductive material and the second layer includes a second plurality of materials including the second conductive material; and
    the forming step (c) includes the step of directly bonding the first conductive material in the portion of the first layer exposed in the opening and the second conductive material in the portion of the second layer.

8. The method of claim 7, wherein the first conductive material includes titanium tungsten and the second conductive material includes titanium tungsten.

9. The method of claim 8, wherein the first plurality of materials includes gold and the second plurality of materials includes nickel.

10. A method for use in semiconductor fabrication with a wafer having a first side and a second side, comprising the steps of:
    (a) forming a first layer having a first material over the first side of the wafer;
    (b) forming an opening in the wafer from the second side, the opening exposing a portion of the first layer, wherein the forming step (b) further comprises the steps of
        (i) sawing the second side of the wafer in a region where the opening is to be formed; and
        (ii) etching the wafer such that the opening is formed; and (c) forming a second layer having a second material over the second side of the wafer such that a portion of the second layer contacts the portion of the first layer exposed in the opening, wherein the first material includes a first conductive material and the second material includes a second conductive material; and (d) separating the wafer into two separate wafer parts through the opening such that a flange interface of the first and second layers is formed for each of the two wafer parts;

(e) separating the wafer at a trench region of the wafer to form a device semiconductor region and a semiconductor post region; and the forming step (a) comprising the step of forming the first layer such that the first layer is electrically coupled to a region over the device semiconductor region and such that the first layer bridges from the device semiconductor region over the trench region to the semiconductor post region.

11. The method of claim 10, further comprising the step of:

(f) forming an overlying layer over the first layer on the first side of the wafer.

12. The method of claim 10, wherein the separating step (e) comprises the steps of:

(e)(i) forming a first trench in the trench region from the first side of the wafer, and (e)(ii) forming a second trench in the trench region from the second side of the wafer such that the first trench and the second trench separate the wafer.

13. The method of claim 12, wherein the step (e)(ii) comprises the step of etching the second trench in the trench region from the second side of the wafer while simultaneously performing the etching step (b)(ii).

14. The method of claim 10, wherein the first layer includes a first plurality of materials including the first conductive material and the second layer includes a second plurality of materials including the second conductive material; and the forming step (c) includes the step of directly bonding the first conductive material in the portion of the first layer exposed in the opening and the second conductive material in the portion of the second layer.

15. The method of claim 14, wherein the first conductive material includes titanium tungsten and the second conductive material includes titanium tungsten.

16. The method of claim 15, wherein the first plurality of materials includes gold and the second plurality of materials includes nickel.

* * * * *